United States Patent
Matsuzaki et al.

(10) Patent No.: US 11,164,871 B2
(45) Date of Patent: Nov. 2, 2021

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Takanori Matsuzaki, Kanagawa (JP); Yoshinobu Asami, Kanagawa (JP); Daisuke Matsubayashi, Kanagawa (JP); Tatsuya Onuki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/643,073

(22) PCT Filed: Aug. 29, 2018

(86) PCT No.: PCT/IB2018/056565
§ 371 (c)(1),
(2) Date: Feb. 28, 2020

(87) PCT Pub. No.: WO2019/048987
PCT Pub. Date: Mar. 14, 2019

(65) Prior Publication Data
US 2020/0203345 A1    Jun. 25, 2020

(30) Foreign Application Priority Data
Sep. 6, 2017  (JP) .............................. JP2017-171238

(51) Int. Cl.
*H01L 27/105*  (2006.01)
*H01L 27/12*   (2006.01)
*H01L 29/786*  (2006.01)

(52) U.S. Cl.
CPC ...... *H01L 27/1052* (2013.01); *H01L 27/1207* (2013.01); *H01L 27/1225* (2013.01);
(Continued)

(58) Field of Classification Search
CPC ............. H01L 27/1052; H01L 27/1207; H01L 27/1225; H01L 27/1244; H01L 27/1255;
(Continued)

(56) References Cited

U.S. PATENT DOCUMENTS 8,422,272 B2   4/2013   Inoue et al.
8,902,640 B2   12/2014  Inoue et al.
(Continued)

FOREIGN PATENT DOCUMENTS

JP    2001-053164 A    2/2001
JP    2012-256813 A    12/2012
(Continued)

OTHER PUBLICATIONS

International Search Report (Application No. PCT/IB2018/056565) dated Nov. 27, 2018.
(Continued)

*Primary Examiner* — Tong-Ho Kim
(74) *Attorney, Agent, or Firm* — Fish & Richardson P.C.

(57) ABSTRACT

A first transistor, a second transistor, a capacitor, and first to third conductors are included. The first transistor includes a first gate, a source, and a drain. The second transistor includes a second gate, a third gate over the second gate, first and second low-resistance regions, and an oxide sandwiched between the second gate and the third gate. The capacitor includes a first electrode, a second electrode, and an insulator sandwiched therebetween. The first low-resistance region overlaps with the first gate. The first conductor is electrically connected to the first gate and is connected to a bottom surface of the first low-resistance region. The capaci-
(Continued)

tor overlaps with the first low-resistance region. The second conductor is electrically connected to the drain. The third conductor overlaps with the second conductor and is connected to the second conductor and a side surface of the second low-resistance region.

16 Claims, 19 Drawing Sheets

(52) U.S. Cl.
CPC ...... *H01L 27/1244* (2013.01); *H01L 27/1255* (2013.01); *H01L 29/7869* (2013.01); *H01L 29/78648* (2013.01); *H01L 29/78696* (2013.01)

(58) Field of Classification Search
CPC ........... H01L 29/78648; H01L 29/7869; H01L 29/78696
USPC .......................................................... 257/43
See application file for complete search history.

(56) References Cited

U.S. PATENT DOCUMENTS

| | | | |
|---|---|---|---|
| 9,299,813 B2 | 3/2016 | Inoue et al. | |
| 9,525,051 B2 | 12/2016 | Inoue et al. | |
| 9,825,037 B2 | 11/2017 | Inoue et al. | |
| 10,411,013 B2 | 9/2019 | Godo et al. | |
| 10,424,671 B2 | 9/2019 | Yamazaki et al. | |
| 10,559,341 B2 | 2/2020 | Ishizu et al. | |
| 2016/0172009 A1* | 6/2016 | Matsuzaki | G11C 11/24 365/72 |
| 2016/0284856 A1* | 9/2016 | Shimomura | H01L 27/0688 |
| 2017/0033111 A1 | 2/2017 | Yamazaki et al. | |
| 2017/0213833 A1* | 7/2017 | Godo | H01L 27/1108 |
| 2017/0221547 A1 | 8/2017 | Ishizu et al. | |

FOREIGN PATENT DOCUMENTS

| | | |
|---|---|---|
| JP | 2017-034249 A | 2/2017 |
| JP | 2017-135378 A | 8/2017 |
| JP | 2017-139047 A | 8/2017 |
| KR | 2017-0090357 A | 8/2017 |

OTHER PUBLICATIONS

Written Opinion (Application No. PCT/IB2018/056565) dated Nov. 27, 2018.

* cited by examiner

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2018/056565, filed on Aug. 29, 2018, which is incorporated by reference and which claims the benefit of a foreign priority application filed in Japan on Sep. 6, 2017, as Application No. 2017-171238.

TECHNICAL FIELD

The present invention relates to, for example, a memory device, a processor, and a semiconductor device. Alternatively, the present invention relates to a method for manufacturing a memory device, a processor, and a semiconductor device. Alternatively, one embodiment of the present invention relates to a semiconductor wafer, a module, and an electronic device.

Note that one embodiment of the present invention is not limited to the above technical field. The technical field of one embodiment of the invention disclosed in this specification and the like relates to an object, a method, or a manufacturing method. Another one embodiment of the present invention relates to a process, a machine, manufacture, or a composition of matter.

Note that in this specification and the like, a semiconductor device generally means a device that can function by utilizing semiconductor characteristics. A display device, a light-emitting device, a lighting device, an electro-optical device, a memory device, a semiconductor circuit, and an electronic device include a semiconductor device in some cases.

BACKGROUND ART

Semiconductor devices have been developed in recent years, and in particular, LSI, processors such as CPUs and GPUs, and memories have been developed. A processor is an aggregation of semiconductor elements, which includes a semiconductor integrated circuit (at least a transistor and a memory) separated from a semiconductor wafer and an electrode serving as a connection terminal.

A semiconductor circuit (IC chip) of LSI, processors such as CPUs and GPUs, memories, and the like is mounted on a circuit board, for example, a printed wiring board, to be used as one of components of a variety of electronic devices such as computers.

A technique by which a transistor is formed using a semiconductor thin film formed over a substrate having an insulating surface has been attracting attention. The transistor is widely applied to electronic devices such as an integrated circuit (IC) and an image display device (also simply referred to as a display device). A silicon-based semiconductor material is widely known as a semiconductor thin film applicable to a transistor; in addition, an oxide semiconductor has been attracting attention as another material.

It is known that a transistor using an oxide semiconductor has an extremely low leakage current in a non-conduction state. For example, a memory or the like capable of long-term charge retention by utilizing a feature of low leakage current of a transistor using an oxide semiconductor has been disclosed (see Patent Document 1). Meanwhile, in recent years, with the increase in the amount of data handled, a semiconductor device having a larger memory capacity has been required. Moreover, a semiconductor device having a large memory capacity per unit area has been required.

In recent years, demand for an integrated circuit in which transistors and the like are integrated with high density has risen with reductions in size and weight of an electronic device. In addition, improvement in the productivity of a semiconductor device including an integrated circuit has been required. The above semiconductor device is preferable because it can be used for artificial intelligence (AI) and an AI system.

REFERENCE

Patent Document

[Patent Document 1] Japanese Published Patent Application No. 2012-256813

SUMMARY OF THE INVENTION

Problems to be Solved by the Invention

An object of one embodiment of the present invention is to provide a semiconductor device that can be miniaturized or highly integrated. An object of one embodiment of the present invention is to provide a semiconductor device having a small memory cell size. An object of one embodiment of the present invention is to provide a semiconductor device having favorable electrical characteristics. An object of one embodiment of the present invention is to provide a semiconductor device having favorable frequency characteristics. An object of one embodiment of the present invention is to provide a highly reliable semiconductor device. An object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device with low power consumption. An object of one embodiment of the present invention is to provide a novel semiconductor device.

Note that the descriptions of these objects do not preclude the existence of other objects. One embodiment of the present invention does not need to achieve all of these objects. Other objects will be apparent from and can be derived from the description of the specification, the drawings, the claims, and the like.

Means for Solving the Problems

One embodiment of the present invention is a semiconductor device including a first transistor, a second transistor, a capacitor, a first conductor, a second conductor, and a third conductor. The first transistor includes a first gate, a source, and a drain. The second transistor includes a second gate, a third gate over the second gate, a first low-resistance region, a second low-resistance region, and an oxide sandwiched between the second gate and the third gate. The capacitor includes a first electrode, a second electrode over the first electrode, and an insulator sandwiched between the first electrode and the second electrode. The first low-resistance region overlaps with the first gate. The first conductor is electrically connected to the first gate. The first conductor is connected to a bottom surface of the first low-resistance region. The capacitor overlaps with the first low-resistance region. The first electrode is electrically connected to the first low-resistance region. The second conductor is electrically connected to the drain. The third conductor overlaps with the second conductor. The third conductor is connected to the second conductor and a side surface of the second low-resistance region.

One embodiment of the present invention is a semiconductor device including a first transistor, a second transistor over the first transistor, a third transistor, a fourth transistor over the third transistor, a first capacitor, a second capacitor, a first conductor, a second conductor, a third conductor, and a fourth conductor. The first transistor includes a first gate, a first source, and a first drain. The second transistor includes a second gate, a third gate over the second gate, a first low-resistance region, a second low-resistance region, and an oxide sandwiched between the second gate and the third gate. The third transistor includes a fourth gate, a second source, and a second drain. The fourth transistor includes a fifth gate, a sixth gate over the fifth gate, the second low-resistance region, a third low-resistance region, and the oxide sandwiched between the fifth gate and the sixth gate. The first capacitor includes a first electrode, a second electrode over the first electrode, and a first insulator sandwiched between the first electrode and the second electrode. The second capacitor includes a third electrode, a fourth electrode over the third electrode, and a second insulator sandwiched between the third electrode and the fourth electrode. The first low-resistance region overlaps with the first gate. The first conductor is electrically connected to the first gate. The first conductor is connected to a bottom surface of the first low-resistance region. The first capacitor overlaps with the first low-resistance region. The first electrode is electrically connected to the first low-resistance region. The third low-resistance region overlaps with the fourth gate. The fourth conductor is electrically connected to the fourth gate. The fourth conductor is connected to a bottom surface of the third low-resistance region. The second capacitor overlaps with the third low-resistance region. The third electrode is electrically connected to the third low-resistance region. The second conductor is electrically connected to the first drain and the second drain. The third conductor overlaps with the second conductor. The third conductor is connected to the second conductor and a side surface of the second low-resistance region.

In the above, the first drain and the second drain are preferably provided in a fourth low-resistance region.

In the above, it is preferred that in the channel length direction of the first transistor, a distance between the second gate and the first gate be less than or equal to half the width of the first gate.

In the above, it is preferred that in the channel length direction of the first transistor, a distance between the second gate and the second conductor be less than or equal to half the width of the first gate.

In the above, it is preferred that the semiconductor device further include a first insulator and a second insulator, the first insulator cover the first transistor, the second insulator be in contact with a side surface of the second gate, and the second insulator have a different composition from the first insulator.

In the above, it is preferred that the semiconductor device further include a third insulator and a fourth insulator, the third insulator cover the second transistor, the fourth insulator be in contact with a side surface of the third gate, and the fourth insulator have a different composition from the third insulator.

Effect of the Invention

According to one embodiment of the present invention, a semiconductor device that can be miniaturized or highly integrated can be provided. According to one embodiment of the present invention, a semiconductor device having a small memory cell size can be provided. According to one embodiment of the present invention, a semiconductor device having favorable electrical characteristics can be provided. According to one embodiment of the present invention, a semiconductor device having favorable frequency characteristics can be provided. According to one embodiment of the present invention, a highly reliable semiconductor device can be provided. According to one embodiment of the present invention, a semiconductor device with high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device with low power consumption can be provided. Alternatively, a novel semiconductor device can be provided.

Note that the descriptions of these effects do not preclude the existence of other effects. One embodiment of the present invention does not necessarily achieve all these effects. Other effects will be apparent from and can be derived from the descriptions of the specification, the drawings, the claims, and the like.

BRIEF DESCRIPTION OF DRAWINGS

FIGS. 16A to 16F Diagrams illustrating structure examples of electronic devices and a system of one embodiment of the present invention.

MODE FOR CARRYING OUT THE INVENTION

Figure 1A:
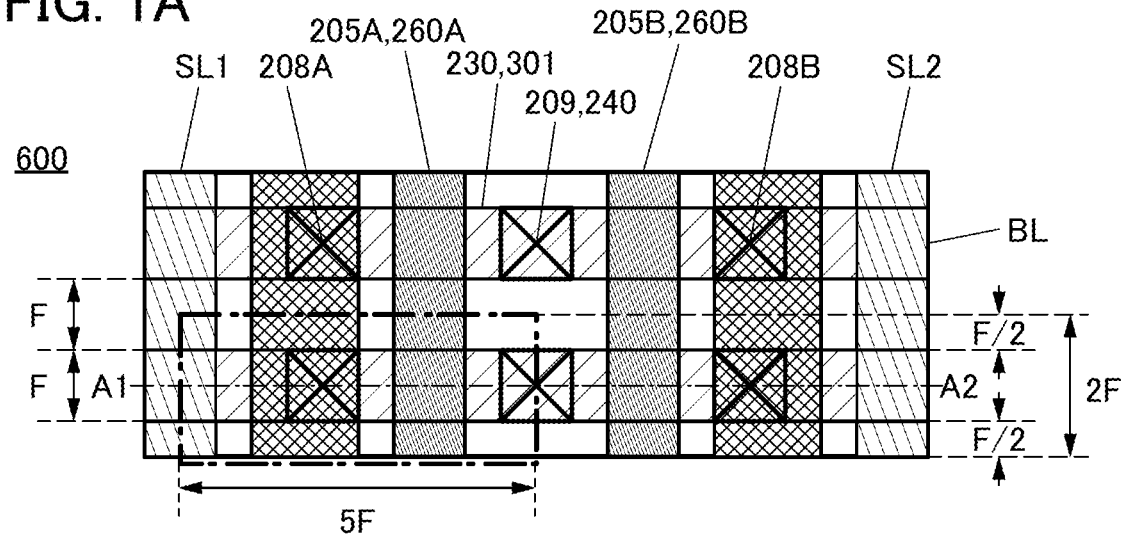
FIGS. 1A and 1B A top view and a cross-sectional view of a semiconductor device of one embodiment of the present invention.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and shapes or values are not limited to those shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used for the same portions or portions having similar functions in different drawings, and repeated description thereof is omitted in some cases. Furthermore, the same hatch pattern is used for the portions having similar functions, and the portions are not especially denoted by reference numerals in some cases.

Particularly in a top view (also referred to as a plan view), a perspective view, or the like, the description of some components might be omitted for easy understanding of the invention. Furthermore, the description of some hidden lines and the like might be omitted.

In this specification and the like, ordinal numbers such as first and second are used for convenience and do not denote the order of steps or the stacking order of layers. Therefore, for example, description can be made when "first" is replaced with "second", "third", or the like as appropriate. In addition, the ordinal numbers in this specification and the like are not necessarily the same as the ordinal numbers used to specify one embodiment of the present invention.

In this specification and the like, the terms for explaining arrangement, such as "over" and "under", are used for convenience to describe the positional relation between components with reference to drawings. Furthermore, the positional relation between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are directly connected, the case where X and Y are electrically connected, and the case where X and Y are functionally connected are disclosed in this specification and the like. Accordingly, without being limited to a predetermined connection relation, for example, a connection relation shown in drawings or texts, a connection relation other than one shown in drawings or texts is regarded as being described in the drawings or the texts.

Here, X and Y denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

For example, in the case where X and Y are electrically connected, one or more elements that allow electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being in a conduction state (on state) or a non-conduction state (off state) to control whether or not current flows. Alternatively, a switch has a function of selecting and changing a current path. Note that the case where X and Y are electrically connected includes the case where X and Y are directly connected.

An example of the case where X and Y are functionally connected is the case where one or more circuits that allow functional connection between X and Y (e.g., a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (e.g., a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are regarded as being functionally connected when a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be used interchangeably in this specification and the like.

Note that a channel length refers to, for example, the distance between a source (a source region or a source electrode) and a drain (a drain region or a drain electrode) in a region where a semiconductor (or a portion where current flows in a semiconductor when a transistor is on) and a gate electrode overlap with each other, or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is on) and a gate electrode overlap with each other, or a region where a channel is formed. Note that in one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter also referred to as an effective channel width) is different from a channel width shown in a top view of a transistor (hereinafter also referred to as an apparent channel width) in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that values of a channel length, a channel width, an effective channel width, an apparent channel width, a surrounded channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies may be formed by entry of impurities, for example. Furthermore, when the semiconductor is silicon, examples of an impurity that changes the characteristics of the semiconductor include oxygen, Group 1 elements except hydrogen, Group 2 elements, Group 13 elements, and Group 15 elements.

In this specification and the like, a silicon oxynitride film is a film in which oxygen content is higher than nitrogen content in its composition. For example, a silicon oxynitride film preferably contains oxygen, nitrogen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively. Moreover, a silicon nitride oxide film is a film in which nitrogen content is higher than oxygen content in its composition. For example, a silicon nitride oxide film preferably contains nitrogen, oxygen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively.

In this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer".

Unless otherwise specified, transistors described in this specification and the like are field-effect transistors. Furthermore, unless otherwise specified, transistors described in this specification and the like are n-channel transistors. Thus, unless otherwise specified, the threshold voltage (also referred to as Vth) is higher than 0 V.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. In addition, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting the passage of oxygen and impurities such as hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is $1\times10^{-20}$ A or lower at room temperature, $1\times10^{-18}$ A or lower at 85° C., or $1\times10^{-16}$ A or lower at 125° C.

Embodiment 1

An example of a semiconductor device functioning as a memory device of one embodiment of the present invention will be described below with reference to FIG. 1 to FIG. 3.

Figure 1B:
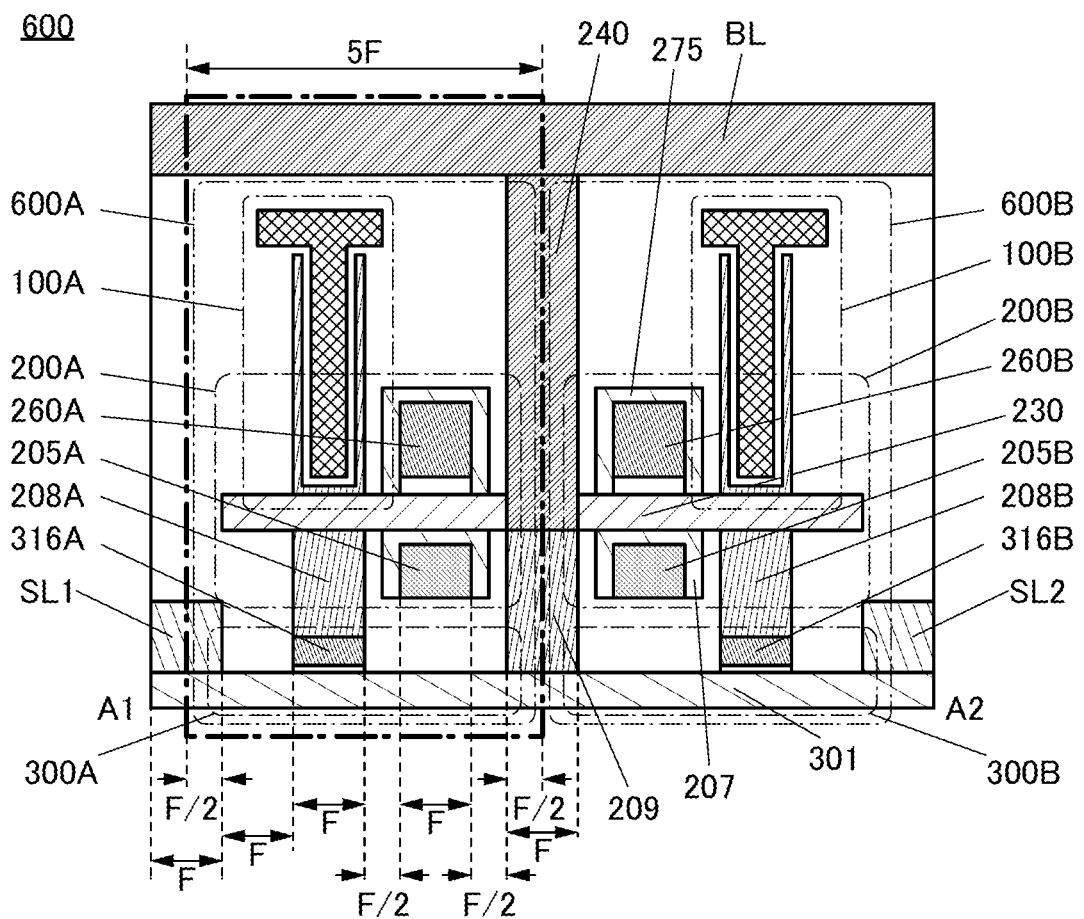

FIG. 1(A) is a top view of a cell 600 constituting the memory device. FIG. 1(B) is a cross-sectional view of the cell 600. Here, FIG. 1(B) is a cross-sectional view of a portion indicated by a dashed-dotted line A1-A2 in FIG. 1(A) and also is a cross-sectional view of a transistor 200 (a transistor 200A and a transistor 200B) in the channel length direction. FIG. 2 is a diagram illustrating an equivalent circuit of the cell 600 shown in FIG. 1. For clarity of the diagram, some components are not illustrated in the top view of FIG. 1(A).

The cell 600 constituting the memory device includes a transistor 300A, a transistor 300B, the transistor 200A over the transistor 300A, the transistor 200B over the transistor 300B, a capacitor 100A, and a capacitor 100B. The transistor 300A, the transistor 200A, and the capacitor 100A form one memory cell 600A, and the transistor 300B, the transistor 200B, and the capacitor 100B form one memory cell 600B. That is, the cell 600 includes two memory cells. The configuration and operation of the memory cells will be described later in detail.

The transistor 300A and the transistor 300B include a common semiconductor layer 301, and the transistor 200A and the transistor 200B include a common oxide 230.

The transistor 300A includes a conductor 316A functioning as a gate, and the conductor 316A is electrically connected to one of a source and a drain of the transistor 200A. The transistor 300B includes a conductor 316B functioning as a gate, and the conductor 316B is electrically connected to one of a source and a drain of the transistor 200B.

A one-stage or multi-stage conductor 208A is provided over the conductor 316A and is electrically connected to the conductor 316A. A top surface of the conductor 208A is connected to a bottom surface of the one of the source and the drain of the transistor 200A, whereby the conductor 316A and the one of the source and the drain of the transistor 200A are electrically connected to each other. Similarly, a one-stage or multi-stage conductor 208B is provided over the conductor 316B and is electrically connected to the conductor 316B. A top surface of the conductor 208B is connected to a bottom surface of the one of the source and the drain of the transistor 200B, whereby the conductor 316B and the one of the source and the drain of the transistor 200B are electrically connected to each other.

A source of the transistor 300A and a source of the transistor 300B are electrically connected to a wiring SL1 and a wiring SL2, respectively.

The transistor 300A and the transistor 300B share a drain, and the transistor 200A and the transistor 200B share the other of the source and the drain. The drains of the transistor 300A and the transistor 300B are electrically connected to the other of the source and the drain of each of the transistor 200A and the transistor 200B through a conductor and are electrically connected to a wiring BL. In this embodiment, a conductor 209 is electrically connected to the drains of the transistor 300A and the transistor 300B. In this example, a conductor 240 that is connected to a top surface of the conductor 209 and electrically connected to the wiring BL is provided in an opening provided so as to penetrate the oxide 230, and is electrically connected to a side surface of the oxide 230. However, the present invention is not limited thereto. The top surface of the conductor 209 and a bottom surface of the oxide 230 may be connected to each other so that the conductor 240 may be electrically connected to a top surface of the oxide 230.

The one of the source and the drain of the transistor 200A is electrically connected to the capacitor 100A. The one of the source and the drain of the transistor 200B is electrically connected to the capacitor 100B. There is no particular limitation on the shapes of the capacitor 100A and the capacitor 100B, and so-called flat plate capacitors may be provided in which the one of the source and the drain of the transistor 200A is used as a first electrode of the capacitor 100A, the one of the source and the drain of the transistor 200B is used as a first electrode of the capacitor 100B, and second electrodes are provided above the first electrodes with an insulator functioning as a dielectric placed therebetween. Alternatively, it is possible to provide so-called cylindrical capacitors 100A and 100B in each of which an opening is provided in an insulator that covers the transistor 200A and the transistor 200B, a first electrode is provided in a bottom portion and a side surface of the opening, an insulator functioning as a dielectric is provided on the inner side of the first electrode, and a second electrode is provided on the inner side of the insulator.

The transistor 200A includes a conductor 260A functioning as a first gate and a conductor 205A functioning as a second gate. The transistor 200B includes a conductor 260B functioning as a first gate and a conductor 205B functioning as a second gate. An insulator 275 functioning as an etching stopper is provided on at least side surfaces and top surfaces of the conductor 260A and the conductor 260B. The insulator 275 functions as an etching stopper at the time of forming the opening in which the conductor 240 is to be provided. The insulator 275 may be formed using an insulator that protects the side surfaces of the conductor 260A and the conductor 260B (sometimes referred to as a sidewall) and an insulator that protects the top surfaces of the conductor 260A and the conductor 260B. The insulator 275 is formed with a different material or has a different composition from an insulator in which the opening is formed, and functions as an etching stopper when the opening is formed. When the etching stopper is provided, even if a mask for forming the opening is misaligned and the opening and the conductor 260A or the conductor 260B overlap with each other, the conductor 260A and the conductor 260B are not exposed in the opening because they are covered with the etching stopper. Thus, a short circuit due to contact between the conductor 240 and the conductor 260A or the conductor 260B can be prevented.

An insulator 207 functioning as an etching stopper is provided on at least side surfaces and top surfaces of the conductor 205A and the conductor 205B. The insulator 207 functions as an etching stopper at the time of forming the opening in which the conductor 209 is to be provided. The insulator 207 may be formed using an insulator that protects the side surfaces of the conductor 205A and the conductor 205B (sometimes referred to as a sidewall) and an insulator that protects the top surfaces of the conductor 205A and the conductor 205B. Alternatively, the insulator 207 may be formed using an insulator that protects the side surfaces and bottom surfaces of the conductor 205A and the conductor 205B and an insulator that protects the top surfaces of the conductor 205A and the conductor 205B. The insulator 207 is formed with a different material or has a different composition from an insulator in which the opening is formed, and functions as an etching stopper when the opening is formed. When the etching stopper is provided, even if a mask for forming the opening is misaligned and the opening and the conductor 205A or the conductor 205B overlap with each other, the conductor 205A and the conductor 205B are not exposed in the opening because they are covered with the etching stopper. Thus, a short circuit due to contact between the conductor 209 and the conductor 205A or the conductor 205B can be prevented.

Next, the cell size of the memory cell is described. Here, the cell size of the memory cell 600A is described; the same applies to the cell size of the memory cell 600B. In this embodiment, the minimum feature size (F) of the memory cell 600A is the width of the conductor 316A of the transistor 300A in the channel length direction. At this time, the width or diameter of each of the conductor 209, the conductor 240, the conductor 208, and the wiring SL1 is set to F. The distance (space) between the conductor 316A and the wiring SL1 is also set to F in consideration of alignment accuracy. Meanwhile, since the etching stopper is provided for the conductor 205A, the space between the conductor 205A and the conductor 208 and the space between the conductor 205A and the conductor 209 are not necessarily set to F and can be smaller than F. Specifically, the space between the conductor 205A and the conductor 208 and the space between the conductor 205A and the conductor 209 can each be F/2, preferably less than F/2; hence, the cell size of the memory cell 600A can be reduced. Since the wiring BL is shared by adjacent memory cells, the width of each of the conductor 209 and the conductor 240 in one memory cell is F/2, preferably less than F/2. Since a wiring SL is shared by adjacent memory cells, the width of the wiring SL in one memory cell is F/2, preferably less than F/2. Thus, the width of the memory cell 600A described in this embodiment in the channel length direction of the transistor 300A is 5F.

As illustrated in FIG. 1(A), when the channel width of the transistor 300A and the channel width of the transistor 200A are F and the distance between the adjacent transistors 300A in the channel width direction and the distance between the adjacent transistors 200A in the channel width direction are F, the width of the memory cell 600A in the channel width direction of the transistor 300A is 2F. That is, the cell size of the memory cell 600A is 5F×2F=10F$^2$. The cell size can be similarly designed for the memory cell 600B, and the value is 10F$^2$. Note that although the minimum feature size in this embodiment is the width of a conductor 316, the present invention is not limited thereto. The width of the conductor 205A, the width of the conductor 260A, the width of the conductor 209, or the width of the conductor 240 may be used as the minimum feature size.

Figure 2:
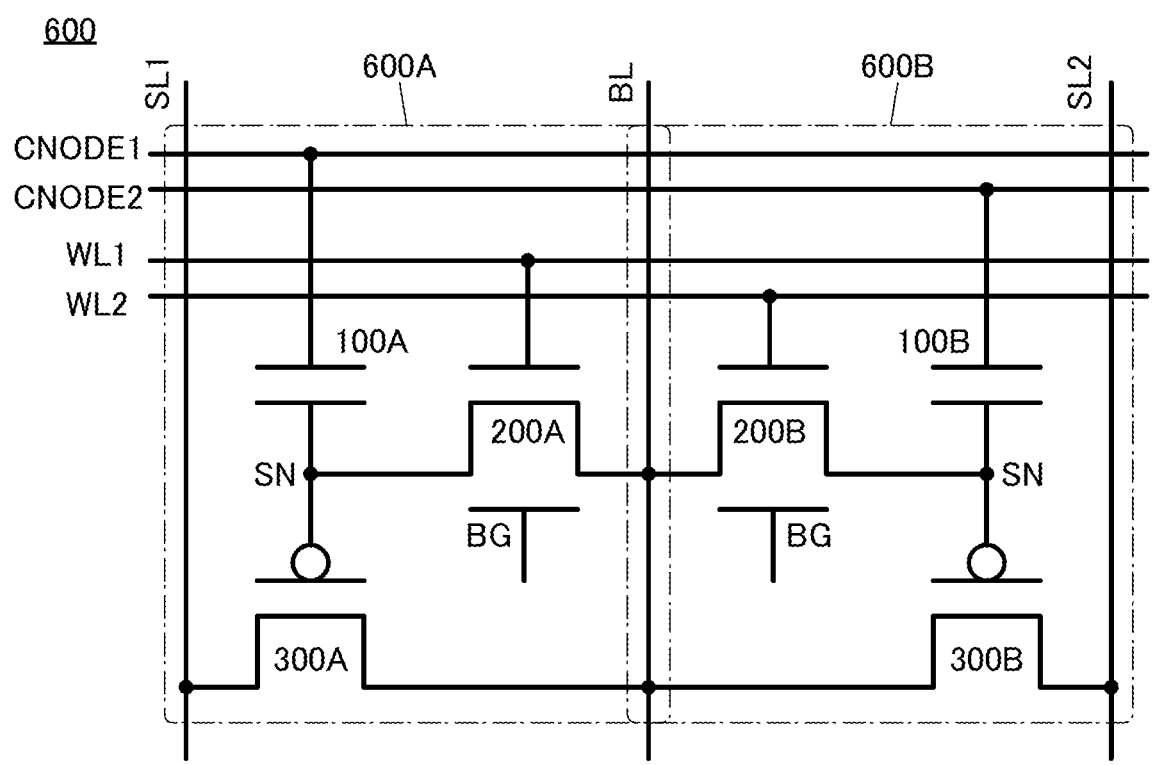
FIG. 2 A circuit diagram of a semiconductor device of one embodiment of the present invention.

FIG. 2 is a circuit diagram illustrating the cell 600 of this embodiment. The cell 600 includes the memory cell 600A and the memory cell 600B. The cell 600 also includes wirings WL (WL1 and WL2), the wiring BL, wirings CNODE (CNODE1 and CNODE2), and the wirings SL (SL1 and SL2) that constitute each memory cell. The memory cell 600A includes the transistor 300A, the transistor 200A, and the capacitor 100A, and the memory cell 600B includes the transistor 300B, the transistor 200B, and the capacitor 100B. Here, the memory cell 600A and the memory cell 600B share the wiring BL. Note that although the transistor 300A and the transistor 300B are shown as p-channel transistors in FIG. 2, the present invention is not limited thereto. The transistor 300A and the transistor 300B may be n-channel transistors.

The gate of the transistor 300A is electrically connected to the one of the source and the drain of the transistor 200A and one electrode of the capacitor 100A. The gate of the transistor 300B is electrically connected to the one of the source and the drain of the transistor 200B and one electrode of the capacitor 100B.

The source of the transistor 300A is electrically connected to the wiring SL1, and the source of the transistor 300B is electrically connected to the wiring SL2. The drain of the transistor 300A, the drain of the transistor 300B, the other of the source and the drain of the transistor 200A, and the other of the source and the drain of the transistor 200B are electrically connected to the wiring BL.

The gate of the transistor 200A is electrically connected to the wiring WL1, and the gate of the transistor 200B is electrically connected to the wiring WL2. The transistor 200A and the transistor 200B each include a back gate BG. The gate of each of the transistor 200A and the transistor 200B may be referred to as a first gate or a top gate. The back gate BG of each of the transistor 200A and the transistor 200B may be referred to as a second gate. The back gate BG may be supplied with a potential for controlling the threshold voltage of the transistor 200A or the transistor 200B, or may be supplied with the same potential as the first gate of each transistor. In the latter case, it is preferred that the first gate and the second gate be electrically connected to each other in each transistor.

The other electrode of the capacitor 100A is electrically connected to CNODE1, and the other electrode of the capacitor 100B is electrically connected to CNODE2.

The memory device illustrated in FIG. 1 and FIG. 2 has a feature that the potential of a gate of a transistor 300 can be retained, and thus enables writing, retaining, and reading of data as follows.

Writing and retaining of data are described. First, the potential of the wiring WL1 is set to a potential at which the transistor 200A is turned on, so that the transistor 200A is turned on. Accordingly, the potential of the wiring BL is supplied to a node SN that is electrically connected to the gate of the transistor 300A and the one electrode of the capacitor 100A. That is, a predetermined charge is supplied to the gate of the transistor 300A (writing). Here, one of charges providing two different potential levels (hereinafter referred to as a Low-level charge and a High-level charge) is supplied. After that, the potential of the wiring WL1 is set to a potential at which the transistor 200A is turned off, so that the transistor 200A is turned off. Thus, the charge is retained in the node SN (retaining).

In the case where the off-state current of the transistor 200 is low, the charge in the node SN is retained for a long time.

Next, reading of data is described. An appropriate potential (reading potential) is supplied to the wiring CNODE1 while a predetermined potential (constant potential) is supplied to the wiring SL1, whereby the wiring BL has a potential corresponding to the amount of charge retained in the node SN. This is because when the transistor 300A is of p-channel type, an apparent threshold voltage $V_{th\_H}$ at the time when the High-level charge is supplied to the gate of the transistor 300A is higher than an apparent threshold voltage $V_{th\_L}$ at the time when the Low-level charge is supplied to the gate of the transistor 300A. Here, an apparent threshold voltage refers to a potential of the wiring CNODE1 that is needed to turn on the transistor 300A. Thus, the potential of the wiring CNODE1 is set to a potential $V_0$ that is between $V_{th\_H}$ and $V_{th\_L}$, whereby the charge supplied to the node SN can be determined. For example, in the case where the High-level charge is supplied to the node SN in writing and the potential of the wiring CNODE1 is $V_0$ ($<V_{th\_H}$), the transistor 300A is turned on. Meanwhile, in the case where the Low-level charge is supplied to the node SN, the transistor 300A remains off even when the potential of the wiring CNODE1 becomes $V_0$ ($>V_{th\_L}$). Thus, the data retained in the node SN can be read by determining the potential of the wiring BL.

Note that in the case where memory cells are arranged in an array, data of a desired memory cell needs to be read at the time of reading. For example, in the case where a memory cell array has a NOR-type structure, only data of a desired memory cell can be read by turning off the transistors 300 of memory cells from which data is not read. In that case, a potential at which the transistor 300 is turned off regardless of the charge supplied to the node SN, that is, a potential higher than $V_{th\_H}$ is supplied to the wiring CNODE connected to the memory cells from which data is not read. As another example, in the case where a memory cell array has a NAND-type structure, only data of a desired memory cell can be read by turning on the transistors 300 of memory cells from which data is not read. In that case, a potential at which the transistor 300 is turned on regardless of the charge supplied to the node SN, that is, a potential lower than $V_{th\_L}$ is supplied to the wiring CNODE connected to the memory cells from which data is not read.

Figure 3A:
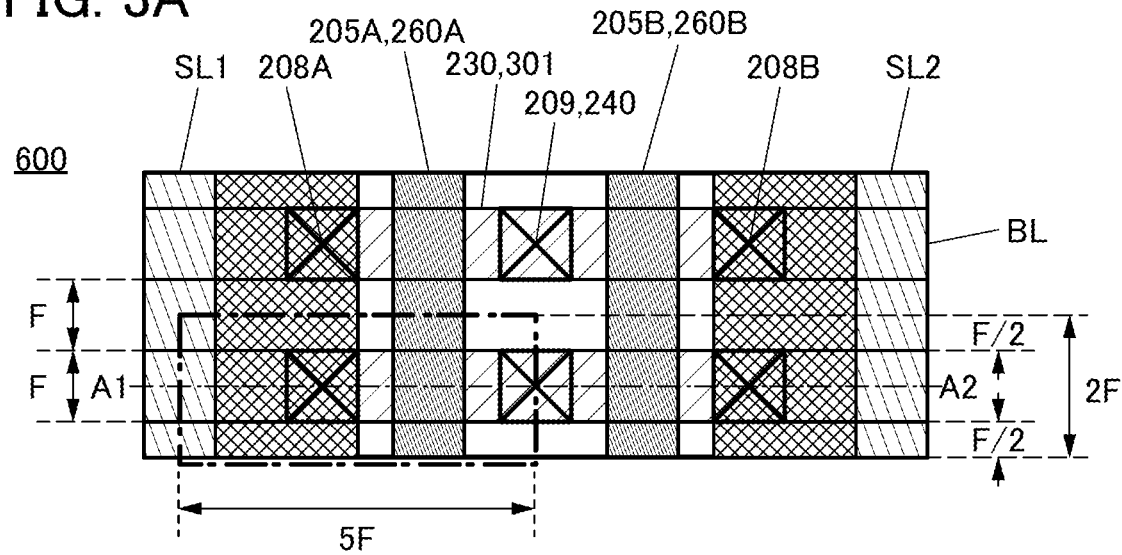
FIGS. 3A and 3B A top view and a cross-sectional view of a semiconductor device of one embodiment of the present invention.
Figure 3B:
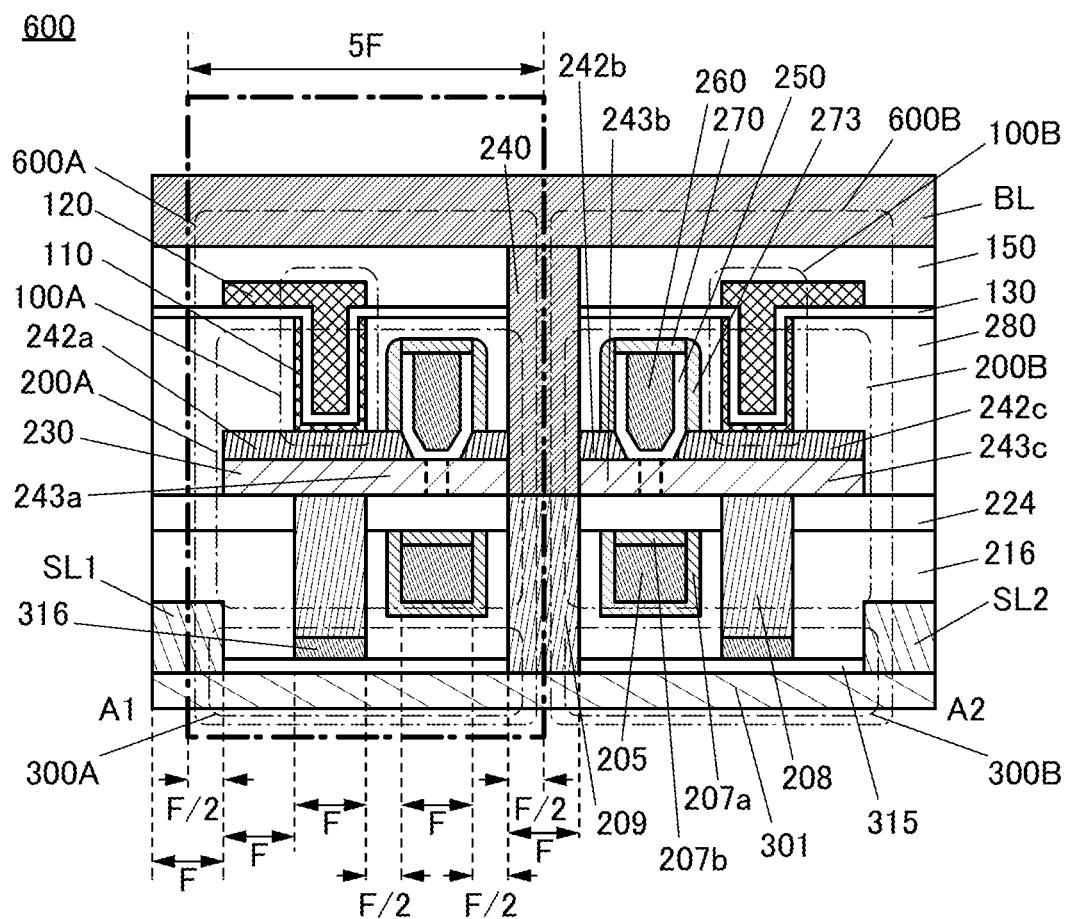

FIG. 3 illustrates a more specific structure of the cell 600. Note that in the cell 600, the structures of the memory cell 600A and the memory cell 600B are symmetrical with respect to the conductor 209 and the conductor 240. That is, the memory cell 600A and the memory cell 600B include identical components. Therefore, the reference numerals attached to the components and the description of the components apply to the memory cell 600B as well as the memory cell 600A.

The transistor 300 (the transistor 300A and the transistor 300B) includes the semiconductor layer 301, an insulator 315 over the semiconductor layer 301, and the conductor 316 over the insulator 315. Note that part of a semiconductor substrate may be used as the semiconductor layer 301, or a semiconductor layer provided over an insulator may be used as the semiconductor layer 301. The conductor 316 functions as a gate of the transistor 300, and the insulator 315 functions as a gate insulator of the transistor 300. The source of the transistor 300A is electrically connected to SL1, and the source of the transistor 300B is electrically connected to SL2. The transistor 300 is covered with an insulator 216. Note that the insulator 216 is not limited to a single layer and may have a stacked-layer structure of two or more layers. A conductor 205 functioning as a second gate of the transistor 200 (the transistor 200A and the transistor 200B) is provided to be embedded in the insulator 216. An insulator 207a is provided on a side surface and a bottom surface of the conductor 205; an insulator 207b is provided on a top surface of the conductor 205; and the conductor 205 is surrounded by the insulator 207a and the insulator 207b. Note that the insulator 207a and the insulator 207b are formed with a material or a composition different from that of the insulator 216, and function as an etching stopper at the time of processing the insulator 216.

An insulator 224 is provided over the insulator 216, the insulator 207a, and the insulator 207b. The insulator 224 functions as a second gate insulator. The insulator 224 is not limited to a single layer and may have a stacked-layer structure of two or more layers. For example, a three-layer structure where silicon oxynitride, hafnium oxide, and silicon oxynitride are stacked may be employed.

The conductor 208 is provided to be embedded in the insulator 224 and the insulator 216 and is electrically connected to the conductor 316. The conductor 209 is provided to be embedded in the insulator 224, the insulator 216, and the insulator 315. The conductor 209 is shared by the transistor 300A and the transistor 300B, and the conductor 209 is electrically connected to the drain of the transistor 300A and the drain of the transistor 300B. When openings are formed in the insulator 224, the insulator 216, and the insulator 315 in forming the conductor 208 and the conductor 209, even if a mask for forming the openings is misaligned and the openings and the conductors 205 overlap with each other, the conductors 205 are not exposed in the openings because they are covered with the etching stoppers. Thus, a short circuit due to contact between the conductor 208 or the conductor 209 and the conductor 205 can be prevented.

The oxide 230 is provided over the insulator 224, the conductor 208, and the conductor 209. The conductor 208 and the conductor 209 are connected to a bottom portion of the oxide 230, and the conductor 316 is electrically connected to one of the source and the drain of the transistor 200 through the conductor 208. The drain of the transistor 300A and the drain of the transistor 300B are electrically connected to the other of the source and the drain of the transistor 200 through the conductor 209.

A conductor 242 (a conductor 242a, a conductor 242b, and a conductor 242c) is provided over the oxide 230. The conductor 242a functions one of a source electrode and a drain electrode of the transistor 200A; the conductor 242c functions as one of a source electrode and a drain electrode of the transistor 200B; and the conductor 242b functions as the other of the source electrode and the drain electrode of the transistor 200A and the other of the source electrode and the drain electrode of the transistor 200B.

In some cases, a region 243 (a region 243a, a region 243b, and a region 243c) functioning as a low-resistance region is formed in the oxide 230 by contact between the conductor 242a, the conductor 242b, and the conductor 242c and the oxide 230. This is probably because of one or both of the following reasons: formation of oxygen vacancies in the oxide 230 due to extraction of oxygen contained in the oxide 230 by the conductor 242, and diffusion of impurities such as hydrogen, water, halogen, and a metal element into the oxide, at the time of or after the formation of the conductor 242. In this case, it can be said that the region 243a functions as one of a source region and a drain region of the transistor 200A, the region 243c functions as one of a source region and a drain region of the transistor 200B, and the region 243b functions as the other of the source region and the drain region of the transistor 200A and the other of the source region and the drain region of the transistor 200B. The conductor 208 and the conductor 209 are electrically connected to the low-resistance region formed in the oxide 230.

Over the oxide 230, a conductor 260 is provided between the conductor 242a and the conductor 242b and between the conductor 242b and the conductor 242c with an insulator 250 therebetween. The insulator 250 functions as a first gate insulator of the transistor 200, and the conductor 260 functions as a first gate electrode of the transistor 200.

In FIG. 3, the insulator 250 is provided to cover not only a bottom surface of the conductor 260 but also its side surface; however, the present invention is not limited thereto. The insulator 250 is provided at least between the oxide 230 and the conductor 260. When there is a possibility of a shot circuit between the conductor 260 and the conductor 242, the insulator 250 is preferably provided also between the conductor 242 and the conductor 260. In the case where parasitic capacitance is generated between the conductor 242 and the conductor 260 and adversely affects the operating frequency of the transistor 200, the insulator 250 between the conductor 242 and the conductor 260 is preferably formed thicker than the insulator 250 between the oxide 230 and the conductor 260, or is preferably formed using a material with a high permittivity. To increase the thickness of the insulator 250, the insulator 250 between the conductor 242 and the conductor 260 may have a stacked-layer structure.

An insulator 273 is provided along a side wall of the conductor 260 with the insulator 250 therebetween. An insulator 270 is provided over the conductor 260 and the insulator 250. The insulator 273 is referred to as a sidewall in some cases. The insulator 273 and the insulator 270 are formed with a different material or has a different composition from an insulator 280 that covers the transistor 200, and function as an etching stopper when the insulator 280 is processed.

A conductor 110 is provided to be embedded in the insulator 280. The conductor 110 functions as one electrode of a capacitor 100 (the capacitor 100A and the capacitor 100B). The conductor 110 functioning as one electrode of the capacitor 100A is electrically connected to the conductor 242a, and the conductor 110 functioning as one electrode of the capacitor 100B is electrically connected to the conductor 242b. When openings are formed in the insulator 280 in forming the conductors 110, even if a mask for forming the openings is misaligned and the openings and the conductors 260 overlap with each other, the conductors 260 are not exposed in the openings because they are covered with the etching stoppers. Thus, a short circuit due to contact between the conductor 110 and the conductor 260 can be prevented.

An insulator 130 is provided to cover the insulator 280 and the conductor 110. The insulator 130 is provided along the inner side of the conductor 110 and functions as a dielectric of the capacitor 100.

A conductor 120 is provided over the insulator 130. The conductor 120 is provided along the inner side of the insulator 130 and functions as the other electrode of the capacitor 100. Sandwiching the insulator 130 between the conductor 110 and the conductor 120 results in formation of the capacitor 100.

An insulator 150 is provided to cover the capacitor 100. The conductor 240 is provided to be embedded in the insulator 150, the insulator 130, and the insulator 280. Although FIG. 3 illustrates an example in which the conductor 240 is provided to penetrate the conductor 242 and the oxide 230 and is connected to the conductor 209 and a side surface of the region 243b in the oxide 230, the present invention is not limited thereto.

The conductor 240 is electrically connected at least to the conductor 209 and may be electrically connected to the conductor 209 through the conductor 242b and the region 243b. Alternatively, the conductor 240 may be provided to penetrate the conductor 242b and connected to a top surface of the region 243b.

The conductor 240 may be provided across one or both of the conductor 242b and the oxide 230 when the transistor 200 is seen from the channel width direction, to be connected to the conductor 209. In that case, it is not necessary to form an opening that penetrates one or both of the conductor 242 and the oxide 230.

When openings are formed in the insulator 150, the insulator 130, and the insulator 280 in forming the conductors 240, even if a mask for forming the openings is misaligned and the openings and the conductors 260 overlap with each other, the conductors 260 are not exposed in the openings because they are covered with the etching stoppers. Thus, a short circuit due to contact between the conductor 240 and the conductor 260 can be prevented.

The wiring BL is provided over the insulator 150 and the conductor 240 and is electrically connected to the conductor 240. The wiring BL is electrically connected to the drain of the transistor 300 and the other of the source and the drain of the transistor 200 through the conductor 240 and the conductor 209.

Since the conductor 205 and the conductor 260 in the memory cells 600A and 600B included in the cell 600 illustrated in FIG. 3 are covered with the etching stoppers, the distance (space) between the conductor 205 and the conductor 208, the space between the conductor 205 and the conductor 209, the space between the conductor 260 and the conductor 110, and the space between the conductor 260 and the conductor 240 can be made smaller than the minimum feature size (F). For example, the distance can be F/2, preferably less than F/2. Accordingly, in the memory cell 600A and the memory cell 600B, the width in the channel length direction and the width in the channel width direction can be designed to be 5F and 2F; hence, the memory cells with a cell size of $10F^2$ can be obtained. Note that although the minimum feature size in this embodiment is the width of a conductor 316, the present invention is not limited thereto. The width of the conductor 205, the width of the conductor 260, the width of the conductor 209, or the width of the conductor 240 may be used as the minimum feature size.

<Structure Example of Cell 600>

Next, a specific structure example of the cell 600 will be described with reference to FIG. 4 to FIG. 9.

In FIG. 4 to FIG. 9, a transistor 200a, a transistor 200b, a transistor 300a, a transistor 300b, a capacitor 100a, and a capacitor 100b correspond to the transistor 200A, the transistor 200B, the transistor 300A, the transistor 300B, the capacitor 100A, and the capacitor 100B, respectively, illustrated in FIG. 1 to FIG. 3. Therefore, among the components illustrated in FIG. 4 to FIG. 9, ones corresponding to those in FIG. 1 to FIG. 3 may be denoted by the same reference numerals.

As described above, the transistor 200A and the transistor 200B, the transistor 300A and the transistor 300B, and the capacitor 100A and the capacitor 100B are symmetrical with respect to the conductor 209 and the conductor 240. Thus, the description of the transistor 200a can be referred to for the transistor 200b, the description of the transistor 300a can be referred to for the transistor 300b, and the description of the capacitor 100a can be referred to for the capacitor 100b. Therefore, description of the structures of the transistor 200b, the transistor 300b, and the capacitor 100b is omitted below.

Figure 4:
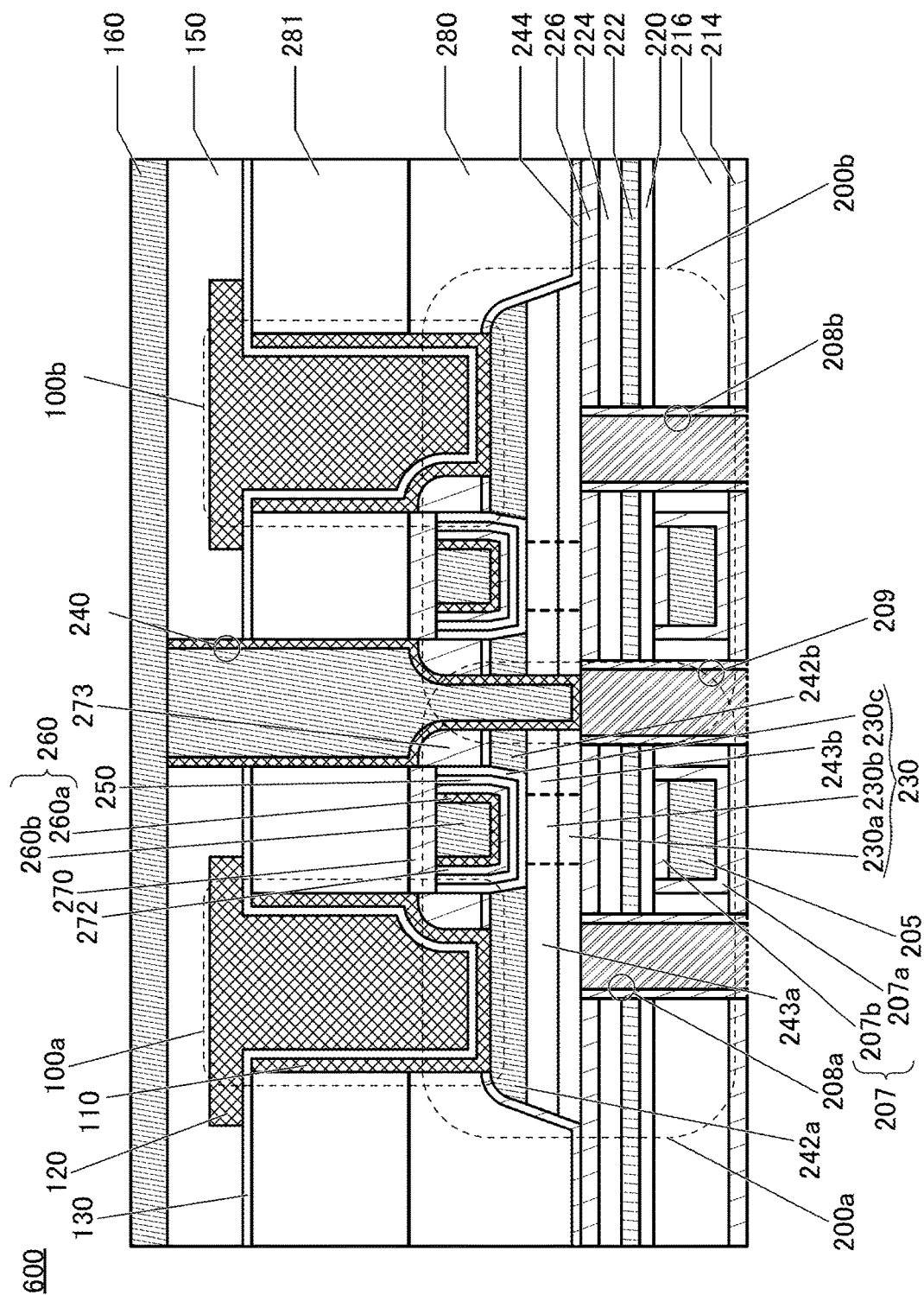
FIG. 4 A cross-sectional view of a semiconductor device of one embodiment of the present invention.

First, the structure of the transistor 200a (transistor 200b) and the capacitor 100a (capacitor 100b) corresponding to the upper structure of the cell 600 will be described with reference to FIG. 4. FIG. 4 is a cross-sectional view of the transistor 200a and the transistor 200b in the channel length direction.

[Transistor 200a]

As illustrated in FIG. 4, the transistor 200a includes the insulator 214 placed over a substrate (not illustrated); the insulator 216 placed over the insulator 214; the conductor 205 placed to be embedded in the insulator 214 and the insulator 216; an insulator 220 placed over the insulator 216 and the conductor 205; an insulator 222 placed over the insulator 220; the insulator 224 placed over the insulator 222; an insulator 226 placed over the insulator 224; an oxide 230a placed over the insulator 226; an oxide 230b placed over the oxide 230a; the conductor 242 placed over the oxide 230b; an insulator 244 covering the insulator 226, the oxide 230a, the oxide 230b, and the conductor 242; the insulator 280 that is placed over the insulator 244 and includes an opening; the insulator 273 placed over the insulator 244 in the opening; an oxide 230c provided to be in contact with a top surface of the oxide 230b, a side surface of the conductor 242, a side surface of the insulator 244, and one side surface of the insulator 273; the insulator 250 provided on the inner side of the oxide 230c; the insulator 272 provided on the inner side of the insulator 250; a conductor 260a provided on the inner side of the insulator 272; a conductor 260b provided to be embedded in a space on the inner side of the conductor 260a; and the insulator 270 provided to be in contact with the one side surface of the insulator 273, a top surface of the oxide 230c, a top surface of the insulator 250, a top surface of the insulator 272, a top surface of the conductor 260a, and a top surface of the conductor 260b. Moreover, the insulator 207a is placed in contact with a bottom surface and a side surface of the conductor 205, and the insulator 207b is placed in contact with a top surface of the conductor 205.

The transistor 200a is shown to have a structure in which three layers of the oxide 230a, the oxide 230b, and the oxide 230c are stacked in a region where the channel is formed (hereinafter also referred to as a channel formation region) and its vicinity; however, the present invention is not limited thereto. For example, it is possible to employ a single layer of the oxide 230b, a two-layer structure of the oxide 230b and the oxide 230a, a two-layer structure of the oxide 230b and the oxide 230c, or a stacked-layer structure of four or more layers. Moreover, the transistor 200a is shown to have a two-layer structure of the conductor 260 (the conductor 260a and the conductor 260b); however, the present invention is not limited thereto. For example, the conductor 260 may have a single-layer structure or a stacked-layer structure of three or more layers.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and a region between the conductor 242a and the conductor 242b, with the insulator 273, the insulator 250, and the like therebetween. Here, the positions of the conductor 260, the conductor 242a, and the conductor 242b with respect to the opening of the insulator 280 are selected in a self-aligned manner. That is, in the transistor 200a, the gate electrode can be positioned between the source electrode and the drain electrode in a self-aligned manner. Thus, the conductor 260 can be formed without an alignment margin, resulting in a reduction in the area occupied by the transistor 200a. Accordingly, miniaturization and high integration of the semiconductor device can be achieved.

Since the conductor 260 is formed in the region between the conductor 242a and the conductor 242b in a self-aligned manner, the conductor 260 does not have a region overlapping with the conductor 242a or the conductor 242b. Thus, parasitic capacitance formed between the conductor 260 and the conductors 242a and 242b can be reduced. As a result, the transistor 200a can have increased switching speed and excellent frequency characteristics.

The insulator 270 and the insulator 273 have a function of an etching stopper. Since a side surface and a top surface of the conductor 260 are covered with the insulator 270 and the insulator 273, even if misalignment occurs at the time of forming an opening in which the conductor 240 is embedded, the conductor 260 can be prevented from being exposed in the opening. Thus, a short circuit due to contact between the conductor 240 and the conductor 260 can be inhibited. As above, an alignment margin for the conductor 240 and the conductor 260 does not need to be provided, so that the distance between the conductor 240 and the conductor 260 can be small.

The insulator 207 (the insulator 207a and the insulator 207b) has a function of an etching stopper. Since a side surface and a top surface of the conductor 205 are covered with the insulator 207, even if misalignment occurs at the time of forming an opening in which the conductor 209 is embedded, the conductor 205 can be prevented from being exposed in the opening. Thus, a short circuit due to contact between the conductor 209 and the conductor 205 can be inhibited. As above, an alignment margin for the conductor 209 and the conductor 205 does not need to be provided, so that the distance between the conductor 209 and the conductor 205 can be small. In the above manner, the area occupied by the cell 600 can be reduced, and miniaturization and high integration of the semiconductor device can be achieved.

In the transistor 200a, a metal oxide functioning as an oxide semiconductor (hereinafter also referred to as an oxide semiconductor) is preferably used as the oxide 230 (the oxide 230a, the oxide 230b, and the oxide 230c) including a channel formation region.

The transistor 200a using an oxide semiconductor in its channel formation region has an extremely low leakage current in a non-conduction state; hence, a semiconductor device with low power consumption can be provided. An oxide semiconductor can be deposited by a sputtering method or the like, and thus can be used for the transistor 200a constituting a highly integrated semiconductor device.

For the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Alternatively, for the oxide 230, an In—Ga oxide or an In—Zn oxide may be used.

Here, when the oxide 230 contains impurities such as hydrogen, nitrogen, and a metal element, the carrier density may increase and the resistance may be lowered. Furthermore, when the oxygen concentration of the oxide 230 decreases, the carrier density may increase and the resistance may be lowered.

When the conductor 242 (the conductor 242a and the conductor 242b) that is provided on and in contact with the oxide 230 and functions as the source electrode and the drain electrode has a function of absorbing oxygen in the oxide 230 or has a function of supplying impurities such as hydrogen, nitrogen, and a metal element to the oxide 230, a low-resistance region is partly formed in the oxide 230 in some cases.

As illustrated in FIG. 4, the conductor 242 is provided on and in contact with the oxide 230, and the region 243 (the region 243a and the region 243b) is formed as a low-resistance region at and near the interface of the oxide 230 with the conductor 242. The region 243 is preferably formed to extend to a bottom surface of the oxide 230a. One of the region 243a and the region 243b functions as a source region and the other functions as a drain region. A region between the region 243a and the region 243b functions as a channel formation region. As described above, the region 243b functioning as the other of the source region and the drain region of the transistor 200a is shared by the transistor 200b.

The region 243 has an increased carrier concentration and a lowered resistance because it has a low oxygen concentration or contains impurities such as hydrogen, nitrogen, and a metal element. In other words, the region 243 has a higher carrier density and a lower resistance than the channel formation region. The channel formation region is a high-resistance region with a low carrier density because it has a higher oxygen concentration or a lower impurity concentration than the region 243.

When the region 243, which is a low-resistance region, contains a metal element, the region 243 preferably contains, in addition to the oxide 230, one or a plurality of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like.

In the oxide 230, the boundaries between the regions are difficult to clearly observe in some cases. The concentration of a metal element and an impurity element such as hydrogen and nitrogen, which is detected in each region, may be not only gradually changed between the regions, but also continuously changed (also referred to as gradation) in each region. That is, the region closer to the channel formation region preferably has a lower concentration of a metal element and an impurity element such as hydrogen and nitrogen.

To selectively reduce the resistance of the oxide 230, the conductor 242 is preferably formed using, for example, a material containing at least one of impurities and metal elements that increase conductivity, such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum. Alternatively, a conductive film to be the conductor 242 is formed using a material, a film formation method, or the like with which impurities, such as an element that forms oxygen vacancies or an element trapped by oxygen vacancies, are injected into the oxide 230. Examples of the element include hydrogen, boron, carbon, nitrogen, fluorine, phosphorus, sulfur, chlorine, and a rare gas. Typical examples of the rare gas include helium, neon, argon, krypton, and xenon.

A transistor formed using an oxide semiconductor is likely to have its electrical characteristics changed by impurities and oxygen vacancies in a channel formation region of the oxide semiconductor; accordingly, the reliability is decreased in some cases. Moreover, if the channel formation region of the oxide semiconductor includes oxygen vacancies, the transistor tends to have normally-on characteristics. Thus, it is preferable that oxygen vacancies in the channel formation region be reduced as much as possible.

To prevent the transistor from becoming normally-on, the insulator near the oxide 230 (e.g., the insulator 250) preferably contains oxygen (also referred to as excess oxygen) more than that in the stoichiometric composition. Oxygen in the insulator 250 is diffused into the oxide 230 to reduce oxygen vacancies in the oxide 230 and prevent the transistor from becoming normally-on.

That is, oxygen contained in the insulator 250 is diffused into the channel formation region of the oxide 230, whereby oxygen vacancies in the channel formation region of the oxide 230 can be reduced.

It is preferable to provide the insulator 222, the insulator 226, the insulator 244, the insulator 273, the insulator 272, the insulator 270, and the like to inhibit diffusion of oxygen contained in the oxide 230 and the insulator 250 to the outside of the transistor 200a. For those insulators, a material that does not easily pass oxygen is preferably used. For example, an oxide containing one of aluminum and hafnium or a nitride of silicon can be used. Furthermore, those insulating films are preferably a material that does not easily pass impurities such as hydrogen, water, nitrogen, and a metal element. The use of such a material can inhibit entry of impurities from the outside of the transistor 200a into the transistor 200a.

An oxide semiconductor can be deposited by a sputtering method or the like, and thus can be used for a transistor constituting a highly integrated semiconductor device. The transistor using an oxide semiconductor in its channel formation region has an extremely low leakage current (off-state current) in a non-conduction state; thus, a semiconductor device with low power consumption can be provided.

Accordingly, a semiconductor device including a transistor having a high on-state current can be provided. Alternatively, a semiconductor device including a transistor having a low off-state current can be provided. Alternatively, a semiconductor device that has stable electrical characteristics with small variation in electrical characteristics and high reliability can be provided.

The structure of the semiconductor device including the transistor 200a of one embodiment of the present invention will be described in detail below.

The conductor 205 is positioned to overlap with the oxide 230 and the conductor 260. Furthermore, the conductor 205 is preferably provided to be embedded in the insulator 216.

Here, the conductor 260 sometimes functions as a first gate (also referred to as top gate) electrode. The conductor 205 sometimes functions as a second gate (also referred to as bottom gate) electrode. In that case, Vth of the transistor 200a can be controlled by changing a potential applied to the conductor 205 not in synchronization with but independently of a potential applied to the conductor 260. In particular, Vth of the transistor 200a can be higher than 0 V and its off-state current can be reduced by applying a negative potential to the conductor 205. Thus, a drain current when a potential applied to the conductor 260 is 0 V can be lower in the case where a negative potential is applied to the conductor 205 than in the case where the negative potential is not applied to the conductor 205.

The conductor 205 is provided to overlap with the oxide 230 and the conductor 260. The conductor 205 is preferably larger than the channel formation region of the oxide 230. It is particularly preferred that the conductor 205 extend also to a region beyond side surfaces of the oxide 230a and the oxide 230b in the channel width direction. That is, the conductor 205 and the conductor 260 preferably overlap with each other with the insulators therebetween, beyond the side surface of the oxide 230 in the channel width direction.

With the above structure, when potentials are applied to the conductor 260 and the conductor 205, an electric field generated from the conductor 260 and an electric field generated from the conductor 205 are connected, so that the channel formation region formed in the oxide 230 can be covered.

That is, the channel formation region can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate electrode and a second gate electrode is referred to as a surrounded channel (S-channel) structure.

Although a structure in which the conductor 205 of the transistor 200a is a single layer is illustrated, the present invention is not limited thereto. For example, the conductor 205 may have a stacked-layer structure of two or more layers. When a component has a stacked-layer structure, the layers may be distinguished by ordinal numbers corresponding to the formation order. For example, the conductor 205 may be configured such that a first conductor is formed on the inner side of an opening in the insulator 216 and a second conductor is formed further inside.

Here, for the first conductor of the conductor 205, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (a conductive material that does not easily transmit the above impurities) is preferably used. Alternatively, it is preferable to use a conductive material having a function of inhibiting diffusion of oxygen (e.g., at least one of oxygen atoms, oxygen molecules, and the like) (a conductive material that does not easily transmit the above oxygen). Note that in this specification, a function of inhibiting diffusion of impurities or oxygen means a function of inhibiting diffusion of any one or all of the above impurities and the above oxygen.

When the first conductor of the conductor 205 has a function of inhibiting diffusion of oxygen, the conductivity of the second conductor of the conductor 205 can be prevented from being lowered because of oxidization. As a conductive material having a function of inhibiting diffusion of oxygen, for example, tantalum, tantalum nitride, ruthenium, or ruthenium oxide is preferably used. Accordingly, the first conductor is a single layer or stacked layers of the above conductive materials.

A conductive material containing tungsten, copper, or aluminum as its main component is preferably used for the second conductor of the conductor 205. The second conductor may have a stacked-layer structure, for example, a stack of the above conductive material and titanium or titanium nitride.

The insulator 214 preferably functions as a barrier insulating film that prevents impurities such as water or hydrogen from entering the transistor 200a from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material that does not easily transmit the above impurities). Alternatively, it is preferable to use an insulating material having a function of inhibiting diffusion of oxygen (e.g., at least one of oxygen atoms, oxygen molecules, and the like) (an insulating material that does not easily transmit the above oxygen).

For example, aluminum oxide, silicon nitride, or the like is preferably used for the insulator 214. This can inhibit diffusion of impurities such as hydrogen or water toward the transistor 200a from the substrate side through the insulator 214, or can inhibit diffusion of oxygen contained in the insulator 224 and the like toward the substrate through the insulator 214.

The permittivity of the insulator 216, the insulator 280, and the insulator 281 functioning as an interlayer film is preferably lower than that of the insulator 214. When a material with a low permittivity is used for an interlayer film, the parasitic capacitance generated between wirings can be reduced.

For example, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 216, the insulator 280, and the insulator 281. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

The insulator 207 includes the insulator 207a and the insulator 207b. The insulator 207a is positioned in contact with a side surface and a bottom surface of the conductor 205, and the insulator 207b is positioned in contact with a top surface of the conductor 205. The insulator 207 has a function of an etching stopper. A metal oxide containing one kind or two or more kinds selected from hafnium, aluminum, gallium, yttrium, zirconium, tungsten, titanium, tantalum, nickel, germanium, magnesium, and the like can be used as the insulator 207. Alternatively, a nitride of silicon, such as silicon nitride or silicon nitride oxide, can be used.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process.

Note that the insulator 207a and the insulator 207b are preferably formed by an ALD method achieving favorable coverage.

The insulator 220, the insulator 222, the insulator 224, the insulator 226, and the insulator 250 have a function of a gate insulator.

The insulator 226 functions as an etching stopper in formation of the opening for forming the oxide 230c, the insulator 250, the insulator 272, the conductor 260, and the like, or in formation of the insulator 244, the conductor 242a, and the conductor 242b. Note that the insulator 226 does not always need to be provided when the insulator 224 or the like functions as an etching stopper in the above processing.

Here, when the insulator 226 is not provided and the oxide 230 and the insulator 224 are in contact with each other, an insulator containing more oxygen than oxygen in the stoichiometric composition is preferably used for the insulator 224. That is, an excess-oxygen region is preferably formed in the insulator 224. When the insulator containing excess oxygen is provided in contact with the oxide 230, oxygen vacancies in the oxide 230 can be reduced and the reliability of the transistor 200a can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 224 includes an excess-oxygen region, it is preferable that the insulator 222 have a function of inhibiting diffusion of oxygen (e.g., at least one of oxygen atoms, oxygen molecules, and the like) (that the insulator 222 do not easily transmit the above oxygen).

The insulator 222 and the insulator 226 preferably have a function of inhibiting diffusion of oxygen or impurities, in which case diffusion of oxygen contained in the oxide 230 to the insulator 220 side is prevented. Furthermore, the conductor 205 can be prevented from reacting with oxygen included in the insulator 224 and the oxide 230.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) is preferably used for the insulator 222 and the insulator 226. With miniaturization and high integration of a transistor, a problem such as leakage current may arise because of a thinner gate insulator. When a high-k material is used for an insulator functioning as a gate insulator, a gate potential during operation of the transistor can be reduced while the physical thickness of the gate insulator is kept.

It is particularly preferable to use an insulator containing an oxide of one or both of aluminum and hafnium, which is an insulating material having a function of inhibiting diffusion of impurities, oxygen, and the like (or an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 222 and the insulator 226 are formed using such a material, the insulator 222 and the insulator 226 function as a layer that inhibits release of oxygen from the oxide 230 and entry of impurities such as hydrogen from the periphery of the transistor 200a into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

It is preferable that the insulator 220 and the insulator 226 be thermally stable. For example, silicon oxide and silicon oxynitride, which have thermal stability, are suitable. Furthermore, combination of an insulator which is a high-k material and silicon oxide or silicon oxide oxynitride enables the insulator 220 and the insulator 226 to have a stacked-layer structure that is thermally stable and has a high dielectric constant.

Note that the insulator 220, the insulator 222, and the insulator 224 may each have a stacked-layer structure of two or more layers. In that case, without limitation to a stacked-layer structure formed of the same material, a stacked-layer structure formed of different materials may be employed.

The conductor 209 is placed to be embedded in an opening formed in the insulator 214, the insulator 216, the insulator 220, the insulator 222, the insulator 224, and the insulator 226. The conductor 209 is electrically connected to the drains of the transistor 300a and the transistor 300b as described above. The top surface of the conductor 209 is exposed from the insulator 226 and is in contact with one or both of a bottom surface of the conductor 240 and the region 243b of the oxide 230.

In the conductor 209, it is preferable that a first conductor be formed in contact with an inner wall of the opening and a second conductor be formed on the inner side of the first conductor. As the first conductor and the second conductor of the conductor 209, conductors that can be used as the first conductor and the second conductor, respectively, of the conductor 205 are used. The conductor 209 having such a structure can inhibit entry of impurities such as hydrogen and water from below the insulator 214 into the oxide 230 through the conductor 209.

Like the conductor 209, a conductor 208a is placed to be embedded in an opening formed in the insulator 214, the insulator 216, the insulator 220, the insulator 222, the insulator 224, and the insulator 226. The conductor 208a is electrically connected to the gate of the transistor 300a as described above. The top surface of the conductor 208a is exposed from the insulator 226 and is in contact with the region 243a of the oxide 230. Note that the structure of the conductor 208a can be similar to that of the conductor 209.

Here, since the conductor 205 is covered with the insulator 207 functioning as an etching stopper, it is not necessary to provide an alignment margin for the conductor 205 and the conductor 209 and for the conductor 205 and the conductor 208a. Thus, the distance between the conductor 205 and the conductor 209 and the distance between the conductor 205 and the conductor 208a can be small. Accordingly, the area occupied by the cell 600 can be reduced, and the miniaturization and high integration of the semiconductor device can be achieved.

Note that a conductor 208b electrically connected to the gate of the transistor 300b can be provided, like the conductor 208a.

In the transistor 200a, the conductor 209, the conductor 208a, and the conductor 208b each have a stacked-layer structure of the first conductor and the second conductor;

however, the present invention is not limited thereto. For example, the conductor 209, the conductor 208a, and the conductor 208b may each be a single layer or have a stacked-layer structure of three or more layers. When a component has a stacked-layer structure, the layers may be distinguished by ordinal numbers corresponding to the formation order.

The oxide 230 includes the oxide 230a, the oxide 230b over the oxide 230a, and the oxide 230c over the oxide 230b. When the oxide 230a is provided below the oxide 230b, impurities can be prevented from being diffused into the oxide 230b from the components formed below the oxide 230a. When the oxide 230c is provided over the oxide 230b, impurities can be prevented from being diffused into the oxide 230b from the components formed above the oxide 230c.

The oxide 230 preferably has a stacked-layer structure of oxides that differ in the atomic ratio of metal atoms. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

The energy level of the conduction band minimum gradually changes at a junction portion of the oxide 230a, the oxide 230b, and the oxide 230c. In other words, the energy level of the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like is preferably used for the oxide 230a and the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200a can have a high on-state current.

The oxide 230 includes the region 243a and the region 243b functioning as the source region and the drain region, and the channel formation region between the region 243a and the region 243b. Appropriate selection of the areas of the regions can easily achieve a transistor having electrical characteristics that meet the demand for the circuit design.

A metal oxide functioning as an oxide semiconductor is preferably used for the oxide 230. For example, as the metal oxide to be the channel formation region, it is preferable to use one having a band gap of 2 eV or more, preferably 2.5 eV or more. With the use of a metal oxide having such a wide band gap, the off-state current of the transistor can be reduced.

A transistor using an oxide semiconductor has an extremely low leakage current in a non-conduction state; thus, a semiconductor device with low power consumption can be provided. An oxide semiconductor can be deposited by a sputtering method or the like, and thus can be used for a transistor constituting a highly integrated semiconductor device.

The conductor 242 (the conductor 242a and the conductor 242b) functioning as the source electrode and the drain electrode is provided over the oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the oxide 230, the oxygen concentration of the region 243 sometimes decreases. In addition, a metal compound layer that contains the metal contained in the conductor 242 and the component of the oxide 230 is sometimes formed in the region 243. In such cases, the carrier density of the region 243 increases, and the region 243 becomes a low-resistance region.

Here, the region between the conductor 242a and the conductor 242b is formed to overlap with the opening of the insulator 280. Accordingly, the conductor 260 can be formed between the conductor 242a and the conductor 242b in a self-aligned manner.

The conductor 242b functioning as the other of the source electrode and the drain electrode of the transistor 200a is shared by the transistor 200b.

The insulator 244 is provided to cover the conductor 242 and inhibits oxidation of the conductor 242. The insulator 244 may be provided to cover the side surface of the oxide 230 and to be in contact with the insulator 226.

For example, a metal oxide containing one kind or two or more kinds selected from hafnium, aluminum, gallium, yttrium, zirconium, tungsten, titanium, tantalum, nickel, germanium, magnesium, and the like can be used for the insulator 244.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process. The insulator 244 is provided to inhibit oxidation of the conductor 242. Thus, the insulator 244 does not always need to be provided in the case where the conductor 242 is an oxidation-resistant material or does not significantly lose its conductivity even after absorbing oxygen. Design is appropriately set in consideration of required transistor characteristics.

The insulator 273 is positioned over the insulator 244. The insulator 273 has a function of a sidewall. For example, a metal oxide containing one kind or two or more kinds selected from hafnium, aluminum, gallium, yttrium, zirconium, tungsten, titanium, tantalum, nickel, germanium, magnesium, and the like can be used for the insulator 273. Alternatively, a nitride of silicon, such as silicon nitride or silicon nitride oxide, can be used.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process.

The oxide 230c is provided in contact with a top surface of the oxide 230b, a side surface of the conductor 242, a side surface of the insulator 244, and a side surface of the insulator 273.

The insulator 250 functions as a gate insulator. The insulator 250 is preferably positioned in contact with the inner wall (the top surface and side surface) of the oxide 230c. The insulator 250 is preferably formed using an insulator from which oxygen is released by heating. An example is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy analysis (TDS analysis). Note that the temperature of the film surface in the TDS analysis is preferably higher than or equal to 100° C. and lower than or equal to 700° C.

Specifically, it is possible to use any of silicon oxide containing excess oxygen silicon oxynitride, silicon nitride oxide, silicon nitride, silicon oxide to which fluorine is added, silicon oxide to which carbon is added, silicon oxide to which carbon and nitrogen are added, and porous silicon oxide. In particular, silicon oxide and silicon oxynitride, which have thermal stability, are preferable.

When an insulator that releases oxygen by heating is provided for the insulator 250 in contact with the top surface of the oxide 230c, oxygen can be efficiently supplied to the channel formation region of the oxide 230b through the oxide 230c from the insulator 250. Furthermore, as in the insulator 224, the concentration of impurities such as water or hydrogen in the insulator 250 is preferably reduced. The film thickness of the insulator 250 is preferably greater than or equal to 1 nm and less than or equal to 20 nm.

In order to supply excess oxygen contained in the insulator 250 to the oxide 230 efficiently, the insulator 272 may be provided between the insulator 250 and the conductor 260. The insulator 272 preferably inhibits diffusion of oxygen from the insulator 250. Providing the insulator 272 that inhibits oxygen diffusion inhibits diffusion of excess oxygen from the insulator 250 to the conductor 260. That is, a reduction in the amount of excess oxygen supplied to the oxide 230 can be inhibited. Moreover, oxidization of the conductor 260 due to excess oxygen can be inhibited.

The insulator 272 has a function of part of the gate insulator in some cases. Therefore, when silicon oxide, silicon oxynitride, or the like is used for the insulator 250, a metal oxide that is a high-k material with a high dielectric constant is preferably used for the insulator 272. The gate insulator having a stacked-layer structure of the insulator 250 and the insulator 272 can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used for the insulator 272.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process. Note that the insulator 272 is provided to inhibit oxidation of the conductor 260. Thus, the insulator 272 does not always need to be provided in the case where the conductor 260 is an oxidation-resistant material or does not significantly lose its conductivity even after absorbing oxygen. Design is appropriately set in consideration of required transistor characteristics.

Although the conductor 260 functioning as the first gate electrode has a two-layer structure in FIG. 4, the conductor 260 may have a single-layer structure or a stacked-layer structure of three or more layers. For example, when the conductor 260 has a two-layer structure, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, like the first conductor of the conductor 205. Alternatively, it is preferable to use a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization due to oxygen contained in the insulator 250. As a conductive material having a function of inhibiting diffusion of oxygen, for example, tantalum, tantalum nitride, ruthenium, or ruthenium oxide is preferably used.

The conductor 260b is preferably formed using a conductive material containing tungsten, copper, or aluminum as its main component. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

The insulator 270 functioning as the etching stopper is preferably provided over the conductor 260, the insulator 272, the insulator 250, and the oxide 230c, to be in contact with the side surface of the insulator 273. For example, a metal oxide containing one kind or two or more kinds selected from hafnium, aluminum, gallium, yttrium, zirconium, tungsten, titanium, tantalum, nickel, germanium, magnesium, and the like can be used for the insulator 270. Alternatively, a nitride of silicon, such as silicon nitride or silicon nitride oxide, can be used.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by a thermal budget through the following process.

The insulator 280 is provided over the conductor 242 with the insulator 244 positioned therebetween. The insulator 280 preferably includes an excess-oxygen region. For example, as the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably included. In particular, silicon oxide and silicon oxynitride, which have thermal stability, are preferable.

When the insulator 244 is not provided, the insulator 280 is in contact with the side surfaces of the oxide 230a and the oxide 230b. In this case, oxygen contained in the insulator 280 is sometimes supplied to the channel formation region of the oxide 230 owing to heating. Note that the concentration of impurities such as water or hydrogen in the insulator 280 is preferably lowered.

The insulator 281 functioning as an interlayer film is preferably provided over the insulator 280. As in the insulator 224, the insulator 280, and the like, the concentration of impurities such as water or hydrogen in the insulator 281 is preferably lowered.

[Capacitor 100a]

As illustrated in FIG. 4, the capacitor 100a is provided in a region overlapping with the transistor 200a. The capacitor 100a includes the conductor 110, the insulator 130, and the conductor 120 over the insulator 130. Here, for the conductor 110 and the conductor 120, a conductor that can be used for the conductor 205, the conductor 260, or the like can be used.

The capacitor 100a is formed in an opening provided in the insulator 244, the insulator 280, and the insulator 281. At a bottom surface and a side surface of the opening, the conductor 110 functioning as a lower electrode and the conductor 120 functioning as an upper electrode face each other with the insulator 130 as a dielectric positioned therebetween. Here, the conductor 110 of the capacitor 100a is formed in contact with the conductor 242a of the transistor 200a.

In particular, by making the depth of the opening in the insulator 280 and the insulator 281 larger, the capacitor 100a can have a larger capacitance without an increase in its projected area. Therefore, it is preferred that the capacitor 100a be a cylindrical capacitor (have a side surface area larger than a bottom surface area).

The above structure can increase the capacitance per unit area of the capacitor 100a and advance further miniaturization or higher integration of the semiconductor device. The capacitance of the capacitor 100a can be appropriately set in accordance with the thickness of the insulator 280 and the insulator 281. Consequently, a semiconductor device with high design flexibility can be provided.

An insulator having a high dielectric constant is preferably used for the insulator 130. For example, an insulator containing an oxide of one or both of aluminum and hafnium can be used. Aluminum oxide, hafnium oxide, an oxide containing aluminum and hafnium (hafnium aluminate), or the like is preferably used as the insulator containing an oxide of one or both of aluminum and hafnium.

The insulator 130 may have a stacked-layer structure; for example, two or more layers selected from silicon oxide, silicon oxynitride, silicon nitride oxide, silicon nitride, aluminum oxide, hafnium oxide, an oxide containing aluminum and hafnium (hafnium aluminate), and the like may be used for the stacked-layer structure. For example, it is preferable that hafnium oxide, aluminum oxide, and hafnium oxide be deposited in this order by an ALD method to form a stacked-layer structure. Hafnium oxide and aluminum oxide each have a thickness of greater than or equal to 0.5 nm and less than or equal to 5 nm. With such a stacked-layer structure, the capacitor 100a can have a large capacitance and a low leakage current.

The conductor 110 or the conductor 120 may have a stacked-layer structure. For example, the conductor 110 or the conductor 120 may have a stacked-layer structure of a conductive material containing titanium, titanium nitride, tantalum, or tantalum nitride as its main component and a conductive material containing tungsten, copper, or aluminum as its main component. Alternatively, the conductor 110 or the conductor 120 may have a single-layer structure or a stacked-layer structure of three or more layers.

Here, since the conductor 260 is covered with the insulator 270 and the insulator 273 functioning as an etching stopper, it is not necessary to provide an alignment margin for the conductor 260 and the conductor 110. Thus, the distance between the conductor 260 and the conductor 110 can be small. Accordingly, the area occupied by the cell 600 can be reduced, and the miniaturization and high integration of the semiconductor device can be achieved.

When a space is formed inside the conductor 120 in the opening in which the capacitor 100a is formed, an insulator is preferably provided in the space. As the insulator, an insulator that can be used as the insulator 281 is used. It is preferred that a top surface of the insulator be substantially level with a top surface of the conductor 120. However, the present invention is not limited thereto; for example, in a state where an opening is formed inside the conductor 120, the insulator 150 may be formed to fill the opening.

The insulator 150 is positioned over the capacitor 100a and the capacitor 100b. An insulator that can be used as the insulator 281 is used as the insulator 150. The conductor 160 is positioned over the insulator 150. The conductor 160 functions as the above-described wiring BL.

[Conductor 240 Functioning as Plug]

The conductor 240 functions as a plug connecting the wiring BL (the conductor 160) and the drains of the transistor 300a and the transistor 300b. The conductor 240 is placed to be embedded in an opening formed in the insulator 150, the insulator 130, the insulator 281, the insulator 280, the insulator 244, the conductor 242b, and the region 243b of the oxide 230. Here, the conductor 240 is in contact with a top surface of the insulator 273, the other side surface of the insulator 273, and a top surface of the conductor 209. Moreover, the conductor 240 is in contact with a side surface of the conductor 242b, a side surface of the oxide 230b, and a side surface of the oxide 230a. A top surface of the conductor 240 is exposed from the insulator 150 and is in contact with the conductor 160.

Note that a first conductor of the conductor 240 is formed in contact with the inner wall of the opening in the insulator 150, the insulator 130, the insulator 281, the insulator 280, the insulator 244, the conductor 242b, the oxide 230a, and the oxide 230b. The conductor 209 is positioned on at least part of a bottom portion of the opening, and the first conductor of the conductor 240 is in contact with the conductor 209. Furthermore, a second conductor of the conductor 240 is formed on the inner side of the first conductor of the conductor 240. As the first conductor and the second conductor of the conductor 240, conductors that can be used as the first conductor and the second conductor, respectively, of the conductor 205 are used.

As the first conductor of the conductor 240, a conductive material that has a function of inhibiting the passage of impurities such as water and hydrogen is preferably used. For example, tantalum, tantalum nitride, titanium, titanium nitride, ruthenium, ruthenium oxide, or the like is preferably used. The conductive material having a function of inhibiting the passage of impurities such as water and hydrogen may be used as a single layer or stacked layers. Using the conductive material for the first conductor of the conductor 240 can prevent impurities such as hydrogen and water from entering the oxide 230 through the conductor 240 from the layers above the insulator 281.

Although the structure in which the first conductor of the conductor 240 and the second conductor of the conductor 240 are stacked is described in this embodiment, the present invention is not limited thereto. For example, the conductor 240 may be provided as a single layer or to have a stacked-layer structure of three or more layers. When a component has a stacked-layer structure, the layers may be distinguished by ordinal numbers corresponding to the formation order.

Here, since the conductor 260 is covered with the insulator 270 and the insulator 273 functioning as an etching stopper, it is not necessary to provide an alignment margin for the conductor 260 and the conductor 240. Thus, the distance between the conductor 260 and the conductor 240 can be small. Accordingly, the area occupied by the cell 600 can be reduced, and the miniaturization and high integration of the semiconductor device can be achieved.

Depending on the size of the opening in which the conductor 240 is embedded, the conductor 242b and the oxide 230 may be divided into the transistor 200a side and the transistor 200b side. Moreover, an opening may be formed in the conductor 242b and the oxide 230.

Figure 5A:
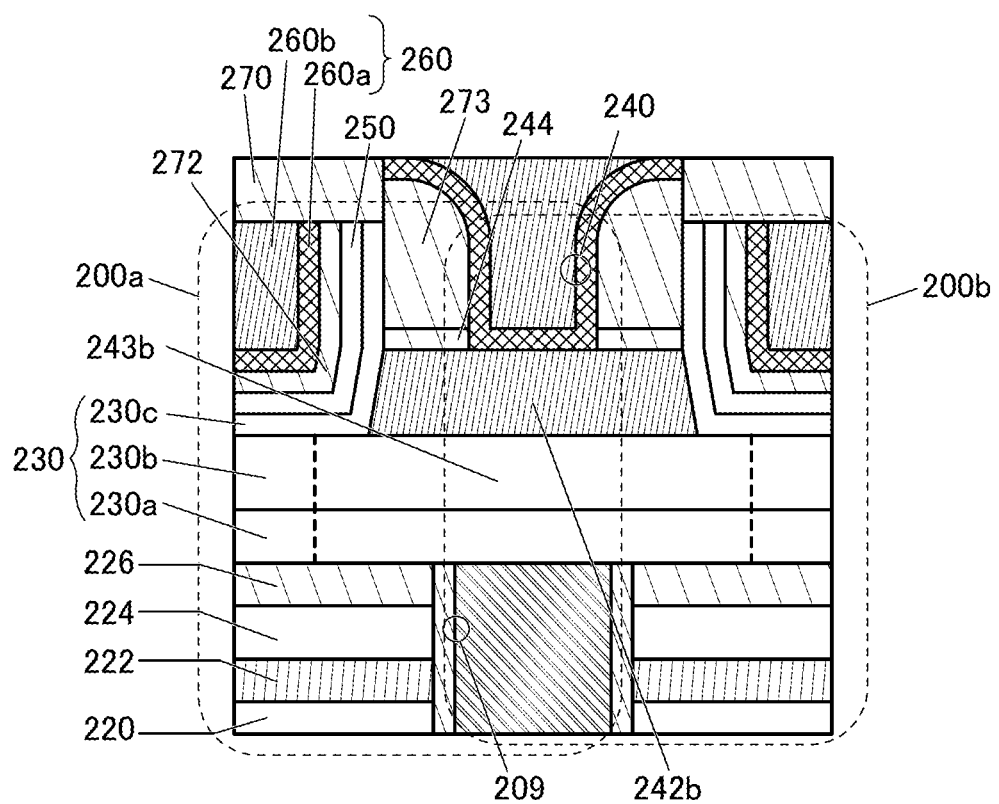
FIGS. 5A and 5B Cross-sectional views of a semiconductor device of one embodiment of the present invention.

In FIG. 4, the opening is formed in the conductor 242b and the oxide 230, and the conductor 240 and the conductor 209 are in direct contact with each other; however, the present invention is not limited thereto. For example, as illustrated in FIG. 5(A), a bottom surface of the conductor 240 may be in contact with the conductor 242b, and a top surface of the conductor 209 may be in contact with the region 243b of the oxide 230a. FIG. 5(A) is an enlarged view obtained by changing the shape of an area around the conductor 240 and the conductor 209 from that in the structure illustrated in FIG. 4. The conductor 240 and the conductor 209 are electrically connected to each other through the conductor 242b and the region 243b of the oxide 230b and the oxide 230a. In this case, it is preferred that the resistance of the region 243b be sufficiently small.

Figure 5B:
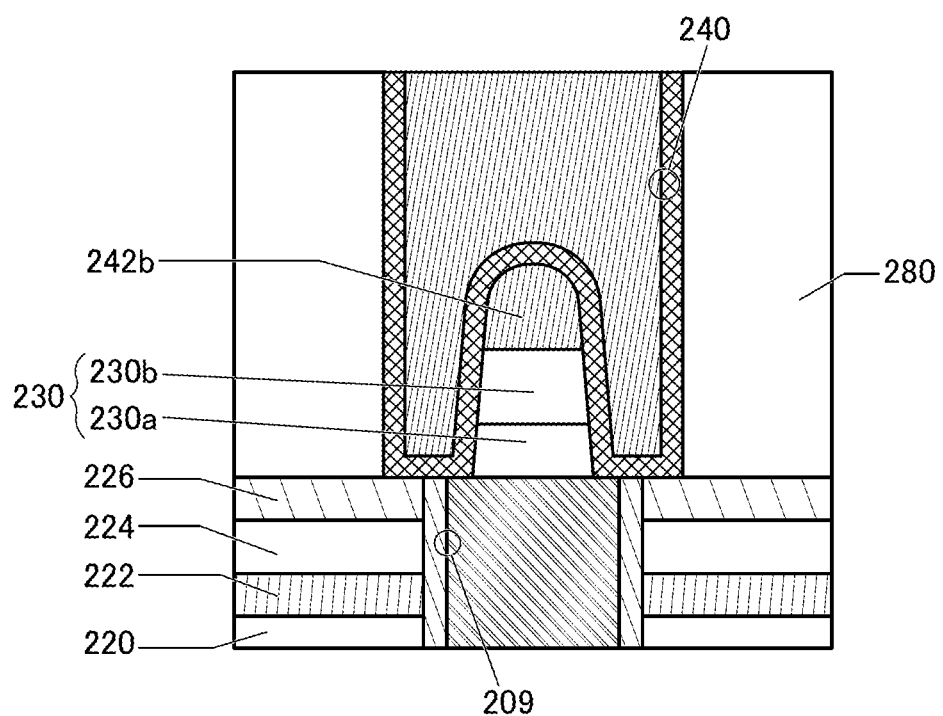

FIG. 5(B) is an enlarged view in the channel width direction of the structure obtained by changing the shape of the area around the conductor 240 and the conductor 209 from that in the structure illustrated in FIG. 4. As illustrated in FIG. 5(B), in the channel width direction, the conductor 240 may be in contact with a top surface and a side surface of the conductor 242b, a side surface of the oxide 230b, a side surface of the oxide 230a, and a top surface of the conductor 209. In this case, the length of the conductor 242b, the oxide 230b, and the oxide 230a in the channel width direction is smaller than the length of the conductor 240 and the conductor 209 in the channel width direction.

As described above, both the transistor 200a and the transistor 200b are formed in the oxide 230, and one of the source and the drain of the transistor 200a and one of the source and the drain of the transistor 200b are in contact with the conductor 240. Thus, the transistor 200a and the transistor 200b share a contact portion, and the number of plugs and contact holes can be reduced. Sharing the wiring that is electrically connected to one of the source and the drain in the above manner can further reduce the area occupied by the memory cell array.

<Constituent Material of Semiconductor Device>

Constituent materials that can be used for a semiconductor device will be described below.

A constituent material described below can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas.

By a plasma CVD method, a high-quality film can be formed at a relatively low temperature. Furthermore, a thermal CVD method does not use plasma and thus is a deposition method that enables less plasma damage to an object. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method is also a deposition method that can enables less plasma damage to an object. Thus, a film with few defects can be obtained. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike in a deposition method in which particles ejected from a target or the like are deposited, in a CVD method and an ALD method, a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate; hence, it is sometimes preferable to combine an ALD method with another deposition method with a high deposition rate, such as a CVD method.

When a CVD method or an ALD method is used, the composition of a film to be formed can be controlled with a flow rate ratio of the source gases. For example, by a CVD method or an ALD method, a film with a certain composition can be formed depending on the flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be shortened because time taken for transfer and pressure adjustment is omitted. Thus, semiconductor devices can be manufactured with improved productivity in some cases.

For the processing of the constituent material, a lithography method can be employed. For the processing, a dry etching method or a wet etching method can be employed. The processing by a dry etching method is suitable for microfabrication.

In the lithography method, first, a resist is exposed to light through a mask. Next, a region exposed to light is removed or left using a developing solution, so that a resist mask is formed. Then, etching through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that the above mask for the exposure of the resist to light is unnecessary in the case of using an electron beam or an ion beam because direct writing is performed on the resist. Note that for removal of the resist mask, dry etching treatment such as ashing can be performed, wet etching treatment can be performed, wet etching treatment can be performed after dry etching treatment, or dry etching treatment can be performed after wet etching treatment, for example.

A hard mask formed of an insulator or a conductor may be used instead of the resist mask. In the case where a hard mask is used, a hard mask with a desired shape can be formed by forming an insulating film or a conductive film to be the hard mask material over the constituent material, forming a resist mask thereover, and then etching the hard mask material. The etching of the constituent material may be performed after removal of the resist mask or while the resist mask remains. In the latter case, the resist mask may be removed during the etching. The hard mask may be removed by etching after the etching of the constituent material. The hard mask does not need to be removed in the case where the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may employed in which different high-frequency powers are applied to one of the parallel plate electrodes. Alternatively, a structure may be employed in which a high-frequency power with the same frequency is applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

<<Substrate>>

As a substrate where the transistor $200a$ and the transistor $200b$ are formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the above semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is fabricated over a non-flexible substrate and then the transistor is separated from the non-flexible substrate and transferred to a substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate that is a flexible substrate, for example, a metal, an alloy, a resin, glass, or fiber thereof can be used. Note that as the substrate, a sheet, a film, a foil, or the like that contains a fiber may be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (nylon, aramid, and the like), polyimide, polycarbonate, and acrylic. In particular, aramid is suitable for the substrate that is a flexible substrate because of its low coefficient of linear expansion.

<<Insulator>>

An insulating oxide, an insulating nitride, an insulating oxynitride, an insulating nitride oxide, an insulating metal oxide, an insulating metal oxynitride, and an insulating metal nitride oxide are given as an insulator.

With miniaturization and high integration of a transistor, for example, a problem of leakage current or the like may arise because a gate insulator becomes thin. When a high-k material is used for the insulator functioning as a gate insulator, the voltage at the time when the transistor operates can be reduced while the physical thickness of the gate insulator is kept. By contrast, when a material having a low dielectric constant is used for the insulator functioning as an interlayer film, the parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure that is thermally stable and has a low dielectric constant can be obtained by combining silicon oxide or silicon oxynitride with a resin, for example. Examples of the resin include polyester, polyolefin, polyamide (e.g., nylon and aramid), polyimide, polycarbonate, and acrylic. A stacked-layer structure that is thermally stable and has a high dielectric constant can be obtained by combining silicon oxide or silicon oxynitride with an insulator having a high dielectric constant.

When the transistor using an oxide semiconductor is surrounded by an insulator that has a function of inhibiting the passage of oxygen and impurities such as hydrogen, the electrical characteristics of the transistor can be stable.

As an insulator that has a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more kinds selected from hafnium, aluminum, gallium, yttrium, zirconium, tungsten, titanium, tantalum, nickel, germanium, magnesium, and the like can be used for the insulator 207, the insulator 270, and the insulator 273. It is also possible to use a nitride of silicon or a nitride of silicon containing oxygen, such as silicon nitride or silicon nitride oxide.

Since the insulator 270 and the insulator 273 function as etching stoppers when a contact is formed in the insulator 280 and the insulator 281, the insulator 270 and the insulator 273 are preferably formed using a material whose etching rate is different from the etching rate of the insulator 280 and the insulator 281. Similarly, since the insulator 207 functions as an etching stopper when a contact is formed in the insulator 216, the insulator 207 is preferably formed using a material whose etching rate is different from the etching rate of the insulator 216.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has lower barrier property than aluminum oxide, hafnium oxide having a large thickness can have a high barrier property. Therefore, the amount of added hydrogen and nitrogen can be adjusted appropriately by adjusting the thickness of hafnium oxide.

For example, the insulator 250 functioning as the gate insulator is preferably an insulator including an excess-oxygen region. In the case where the insulator 226 is not provided and the insulator 224 functioning as part of the gate insulator is in contact with the oxide 230, the insulator 224 preferably includes an excess-oxygen region. When a structure is employed in which silicon oxide or silicon oxynitride including an excess-oxygen region is in contact with the oxide 230, oxygen vacancies included in the oxide 230 can be compensated.

For example, an insulator containing an oxide of one or more kinds of aluminum, hafnium, and gallium can be used for the insulator 222 and the insulator 226, which function as part of the gate insulator. In particular, it is preferable to use aluminum oxide, hafnium oxide, an oxide containing aluminum and hafnium (hafnium aluminate), or the like as an insulator containing an oxide of one or both of aluminum and hafnium.

For example, silicon oxide or silicon oxynitride, which is thermally stable, is preferably used for the insulator 220. When the gate insulator has a stacked-layer structure of a thermally stable film and a film with a high dielectric constant, the equivalent oxide thickness (EOT) of the gate insulator can be reduced while the physical thickness of the gate insulator is kept.

With the above stacked-layer structure, on-state current can be increased without reduction in the influence of the electric field applied from the gate electrode. Since the distance between the gate electrode and the channel formation region is kept by the physical thickness of the gate insulator, leakage current between the gate electrode and the channel formation region can be inhibited.

The insulator 150, the insulator 216, the insulator 280, and the insulator 281 preferably include an insulator having a low dielectric constant. For example, the insulator 150, the insulator 216, the insulator 280, and the insulator 281 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 150, the insulator 216, the insulator 280, and the insulator 281 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic.

For the insulator 130, the insulator 214, the insulator 244, and the insulator 272, an insulator having a function of inhibiting the passage of oxygen and impurities such as hydrogen is used. For the insulator 214 and the insulator 274, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like is used, for example.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used in the channel formation region of the transistor, a stacked-layer structure combining a material containing any of the above-described metal elements and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

For the conductor 110, the conductor 120, the conductor 160, the conductor 260, the conductor 205, the conductor 242, the conductor 208a, the conductor 208b, the conductor 209, and the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

<<Metal Oxide>>

For the oxide 230, a metal oxide functioning as an oxide semiconductor (hereinafter also referred to as an oxide semiconductor) is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including the CAAC-OS is physically stable. Therefore, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO), which is a kind of metal oxide containing indium, gallium, and zinc, has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor.

The a-like OS includes a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor will be described.

Note that when the above metal oxide is used in a channel formation region of a transistor, the transistor having high field-effect mobility can be achieved. In addition, the transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the concentration of impurities in the metal oxide. In addition, in order to reduce the concentration of impurities in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

When containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the channel formation region in the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Hydrogen contained in a metal oxide forms shallow defect states (sDOS: shallow level Density of States) in the metal oxide in some cases. Shallow defect states refer to interface states near the conduction band minimum. Shallow defect states probably exist near the boundary between a high-density region and a low-density region in the metal oxide. Here, the high-density region and the low-density region in the metal oxide are distinguished by the amount of hydrogen contained in the region. That is, the high-density region is a region that contains more hydrogen than the low-density region. It is probable that near the boundary between the high-density region and the low-density region in the metal oxide, stress distortion between the regions easily causes minute cracks, oxygen vacancies and dangling bonds of indium are generated near the cracks, and impurities such as hydrogen and water are localized there to form shallow defect states.

The high-density region in the metal oxide sometimes has higher crystallinity than the low-density region. Furthermore, the high-density region in the metal oxide sometimes has higher film density than the low-density region. When the metal oxide has a composition including indium, gallium, and zinc, the high-density region contains indium, gallium, and zinc and the low-density region contains indium and zinc in some cases. In other words, the proportion of gallium in the low-density region is lower than that in the high-density region in some cases.

Note that the above shallow defect states probably result from oxygen vacancies. When oxygen vacancies in the metal oxide increase, the density of deep defect states (dDOS: deep level Density of States) as well as the density of shallow defect states probably increase. This is probably because deep defect states also result from oxygen vacancies. Note that deep defect states refer to defect states that are located around the center of the band gap.

Therefore, a reduction in the number of oxygen vacancies in the metal oxide can lead to a reduction in the density of both shallow defect states and deep defect states. Furthermore, shallow defect states can probably be controlled to some extent by adjusting the temperature at the time of deposition of the metal oxide. Specifically, the temperature at the time of deposition of the metal oxide is set to 170° C. or its vicinity, preferably 130° C. or its vicinity, further preferably room temperature, whereby the density of shallow defect states can be reduced.

Shallow defect states in a metal oxide affect the electrical characteristics of a transistor using the metal oxide for a semiconductor layer. In other words, owing to shallow defect states, the drain current Id changes gently with respect to the gate voltage Vg in the drain current-gate voltage (Id-Vg) characteristics of the transistor, worsening the S value (also referred to as Subthreshold Swing or SS), which is one of criteria for judging the rising characteristics of a transistor from an off state to an on state. This is probably because of trapping of electrons by shallow defect states.

Accordingly, hydrogen in the metal oxide is preferably reduced as much as possible. Specifically, the hydrogen concentration of the metal oxide, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities are sufficiently reduced is used in a channel formation region of a transistor, stable electrical characteristics can be given.

[Effect of Vacuum Baking]

Here, a weak Zn—O bond included in a metal oxide will be described, and an example of a method for reducing the number of oxygen atoms and zinc atoms that form the bond will be described.

In a transistor using a metal oxide, oxygen vacancies are given as an example of a defect that leads to poor electrical characteristics of the transistor. For example, the threshold voltage of a transistor using a metal oxide including oxygen vacancies tends to shift in the negative direction, and thus the transistor tends to have normally-on characteristics. This is because a donor caused by oxygen vacancies in the metal oxide is generated and the carrier concentration increases. When a transistor has normally-on characteristics, various problems occur; for example, a malfunction is likely to occur during the operation of the transistor or power consumption in an non-operating state increases.

Furthermore, a thermal budget in a step of forming a connection wiring for fabricating a module causes problems such as degradation of the electrical characteristics of the transistor, such as a variation in threshold voltage and an increase in parasitic resistance, and an increase in variation in the electrical characteristics due to the degradation of the electrical characteristics. Since such problems lead directly to a decrease in manufacturing yield, it is important to consider measures. Moreover, electrical characteristics degrade through a stress test, which can evaluate a change in transistor characteristics due to long-term use (a change over time) in a short time. The degradation of the electrical characteristics is presumably caused by oxygen vacancies in the metal oxide due to high-temperature treatment performed in the thermal budget process or electrical stress applied during the stress test.

In the metal oxide, there is an oxygen atom that has a weak bond to a metal atom and is likely to form an oxygen vacancy. In particular, in the case where the metal oxide is an In—Ga—Zn oxide, a zinc atom and an oxygen atom are likely to form a weak bond (also referred to as a weak Zn—O bond). Here, a weak Zn—O bond means a bond generated between a zinc atom and an oxygen atom, which is weak enough to be broken by high-temperature treatment performed in the thermal budget process or electrical stress applied during the stress test. When a weak Zn—O bond exists in the metal oxide, the bond is broken by a thermal budget or current stress, so that an oxygen vacancy is formed. The formation of oxygen vacancies decreases the stability of the transistor, such as resistance to a thermal budget and resistance to the stress test.

A bond between an oxygen atom bonded to many zinc atoms and the zinc atoms is a weak Zn—O bond in some cases. A zinc atom is bonded to an oxygen atom more weakly than a gallium atom is. Thus, an oxygen atom bonded to many zinc atoms is likely to form a vacancy. That is, a bond between a zinc atom and an oxygen atom is probably weaker than a bond between an oxygen atom and other metal.

It is probable that a weak Zn—O bond is likely to be formed when impurities exist in the metal oxide. Examples of impurities in the metal oxide include a water molecule and hydrogen. When a water molecule or hydrogen exists in the metal oxide, a hydrogen atom is sometimes bonded to an oxygen atom forming the metal oxide (which is also referred to as an OH bond). In the case where the In—Ga—Zn oxide is single crystal, an oxygen atom forming the metal oxide is bonded to four metal atoms forming the metal oxide. However, an oxygen atom bonded to a hydrogen atom is bonded to two or three metal atoms in some cases. When the number of metal atoms bonded to an oxygen atom decreases, the oxygen atom is likely to form an oxygen vacancy. Note that when a zinc atom is bonded to an oxygen atom that forms an OH bond, the bond between the oxygen atom and the zinc atom is probably weak.

A weak Zn—O bond is sometimes formed in a distortion in a region where a plurality of nanocrystals are connected. Although the shape of nanocrystals is basically a hexagon, they have a pentagonal or heptagonal lattice arrangement, for example, in the distortion. A weak Zn—O bond is formed in the distortion presumably because the bond distances between atoms are not uniform in the distortion.

It is probable that a weak Zn—O bond is likely to be formed when the crystallinity of the metal oxide is low. When the crystallinity of the metal oxide is high, a zinc atom forming the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom easily forms a vacancy. That is, a bond between a zinc atom and an oxygen atom is presumably weaker than that in a single crystal.

Reducing the number of oxygen atoms and zinc atoms that form the above-described weak Zn—O bonds inhibits formation of oxygen vacancies due to a thermal budget or current stress and can improve the stability of a transistor. Note that in the case where only the number of oxygen atoms that form the weak Zn—O bonds is reduced and the number of zinc atoms that form the weak Zn—O bonds is not reduced, a weak Zn—O bond is sometimes formed again when an oxygen atom is supplied to the vicinity of the zinc atoms. Therefore, it is preferable to reduce the number of zinc atoms and oxygen atoms that form the weak Zn—O bonds.

As a method for reducing the number of oxygen atoms and zinc atoms that form the weak Zn—O bonds, a method in which vacuum baking is performed after a metal oxide is formed can be given. Vacuum baking is heat treatment performed under a vacuum atmosphere. A vacuum atmosphere is kept by evacuation with a turbomolecular pump or the like. The pressure in the treatment chamber is preferably lower than or equal to $1 \times 10^{-2}$ Pa, further preferably lower than or equal to $1 \times 10^{-3}$ Pa. The substrate temperature in the heat treatment is higher than or equal to 300° C., preferably higher than or equal to 400° C.

Performing the vacuum baking can reduce the number of oxygen atoms and zinc atoms that form the weak Zn—O bonds. Furthermore, with heat applied to the metal oxide by the vacuum baking, the number of oxygen atoms and zinc atoms that form the weak Zn—O bonds is reduced and then the atoms forming the metal oxide are rearranged; thus, the number of oxygen atoms bonded to four metal atoms increases. Consequently, the number of oxygen atoms and zinc atoms that form the weak Zn—O bonds can be reduced, and a weak Zn—O bond can be prevented from being formed again.

When impurities exist in the metal oxide, performing the vacuum baking can release water molecules or hydrogen in the metal oxide and reduce the number of OH bonds. When the number of OH bonds in the metal oxide decreases, the proportion of the oxygen atoms bonded to four metal atoms increases. Furthermore, the atoms forming the metal oxide are rearranged when water molecules or hydrogen is released, so that the number of the oxygen atoms bonded to four metal atoms increases. Thus, a weak Zn—O bond can be prevented from being formed again.

As described above, when vacuum baking is performed after the metal oxide is formed, the number of oxygen atoms and zinc atoms that form weak Zn—O bonds can be reduced. Thus, the stability of the transistor can be improved through the step. Furthermore, an improvement in stability of the transistor increases the number of choices of materials and formation methods.

Figure 6:
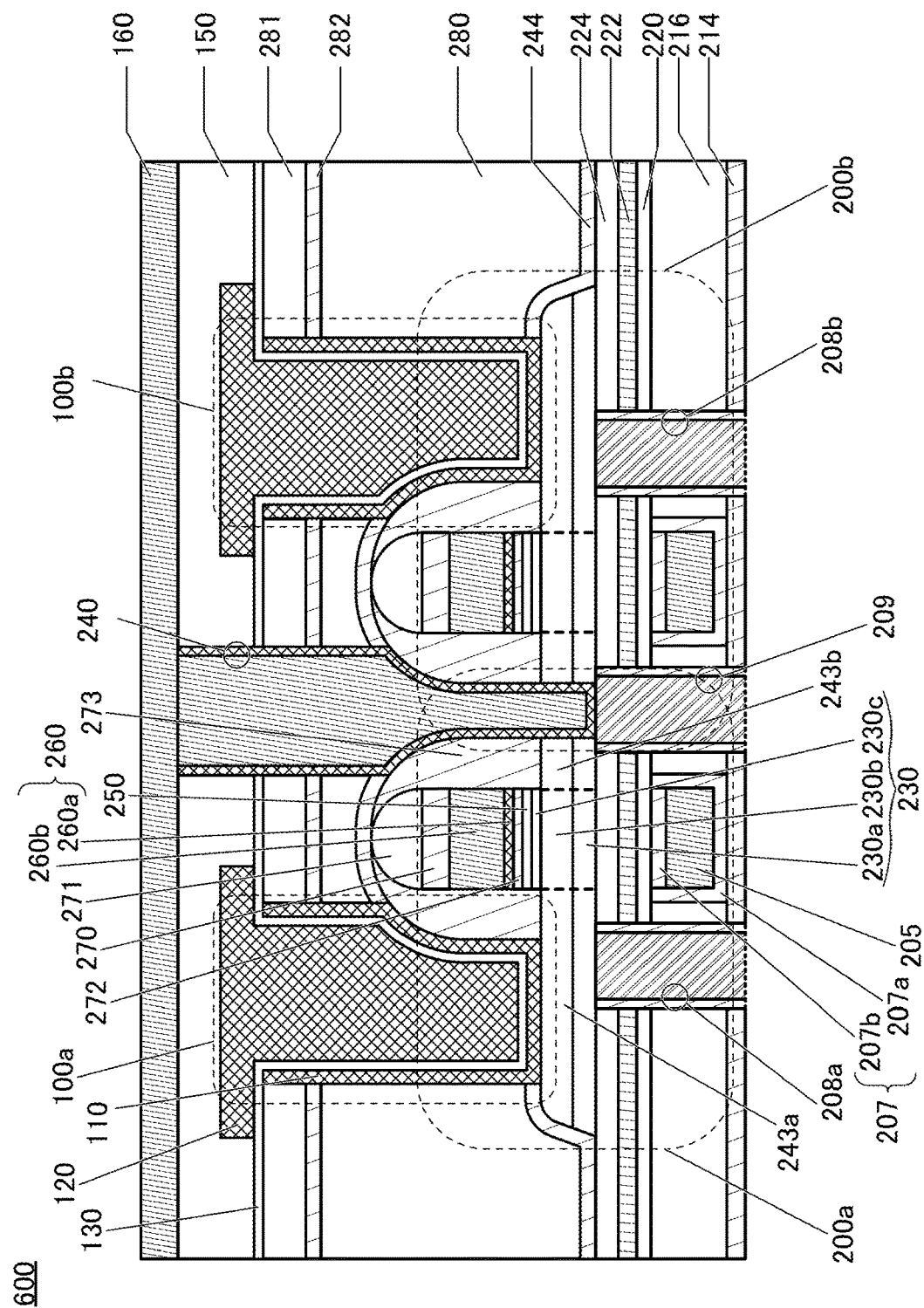
FIG. 6 A cross-sectional view of a semiconductor device of one embodiment of the present invention.
Figure 7:
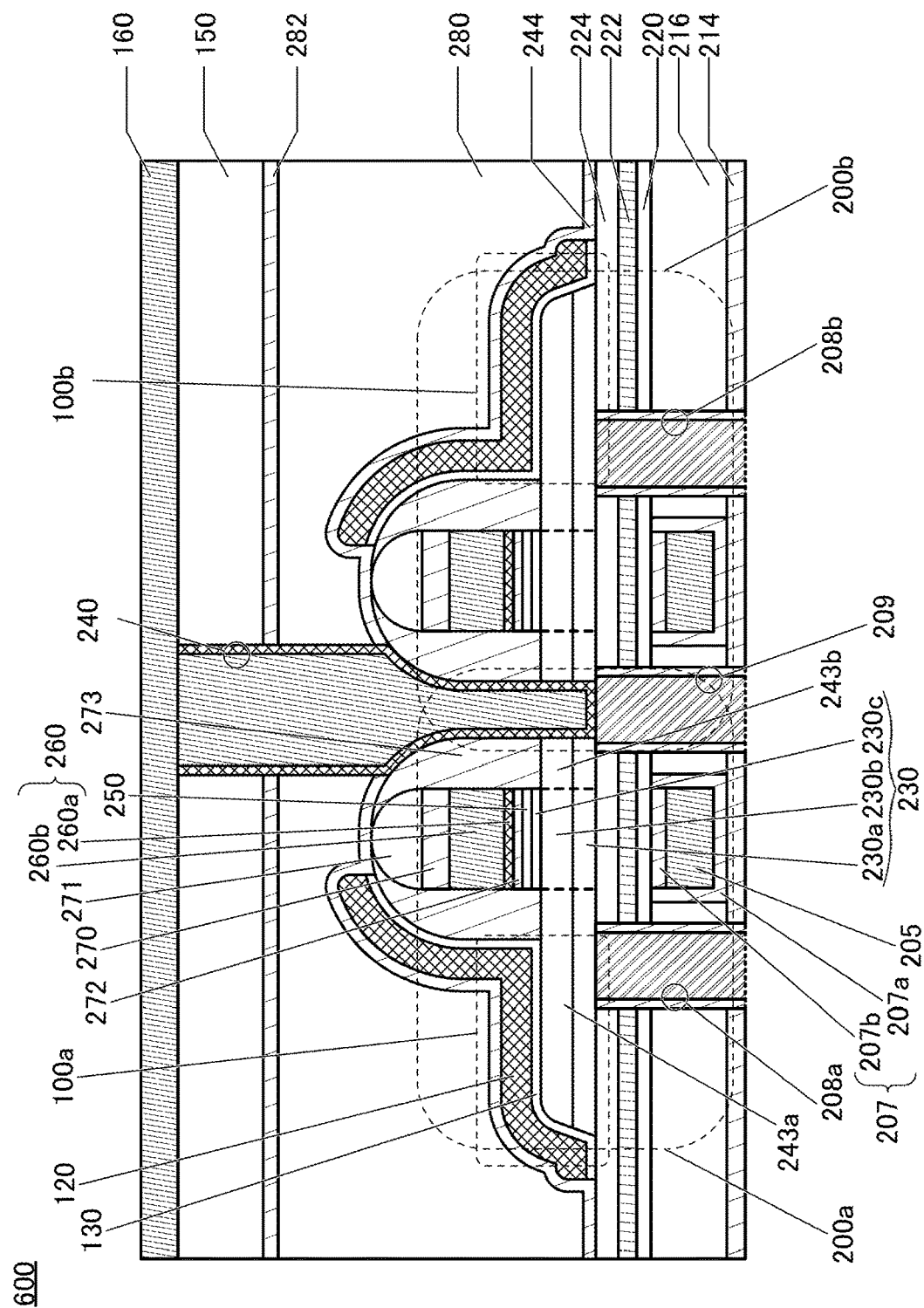
FIG. 7 A cross-sectional view of a semiconductor device of one embodiment of the present invention.

Examples of the cell 600 of one embodiment of the present invention, which are different from that shown in the foregoing <Structure example of cell 600>, will be described below with reference to FIG. 6 and FIG. 7. FIG. 6 and FIG. 7 are cross-sectional views of the transistor 200*a* and the transistor 200*b* in the channel length direction. Note that among components illustrated in FIG. 6 and FIG. 7, ones corresponding to the components illustrated in FIG. 4 are sometimes denoted by the same reference numerals. Hereinafter, the description of the components illustrated in FIG. 4 can be referred to for the components illustrated in FIG. 6 and FIG. 7, unless otherwise specified.

<Variation Example 1 of Cell 600>

The structure illustrated in FIG. 6 is different from the structure illustrated in FIG. 4 in the shapes of the transistor 200*a* and the transistor 200*b*. A structure of the transistor 200*a* in FIG. 6 different from that of the transistor 200*a* in FIG. 4 is described below.

The transistor 200*a* illustrated in FIG. 6 includes the insulator 214 placed over a substrate (not illustrated); the insulator 216 placed over the insulator 214; the conductor 205 placed to be embedded in the insulator 214 and the insulator 216; the insulator 220 placed over the insulator 216 and the conductor 205; the insulator 222 placed over the insulator 220; the insulator 224 placed over the insulator 222; the oxide 230*a* placed over the insulator 224; the oxide 230*b* placed over the oxide 230*a*; the oxide 230*c* placed over the oxide 230*b*; the insulator 250 placed over the oxide 230*c*; the insulator 272 placed over the insulator 250; the conductor 260 placed over the insulator 272; the insulator 270 placed over the conductor 260; an insulator 271 placed over the insulator 270; the insulator 273 placed in contact with side surfaces of the insulator 250, the conductor 260, and the insulator 270; and the insulator 244 provided to cover the insulator 224, the oxide 230, the insulator 273, and the insulator 271. Furthermore, the insulator 207*a* is placed in contact with a bottom surface and a side surface of the conductor 205, and the insulator 207*b* is placed in contact with a top surface of the conductor 205. The insulator 280 is provided over the insulator 244, an insulator 282 is provided over the insulator 280, and the insulator 281 is provided over the insulator 282.

The transistor 200*a* in FIG. 6 is different from the transistor 200*a* in FIG. 4 in that the oxide 230*c*, the insulator 250, the insulator 272, the conductor 260, and the insulator 270 are not formed to be embedded in an opening provided in the insulator 280; the conductor 242*a* and the conductor 242*b* are not provided and the conductor 110 is in contact with the oxide 230*b*; the insulator 271 is provided; the insulator 226 is not provided; and the insulator 282 is provided, for example.

The position of the side surface of the insulator 270 when seen perpendicularly to the substrate from above is preferably substantially aligned with the positions of the side surfaces of the conductor 260, the insulator 250, and the oxide 230*c*. The insulator 271 is formed in contact with a top surface of the insulator 270. The insulator 273 is provided in contact with side surfaces of the insulator 271, the insulator 270, the conductor 260, the insulator 250, and the oxide 230*c*. An insulating material that can be used for the insulator 280 is used for the insulator 271. Alternatively, an insulating material that can be used for the insulator 270 may be used for the insulator 271, in which case a structure without the insulator 270 may be employed.

The insulator 273 is preferably formed in the following manner: an insulating film is formed, and then anisotropic etching is performed such that portions of the insulating film in contact with the side surfaces of the insulator 271, the insulator 270, the conductor 260, the insulator 272, the insulator 250, and the oxide 230*c* remain.

With the insulator 271, at the time of processing the insulator 270, the conductor 260, the insulator 272, the insulator 250, and the oxide 230*c*, their side surfaces can be substantially perpendicular; specifically, the angle between the side surfaces and the substrate surface can be greater than or equal to 75° and less than or equal to 100°, preferably greater than or equal to 80° and less than or equal to 95°. With the side surfaces processed into such a shape, the insulator 273 can be formed into a desired shape by the above anisotropic etching.

The oxide 230*b* of the transistor 200*a* in FIG. 6 also includes the region 243*a* and the region 243*b*. As illustrated in FIG. 6, the region 243 is formed in a region of the oxide 230 that does not overlap with the conductor 260 and the like. As in the transistor 200*a* in FIG. 4, the region 243*a* of the oxide 230 can function as one of a source region and a drain region, and the region 243*b* of the oxide 230 can function as the other of the source region and the drain region. A region between the region 243*a* and the region 243*b* can function as a channel formation region.

To form the region 243, for example, a film containing a metal element is provided in contact with a region of the oxide 230 that does not overlap with the conductor 260. As the film containing the metal element, a metal film, an oxide film containing the metal element, or a nitride film containing the metal element can be used. In that case, a compound layer is preferably formed between the film containing the metal element and the oxide 230. For example, heat treatment is performed in an atmosphere containing nitrogen, and the metal is diffused from the film containing the metal element into the oxide 230. The compound layer is sometimes formed on the top surface and the side surface of the oxide 230. Note that the compound layer is a layer containing a metal compound that contains a component of the film containing the metal element and a component of the oxide 230. For example, as the compound layer, a layer in which the metal element of the oxide 230 and the metal element added are alloyed may be formed. When the film containing the metal element has an insulating property because of the above heat treatment or the like, it can also be used as the insulator 244. In addition, the film containing the metal element may be removed by etching treatment or the like after the formation of the region 243.

An insulator that can be used as the insulator 214 or the like is used as the insulator 282. Thus, the insulator 282 can function as a barrier insulating film that inhibits entry of impurities such as water or hydrogen into the transistor 200a and the like from the insulator 281 side. Alternatively, an insulating material having a function of inhibiting diffusion of oxygen is preferably used.

<Variation Example 2 of Cell 600>

The structure illustrated in FIG. 7 is different from the structure illustrated in FIG. 6 in the shapes of the capacitor 100a and the capacitor 100b. A structure of the capacitor 100a in FIG. 7 different from that of the capacitor 100a in FIG. 6 is described below.

The capacitor 100a includes the region 243a (the region in the oxide 230 that functions as one of the source and the drain of the transistor 200a), the insulator 130 over the region 243a, and the conductor 120 over the insulator 130. The conductor 120 is preferably positioned such that at least part thereof overlaps with the region 243a with the insulator 130 therebetween.

In the capacitor 100a, the region 243a functions as one electrode and the conductor 120 functions as the other electrode. The insulator 130 functions as a dielectric of the capacitor 100a. Here, the region 243a has a function of one of the source and the drain of the transistor 200a and the one electrode of the capacitor 100a.

The insulator 130 and the conductor 120 are preferably provided to cover a side surface of the oxide 230. With such a structure, the capacitor 100a can be formed also in the side surface direction of the oxide 230; thus, the electric capacity per unit area of the capacitor 100a can be increased.

Figure 8:
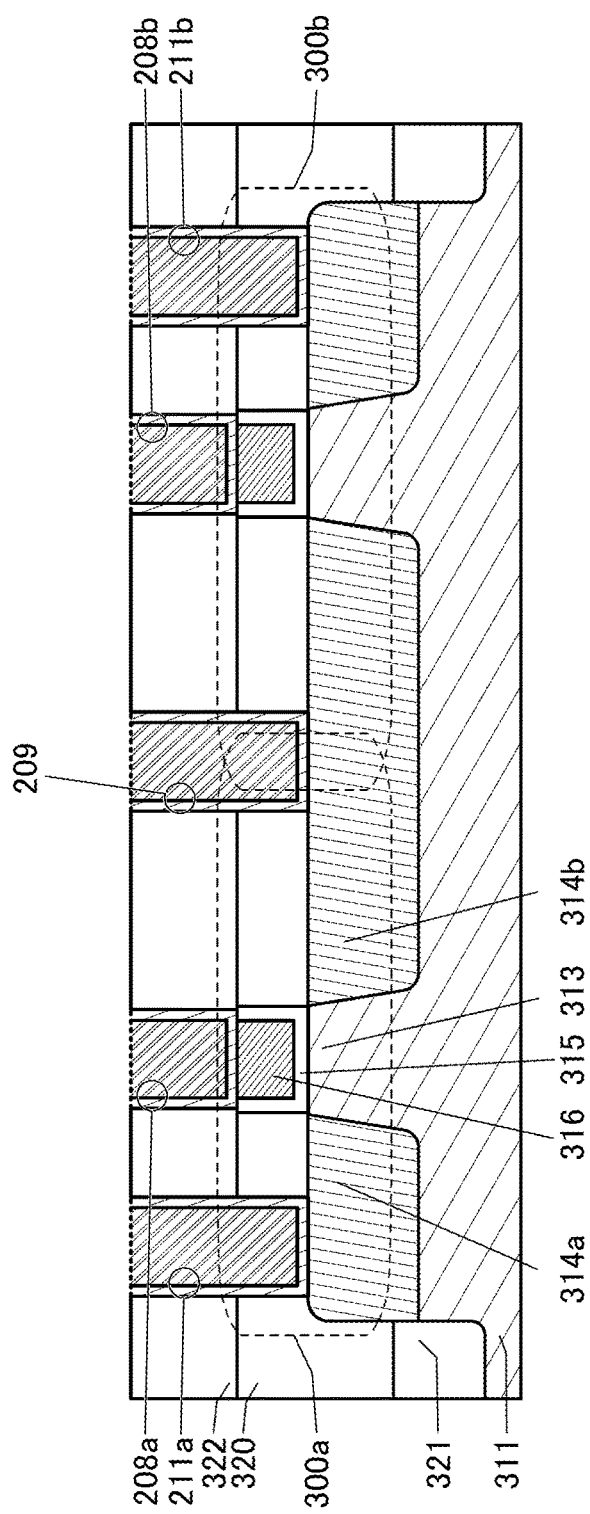
FIG. 8 A cross-sectional view of a semiconductor device of one embodiment of the present invention.

Next, a structure of the transistor 300a (transistor 300b) corresponding to the lower structure of the cell 600 will be described with reference to FIG. 8. FIG. 8 is a cross-sectional view of the transistor 300a and the transistor 300b in the channel length direction.

[Transistor 300a]

As illustrated in FIG. 8, the transistor 300a is provided on a substrate 311 and includes the conductor 316, the insulator 315, a semiconductor region 313 formed of part of the substrate 311, and a low-resistance region 314a and a low-resistance region 314b functioning as a source region and a drain region.

In the transistor 300a, a top surface and a side surface in the channel width direction of the semiconductor region 313 are covered with the conductor 316 with the insulator 315 therebetween. When the transistor 300a is such a Fin-type transistor, the effective channel width increases, whereby the on-state characteristics of the transistor 300a can be improved. In addition, since contribution of electric fields of a gate electrode can be increased, the off-state characteristics of the transistor 300a can be improved.

The transistor 300a is either a p-channel transistor or an n-channel transistor. When a plurality of cells 600 including the transistor 300a and the transistor 300b are provided on the substrate 311, an insulator 321 is provided between the cells 600.

A region of the semiconductor region 313 where a channel is formed, a region in the vicinity thereof, the low-resistance region 314a and the low-resistance region 314b functioning as the source region or the drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is adjusted by applying stress to the crystal lattice and thereby changing the lattice spacing is used. Alternatively, the transistor 300a may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313. Note that the transistor 300a and the transistor 300b share the low-resistance region 314b.

The conductor 316 functioning as a gate electrode can be formed using a semiconductor material such as silicon containing an element that imparts n-type conductivity, such as arsenic or phosphorus, or an element which that p-type conductivity, such as boron; or a conductive material such as a metal material, an alloy material, or a metal oxide material.

Note that the work function depends on a material of the conductor; thus, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum for the conductor, and it is particularly preferable to use tungsten in terms of heat resistance.

Note that the transistor 300a illustrated in FIG. 8 is only an example and the structure is not limited thereto; an appropriate transistor is used in accordance with a circuit configuration or a driving method.

An insulator 320 and an insulator 322 are stacked in this order to cover the transistor 300a.

The insulator 320 and the insulator 322 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300a or the like underlying the insulator 322. For example, a top surface of the insulator 322 may be planarized by planarization treatment using a chemical mechanical polishing (CMP) method or the like to improve planarity.

The conductor 208 (the conductor 208a and the conductor 208b) and the conductor 209 electrically connected to the capacitor 100a and the capacitor 100b or the transistor 200a and the transistor 200b, a conductor 211 (a conductor 211a and a conductor 211b) electrically connected to the wiring SL (the wiring SL1 and the wiring SL2), and the like are embedded in the insulator 320 and the insulator 322. Note that the conductor 208, the conductor 209, and the conductor 211 function as plugs or wirings. A plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

As a material of each of the plugs and wirings (e.g., the conductor 208, the conductor 209, and the conductor 211), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

The conductor 208a is electrically connected to the conductor 316 functioning as the gate of the transistor 300a and one of the source and the drain of the transistor 200a. At this time, the conductor 208a is preferably connected to a bottom portion of the region 243a of the oxide 230 included in the transistor 200a. The conductor 316 is electrically connected to one electrode (the conductor 110) of the capacitor 100a through the conductor 208a, the region 243a, and the like.

The conductor 209 is electrically connected to the low-resistance region 314b and the conductor 240. The low-resistance region 314b is electrically connected to the conductor 160 functioning as the wiring BL through the conductor 209, the conductor 240, and the like.

The conductor 211a is electrically connected to the low-resistance region 314a and the wiring SL1. The conductor 211a may function as the wiring SL1. At this time, the low-resistance region 314a functions as the source region of the transistor 300a, and the low-resistance region 314b functions as the drain region of the transistor 300a. Note that the transistor 300a and the transistor 300b share the low-resistance region 314b, and the low-resistance region 314b functions as a drain region of the transistor 300b in addition to the drain region of the transistor 300a.

Figure 9:
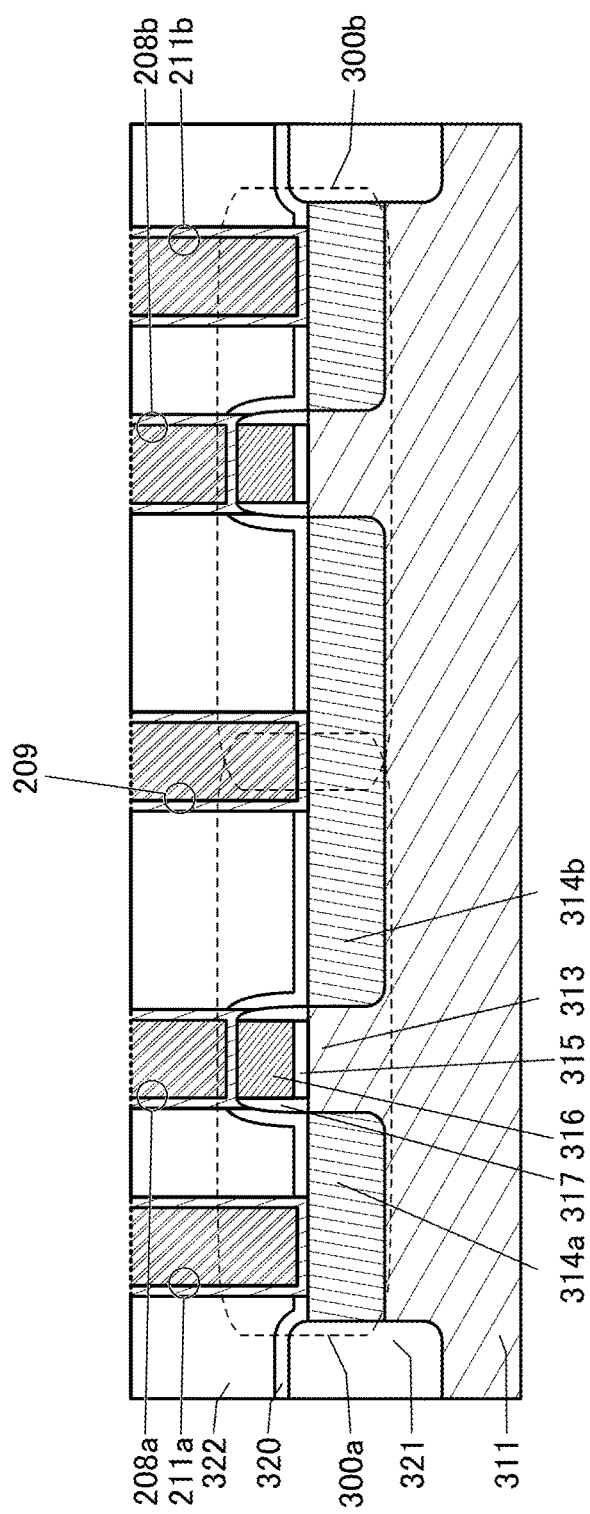
FIG. 9 A cross-sectional view of a semiconductor device of one embodiment of the present invention.

A different example of the transistor 300a of one embodiment of the present invention will be described below with reference to FIG. 9. FIG. 9 is a cross-sectional view of the transistor 300a in the channel length direction. Note that among components illustrated in FIG. 9, ones corresponding to the components illustrated in FIG. 8 are denoted by the same reference numerals and the description thereof is omitted in some cases. Hereinafter, the description of the components illustrated in FIG. 8 can be referred to for the components illustrated in FIG. 9, unless otherwise specified.

[Variation Example of Transistor 300a]

As the transistor 300a, a planar transistor can be used. In the transistor 300a in FIG. 9, the insulator 315 functioning as a gate insulator is provided over the semiconductor region 313 having a flat surface, and the conductor 316 functioning as a gate electrode is provided over the insulator 315. An insulator 317 functioning as a sidewall is provided on side surfaces of the insulator 315 and the conductor 316. The transistor 300a is preferably covered with the insulator 320 containing silicon nitride, or the like. The insulator 322 is provided over the insulator 320.

Like the transistor 300a in FIG. 8, the transistor 300a in FIG. 9 is provided on the substrate 311 and includes the low-resistance region 314a and the low-resistance region 314b functioning as a source region and a drain region. When a plurality of cells 600 are provided on the substrate 311, the insulator 321 is provided between the cells 600.

The conductor 208 (the conductor 208a and the conductor 208b) electrically connected to the conductor 316, the conductor 209 electrically connected to the low-resistance region 314b, and the conductor 211 (the conductor 211a and the conductor 211b) electrically connected to the low-resistance region 314a are provided to be embedded in the insulator 322 and the insulator 320.

The structure, composition, method, and the like described above in this embodiment can be used in appropriate combination with the structures, compositions, methods, and the like described in the other embodiments.

Embodiment 2

In this embodiment, a NOSRAM will be described with reference to FIG. 10 to FIG. 12 as an example of a memory device of one embodiment of the present invention that includes a transistor using an oxide as a semiconductor (hereinafter referred to as an OS transistor) and a capacitor. A NOSRAM (registered trademark) is an abbreviation of "Nonvolatile Oxide Semiconductor RAM", which indicates a RAM including a gain cell (2T or 3T) memory cell. Note that hereinafter, a memory device including an OS transistor, such as a NOSRAM, is referred to as an OS memory in some cases.

A memory device in which OS transistors are used in memory cells (hereinafter referred to as an OS memory) is used in a NOSRAM. The OS memory is a memory including at least a capacitor and an OS transistor that controls charge and discharge of the capacitor. Since the OS transistor is a transistor with an extremely low off-state current, the OS memory has excellent retention characteristics and can function as a nonvolatile memory.

<<NOSRAM 1600>>

Figure 10:
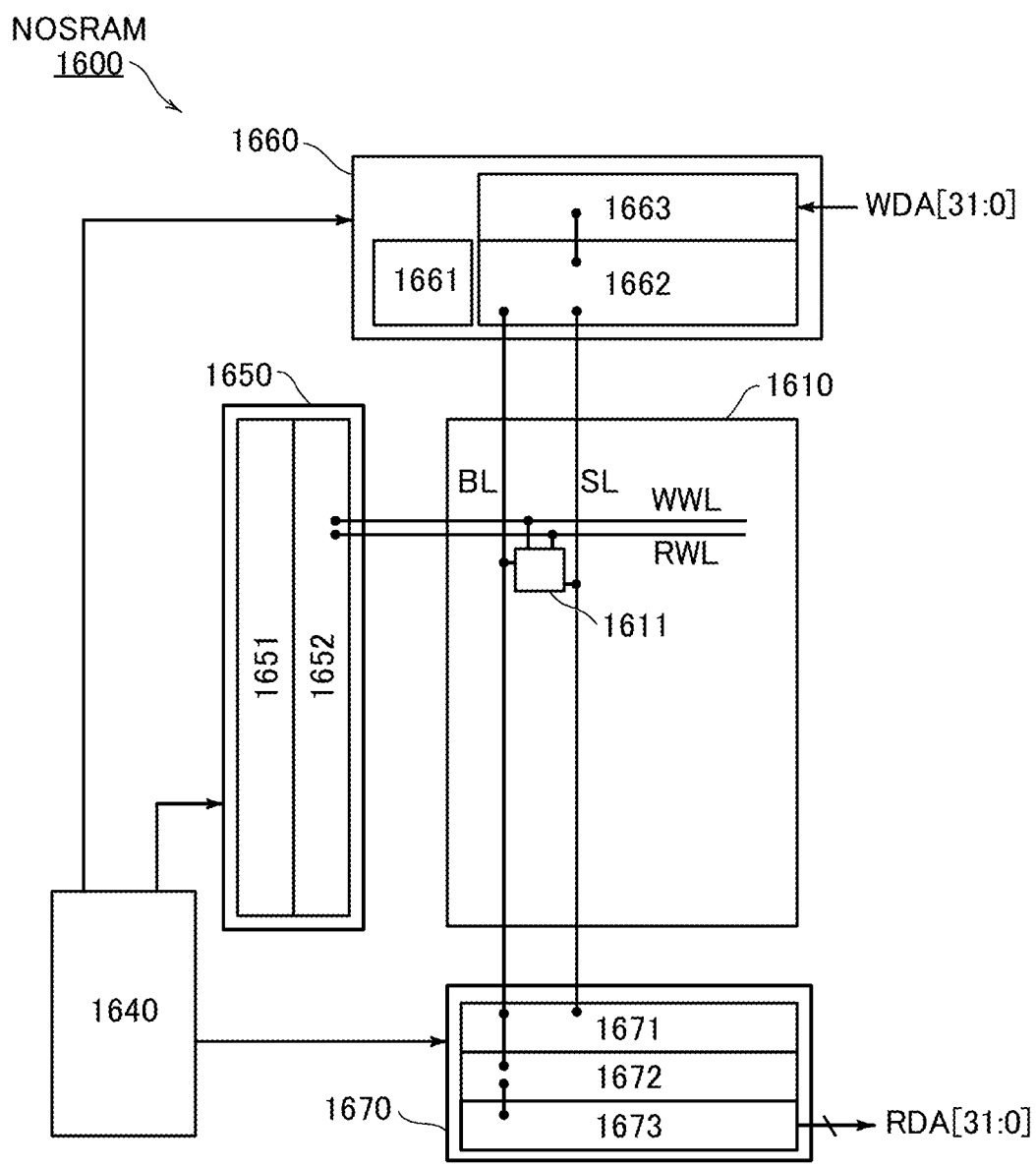
FIG. 10 A block diagram illustrating a structure example of a memory device of one embodiment of the present invention.

FIG. 10 illustrates a configuration example of a NOSRAM. A NOSRAM 1600 illustrated in FIG. 10 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL, a plurality of word lines RWL, bit lines BL, and source lines SL. The word lines WWL are write word lines, and the word lines RWL are read word lines. In the NOSRAM 1600, one memory cell 1611 stores 3-bit (8-level) data.

The controller 1640 controls the NOSRAM 1600 as a whole, and writes data WDA[31:0] and reads out data RDA[31:0]. The controller 1640 processes command signals from the outside (for example, a chip enable signal and a write enable signal) to generate control signals for the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source lines SL and the bit lines BL. The column driver 1660 includes a column decoder 1661, a write driver 1662, and a DAC (digital-analog converter circuit) 1663.

The DAC 1663 converts 3-bit digital data into an analog voltage. The DAC 1663 converts every three bits of 32-bit data WDA[31:0] into an analog voltage.

The write driver 1662 has a function of precharging the source lines SL, a function of bringing the source lines SL into an electrically floating state, a function of selecting a source line SL, a function of inputting a writing voltage generated in the DAC 1663 to the selected source line SL, a function of precharging the bit lines BL, a function of bringing the bit lines BL into an electrically floating state, and the like.

The output driver 1670 includes a selector 1671, an ADC (analog-digital converter circuit) 1672, and an output buffer 1673. The selector 1671 selects a source line SL to be accessed and transmits the potential of the selected source line SL to the ADC 1672. The ADC 1672 has a function of converting an analog voltage into 3-bit digital data. The potential of the source line SL is converted into 3-bit data in the ADC 1672, and the output buffer 1673 retains the data output from the ADC 1672.

Note that the configuration of the row driver 1650, the column driver 1660, and the output driver 1670 described in this embodiment is not limited to the above. The arrangement of the drivers and wirings connected to the drivers may be changed or the functions of the drivers and the wirings connected to the drivers may be changed or added, depending on the configuration, the driving method, or the like of the memory cell array 1610. For example, the bit lines BL may have part of a function of the source lines SL.

Note that although the amount of data retained in each of the memory cells 1611 is 3 bits in the above description, the structure of the memory device described in this embodiment is not limited thereto. The amount of data retained in each of the memory cells 1611 may be 2 bits or less or 4 bits or more. In the case where the amount of data retained in each of the memory cells 1611 is one bit, for example, a structure may be employed in which the DAC 1663 and the ADC 1672 are not provided.

<Memory Cell 1611 to Memory Cell 1614>

Figure 11A:
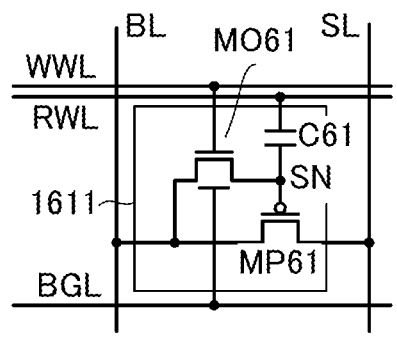
FIGS. 11A to 11E Circuit diagrams illustrating structure examples of a memory device of one embodiment of the present invention.

FIG. 11(A) is a circuit diagram illustrating a configuration example of the memory cell 1611. The memory cell 1611 is a 2T gain cell and is electrically connected to the word line WWL, the word line RWL, the bit line BL, the source line SL, and a wiring BGL. The memory cell 1611 includes a node SN, an OS transistor MO61, a transistor MP61, and a capacitor C61. The OS transistor MO61 is a write transistor. The transistor MP61 is a read transistor and is configured with a p-channel Si transistor, for example. The capacitor C61 is a storage capacitor for retaining the potential of the node SN. The node SN is a data retention node and corresponds to a gate of the transistor MP61 here.

Since the write transistor of the memory cell 1611 is configured with the OS transistor MO61, the NOSRAM 1600 can retain data for a long time.

Figure 11B:
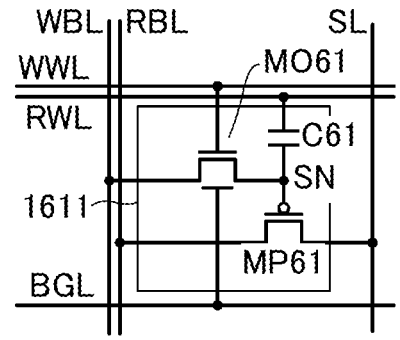

In the example of FIG. 11(A), a common bit line is used for writing and reading; alternatively, as illustrated in FIG. 11(B), a bit line WBL functioning as a write bit line and a bit line RBL functioning as a read bit line may be provided.

Figure 11C:
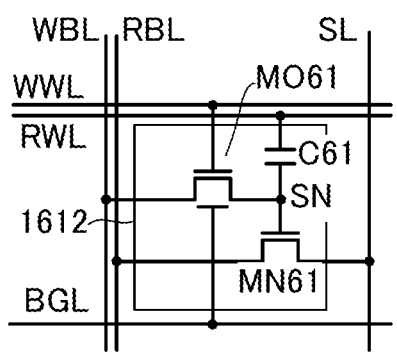
Figure 11D:
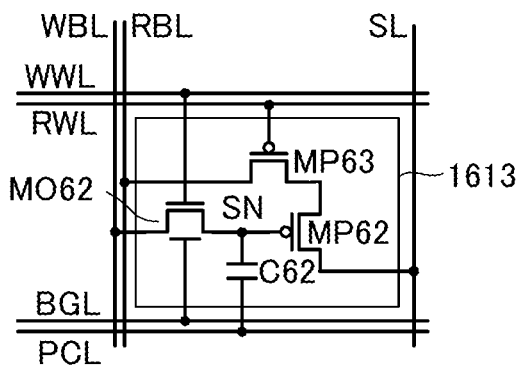
Figure 11E:
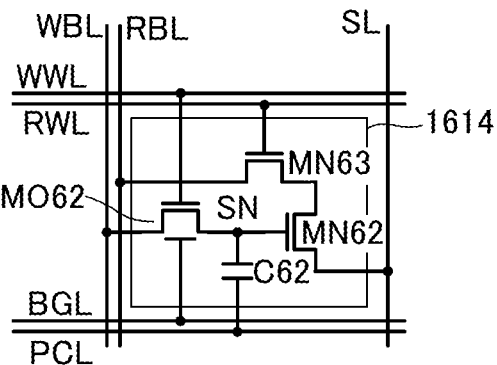

FIG. 11(C) to FIG. 11(E) illustrate other configuration examples of the memory cell. FIG. 11(C) to FIG. 11(E) illustrate examples where the write bit line WBL and the read bit line RBL are provided; however, as in FIG. 11(A), a bit line shared in writing and reading may be provided.

A memory cell 1612 illustrated in FIG. 11(C) is a variation example of the memory cell 1611 where the read transistor is changed into an n-channel transistor (MN61). The transistor MN61 may be an OS transistor or a Si transistor.

In the memory cell 1611 and the memory cell 1612, the OS transistor MO61 may be an OS transistor with no bottom gate.

A memory cell 1613 illustrated in FIG. 11(D) is a 3T gain cell and is electrically connected to the word line WWL, the word line RWL the bit line WBL, the bit line RBL, the source line SL, the wiring BGL, and a wiring PCL. The memory cell 1613 includes the node SN, an OS transistor MO62, a transistor MP62, a transistor MP63, and a capacitor C62. The OS transistor MO62 is a write transistor. The transistor MP62 is a read transistor, and the transistor MP63 is a selection transistor.

A memory cell 1614 illustrated in FIG. 11(E) is a variation example of the memory cell 1613 where the read transistor and the selection transistor are changed into n-channel transistors (a transistor MN62 and a transistor MN63). The transistor MN62 and the transistor MN63 may each be an OS transistor or a Si transistor.

The OS transistors provided in the memory cell 1611 to the memory cell 1614 may each be a transistor with no bottom gate or a transistor with a bottom gate.

What is called a NOR memory device in which the memory cells 1611 or the like are connected in parallel is described above, but the memory device of this embodiment is not limited thereto. For example, what is called a NAND memory device in which memory cells 1615 described below are connected in series may be provided.

Figure 12:
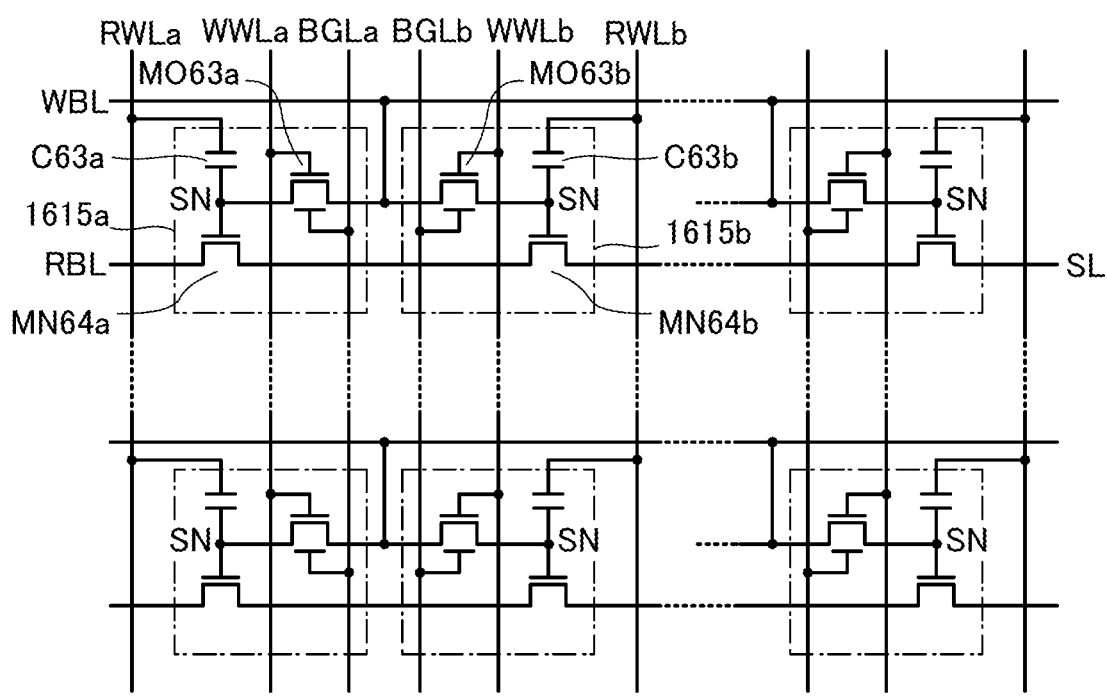
FIG. 12 A circuit diagram illustrating a structure example of a memory device of one embodiment of the present invention.

FIG. 12 is a circuit diagram illustrating a configuration example of the NAND memory cell array 1610. The memory cell array 1610 illustrated in FIG. 12 includes the source line SL, the bit line RBL, the bit line WBL, the word line WWL, the word line RWL, the wiring BGL, and the memory cell 1615. The memory cell 1615 includes the node SN, an OS transistor MO63, a transistor MN64, and a capacitor C63. Here, the transistor MN64 is an n-channel Si transistor, for example. The transistor MN64 is not limited thereto and may be a p-channel Si transistor or an OS transistor.

A memory cell 1615*a* and a memory cell 1615*b* illustrated in FIG. 12 are described below as examples. Here, the letter "a" or "b" is added to the reference numerals of the wirings and circuit elements connected to the memory cell 1615*a* or the memory cell 1615*b*.

In the memory cell 1615*a*, a gate of a transistor MN64*a*, one of a source and a drain of a transistor MO63*a*, and one electrode of a capacitor C63*a* are electrically connected to each other. The bit line WBL and the other of the source and the drain of the transistor MO63*a* are electrically connected to each other. A word line WWLa and a gate of the transistor MO63*a* are electrically connected to each other. A wiring BGLa and a bottom gate of the OS transistor MO63*a* are electrically connected to each other. A word line RWLa and the other electrode of the capacitor C63*a* are electrically connected to each other.

The memory cell 1615*b* can be provided to be symmetric to the memory cell 1615*a* with the use of a contact portion with the bit line WBL as a symmetry axis. Therefore, the circuit elements included in the memory cell 1615*b* are connected to the wirings as in the memory cell 1615*a*.

A source of the transistor MN64*a* of the memory cell 1615*a* is electrically connected to a drain of a transistor MN64*b* of the memory cell 1615*b*. A drain of the transistor MN64*a* of the memory cell 1615*a* is electrically connected to the bit line RBL. A source of the transistor MN64*b* of the memory cell 1615*b* is electrically connected to the source line SL through the transistors MN64 of the plurality of memory cells 1615. As described here, the plurality of transistors MN64 are connected in series between the bit line RBL and the source line SL in the NAND memory cell array 1610.

In a memory device including the memory cell array 1610 illustrated in FIG. 12, writing operation and reading operation are performed for every plurality of memory cells (hereinafter referred to as a memory cell column) connected to the same word line WWL (or word line RWL). For example, the writing operation can be performed as follows. A potential at which the OS transistor MO63 is turned on is supplied to the word line WWL connected to a memory cell column on which writing is performed, whereby the OS transistors MO63 in the memory cell column on which writing is performed are turned on. Accordingly, the potential of the bit line WBL is applied to the gates of the transistors MN64 and one electrode of the capacitors C63 in the specified memory cell column, whereby a predetermined charge is supplied to the gates. After that, when the OS transistors MO63 in the memory cell column are turned off, the predetermined charge supplied to the gates can be retained. Thus, data can be written to the memory cells 1615 in the specified memory cell column.

For example, the reading operation can be performed as follows. First, a potential at which the transistor MN64 is turned on regardless of a charge supplied to the gate of the transistor MN64 is supplied to the word lines RWL that are not connected to a memory cell column on which reading is to be performed; hence, the transistors MN64 in memory cell columns other than the memory cell column on which reading is to be performed are turned on. Then, a potential (reading potential) at which an on state or an off state of the transistor MN64 is selected in accordance with the charge of the gate of the transistor MN64 is supplied to the word line RWL connected to the memory cell column on which reading is performed. After that, a constant potential is supplied to the source line SL, and a reading circuit connected to the bit line RBL is brought into an operating state. Here, the plurality of transistors MN64 between the source line SL and the bit line RBL are on except the transistor MN64 in the memory cell column on which reading is performed; hence, the conductance between the source line SL and the bit line RBL depends on the state (an on state or an off state) of the transistor MN64 in the memory cell column on which reading is performed. Since the conductance of the transistor varies depending on the charge of the gate of the transistor MN64 in the memory cell column on which reading is performed, the potential of the bit line RBL varies accordingly. By reading the potential of the bit line RBL with the reading circuit, data can be read from the memory cell 1615 in the specified memory cell column.

There is theoretically no limitation on the number of rewrite cycles of the NOSRAM 1600 because data is rewritten by charging and discharging the capacitor C61, the capacitor C62, or the capacitor C63; and writing and reading of data can be performed with low energy. Furthermore, since data can be retained for a long time, the refresh rate can be reduced.

In the case where the semiconductor device described in the above embodiment is used for the memory cell 1611, the memory cell 1612, the memory cell 1613, the memory cell 1614, and the memory cell 1615, the transistor 200 can be used as the OS transistor MO61, the OS transistor MO62, and the OS transistor MO63; the capacitor 100 can be used as the capacitor C61, the capacitor C62, and the capacitor C63; and the transistor 300 can be used as the transistor MP61, the transistor MP62, the transistor MP63, the transistor MN61, the transistor MN62, the transistor MN63, and the transistor MN64. Thus, the area occupied by one set of the transistors and the capacitor in the top view can be reduced, so that the memory device of this embodiment can be further highly integrated. As a result, the storage capacity per unit area of the memory device of this embodiment can be increased.

The structure described in this embodiment can be used in appropriate combination with the structure described in the other embodiments.

Embodiment 3

In this embodiment, an AI system in which the semiconductor device of the above embodiment is used will be described with reference to FIG. 13.

Figure 13:
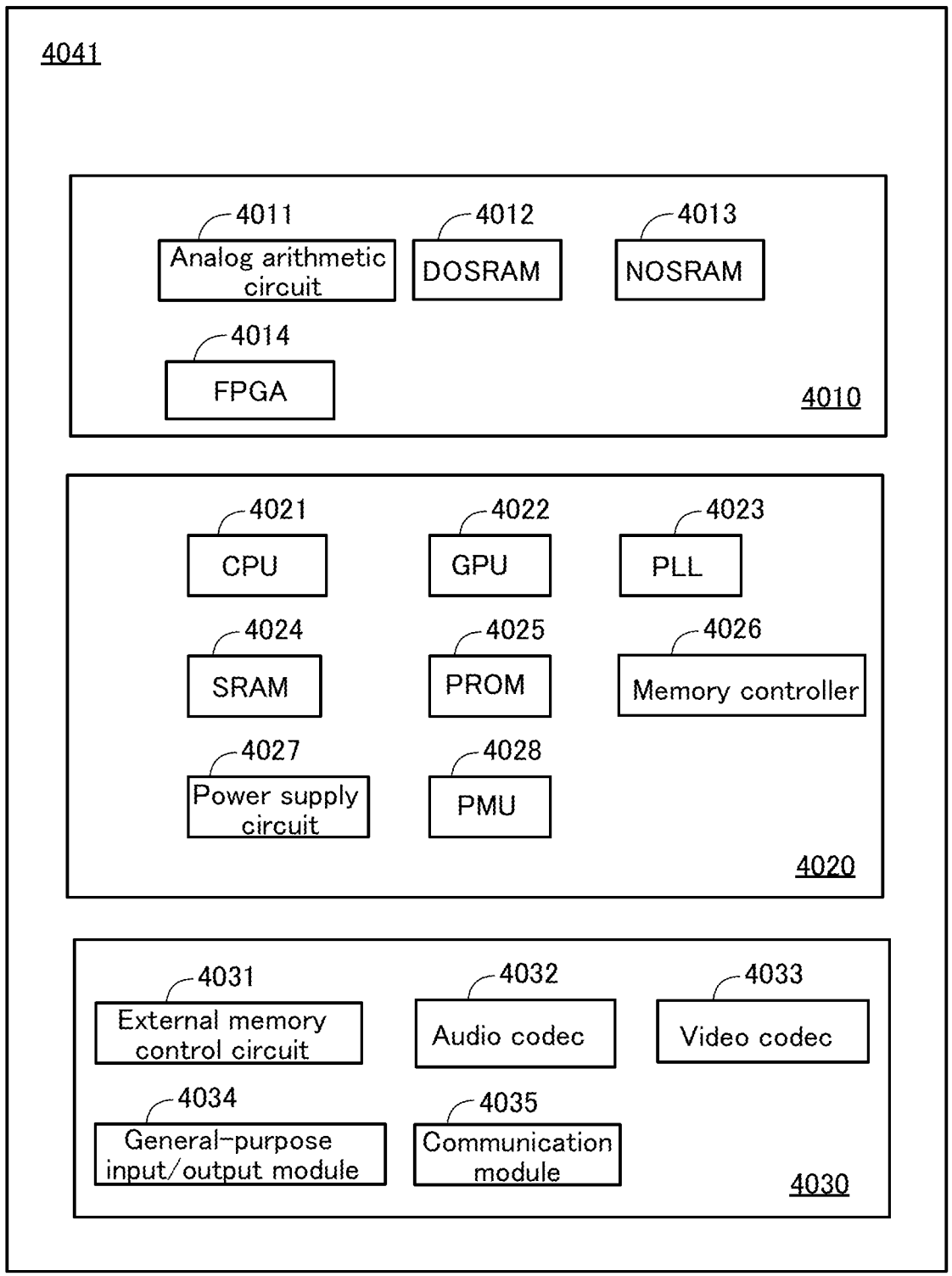
FIG. 13 A block diagram illustrating a structure example of an AI system of one embodiment of the present invention.

FIG. 13 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA (field programmable gate array) 4014. The NOSRAM 1600 described in the above embodiment can be used as the NOSRAM 4013. In the FPGA 4014, an OS memory is used for a configuration memory and a register. Here, such an FPGA is referred to as an OS-FPGA.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with a neural network, the number of input data exceeds 1000 in some cases. In the case where the input data are stored in an SRAM, the input data have to be stored piece by piece because of the circuit area limitation and small storage capacity of the SRAM. The DOSRAM 4012 has a larger storage capacity than an SRAM because the memory cells can be highly integrated even in a limited circuit area. Therefore, the DOSRAM 4012 can efficiently store the input data.

The NOSRAM 4013 is a nonvolatile memory using an OS transistor. The NOSRAM 4013 consumes less power in data writing than other nonvolatile memories such as a flash memory, a ReRAM (Resistive Random Access Memory), and an MRAM (Magnetoresistive Random Access Memory). Moreover, unlike a flash memory and a ReRAM, elements do not deteriorate when data is written, and there is no limitation on the number of times of data writing.

The NOSRAM 4013 can store multilevel data of 2 bits or more as well as 1-bit binary data. The multilevel data storage in the NOSRAM 4013 leads to a reduction in the memory cell area per bit.

The NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of 3 bits (8 levels) or more. The above-described multilevel data is included in the analog data in some cases.

Data and parameters used in neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with hardware. Establishing the connection of the neural network with hardware enables higher speed performance.

The FPGA 4014 is an FPGA including an OS transistor. An OS-FPGA can have a smaller memory area than an FPGA including an SRAM. Thus, addition of a context switching function only causes a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute neural network calculation at high speed with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not necessarily include all of the DOSRAM 4012, the NOSRAM 4013, and the FPGA 4014. One or more memories selected from the DOSRAM 4012, the NOSRAM 4013, and the FPGA 4014 are provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with a problem that is desired to be solved. The PROM 4025 can store a program for executing at least one of these methods. Furthermore, part or the whole of the program may be stored in the NOSRAM 4013.

Most of the existing programs that exist as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, learning and inference can be executed at high speed.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily stopping the power supply in the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 operates on the basis of the clock generated by the PLL 4023. The PLL 4023 preferably includes an OS memory. By including the OS memory, the PLL 4023 can retain an analog potential for controlling the clock oscillation cycle.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external memory device (such as an HDD (Hard Disk Drive) or an SSD (Solid State Drive)) in many cases. Therefore, the AI system 4041 preferably includes the external memory control circuit 4031 functioning as an interface with the external memory device.

Because learning and inference using a neural network often deals with audio and video, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus) or an I2C (Inter-Integrated Circuit), for example.

The AI system 4041 can perform learning or inference using data obtained via the Internet. For this reason, the AI system 4041 preferably includes the communication module 4035.

The analog arithmetic circuit 4011 may use a multilevel flash memory as an analog memory. However, the flash memory has a limitation on the number of rewrite cycles. In addition, it is extremely difficult to embed the multilevel flash memory (to form the arithmetic circuit and the memory on the same die).

Alternatively, the analog arithmetic circuit 4011 may use a ReRAM as an analog memory. However, the ReRAM has a limitation on the number of rewrite cycles and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structure described in this embodiment can be used in appropriate combination with the structure described in the other embodiments.

Embodiment 4

<Application Example of AI System>

In this embodiment, application examples of the AI system described in the above embodiment will be described with reference to FIG. 14.

Figure 14A:
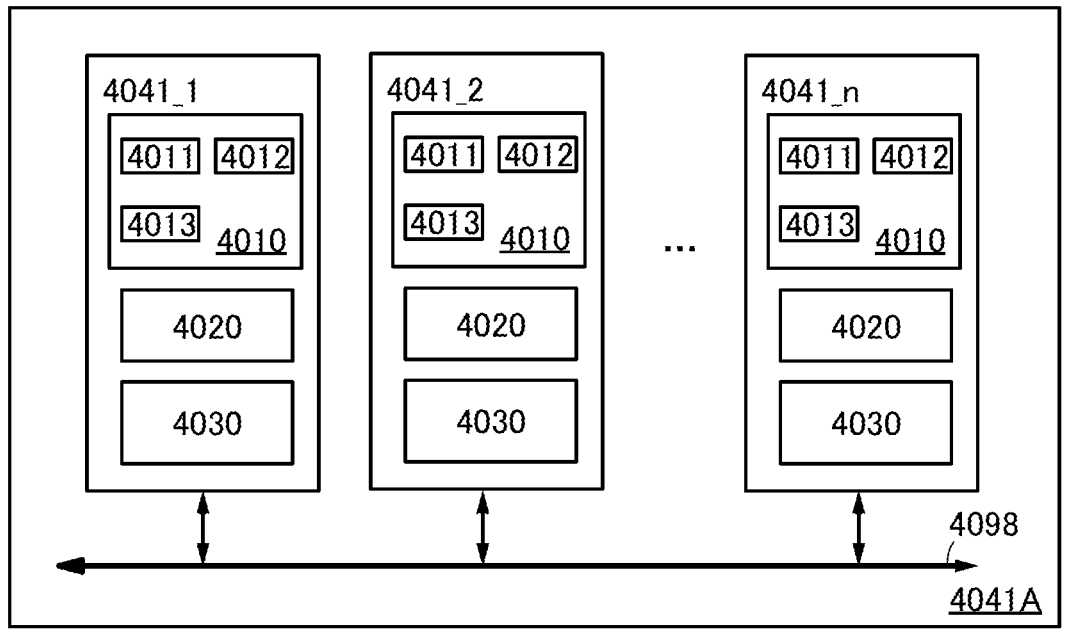
FIGS. 14A and 14B Block diagrams illustrating application examples of an AI system of one embodiment of the present invention.

FIG. 14(A) is an AI system 4041A in which the AI systems 4041 described with FIG. 13 are arranged in parallel and a signal can be transmitted between the systems via a bus line.

The AI system 4041A illustrated in FIG. 14(A) includes a plurality of AI systems 4041_1 to 4041_n (n is a natural number). The AI system 4041_1 to the AI system 4041_n are connected to each other via a bus line 4098.

Figure 14B:
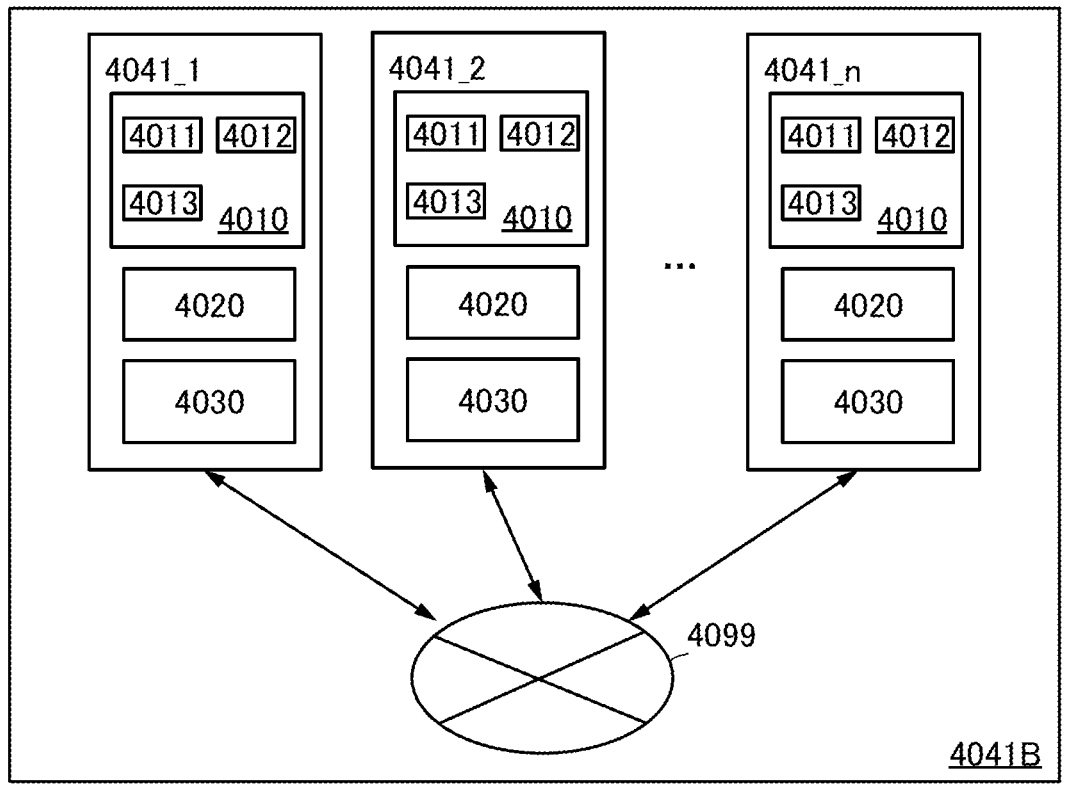

FIG. 14(B) is an AI system 4041B in which the AI systems 4041 described with FIG. 13 are arranged in parallel as in FIG. 14(A) and a signal can be transmitted between the systems via a network.

The AI system 4041B illustrated in FIG. 14(B) includes the plurality of AI systems 4041_1 to 4041_n. The AI system 4041_1 to the AI system 4041_n are connected to each other via a network 4099.

A communication module is provided in each of the AI system 4041_1 to the AI system 4041_n; such a configuration enables wireless or wired communication via the network 4099. The communication modules can perform communication via an antenna. For example, the communication can be performed in such a manner that each electronic device is connected to a computer network such as the Internet, which is the infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA2000 (Code Division Multiple Access 2000), or W-CDMA (registered trademark), or a communications standard developed by IEEE, such as Wi-Fi (registered trademark), Bluetooth (registered trademark), or ZigBee (registered trademark).

With the structure in FIG. 14(A) and FIG. 14(B), analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. When signal processing or learning is performed by different AI systems, the amount of information processed by each AI system can be reduced. Accordingly, signal processing or learning can be performed with a smaller amount of arithmetic processing. As a result, recognition accuracy can be increased. The information obtained with each AI system is expected to enable instant and collective understanding of a complex change in biological information.

The structure described in this embodiment can be used in appropriate combination with the structure described in the other embodiments.

Embodiment 5

In this embodiment, an example of an IC incorporating the AI system described in the above embodiment will be described.

In the AI system described in the above embodiment, a digital processing circuit formed of Si transistors, such as a CPU; an analog arithmetic circuit using OS transistors; an OS-FPGA; and an OS memory such as a DOSRAM or a NOSRAM can be integrated into one die.

Figure 15:
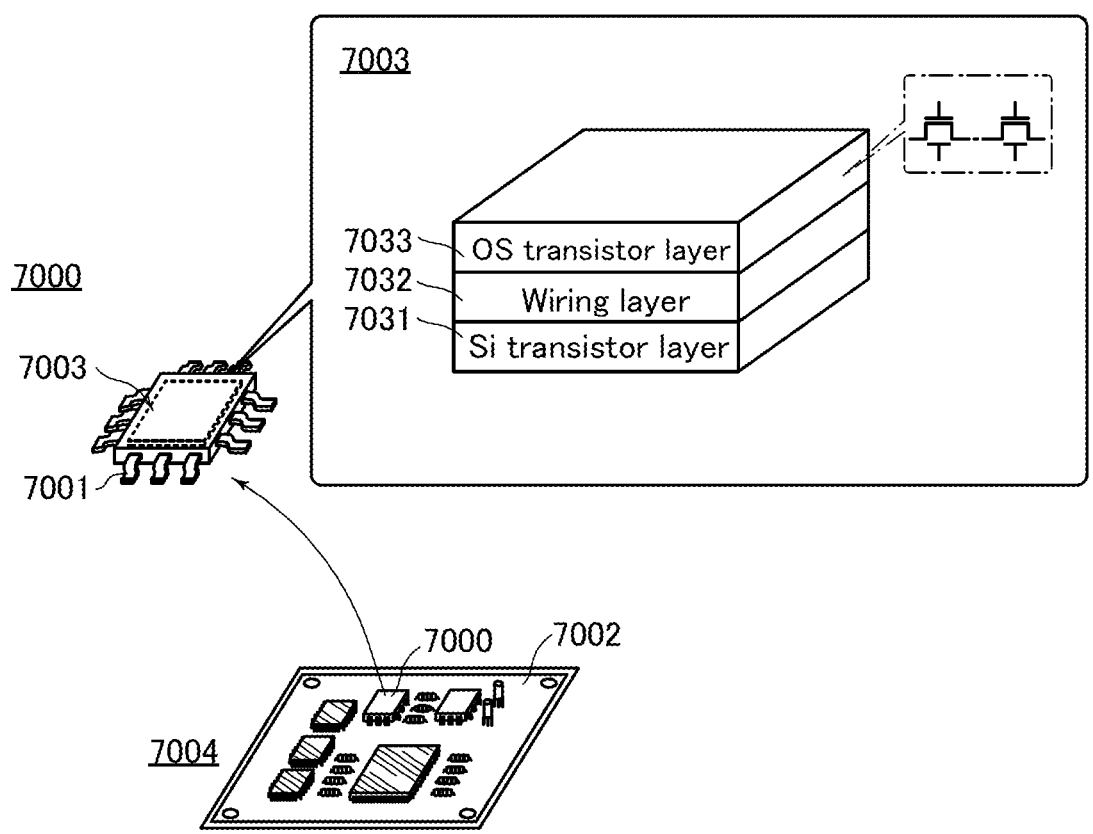
FIG. 15 A schematic perspective view illustrating a structure example of an IC incorporating an AI system of one embodiment of the present invention.

FIG. 15 illustrates an example of an IC in which the AI system is incorporated. An AI system IC 7000 illustrated in FIG. 15 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiment are provided on one die. The circuit portion 7003 has a stacked-layer structure as described in the above embodiment, and is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 15, the embodiment of the package is not limited thereto.

The digital processing circuit such as a CPU, the analog arithmetic circuit using OS transistors, the OS-FPGA, and the OS memory such as a DOSRAM or a NOSRAM can all be formed in the Si transistor layer 7031, the wiring layer 7032, and the OS transistor layer 7033. In other words, the elements included in the AI system can be formed through the same manufacturing process. Consequently, the number of steps in the manufacturing process of the IC described in this embodiment does not need to be increased even when the number of elements is increased, and accordingly the AI system can be incorporated into the IC at low cost.

The structure described in this embodiment can be used in appropriate combination with the structure described in the other embodiments.

Embodiment 6

<Electronic Device>

The semiconductor device of one embodiment of the present invention can be used for processors such as CPUs and GPUs or computers. FIG. 16 to FIG. 18 illustrate specific examples of electronic devices including a processor such as a CPU or a GPU or a computer of one embodiment of the present invention.

<Electronic Device and System>

The processor such as a CPU or a GPU or the computer of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the computer of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 16 illustrates examples of electronic devices.

[Mobile Phone]

Figure 16A:
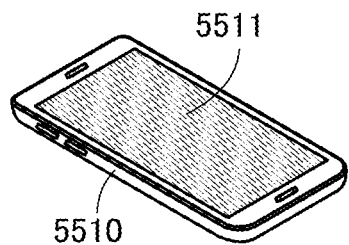

FIG. 16(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the computer of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal]

Figure 16B:
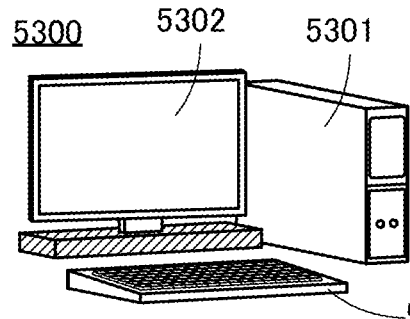

FIG. 16(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the computer of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, a smartphone and a desktop information terminal are shown as examples of the electronic devices in FIGS. 16(A) and 16(B); alternatively, the electronic device can be an information terminal other than a smartphone and a desktop information terminal. Examples of information terminals other than a smartphone and a desktop information terminal include a PDA (Personal Digital Assistant), a laptop information terminal, and a workstation.

[Household Appliance]

Figure 16C:
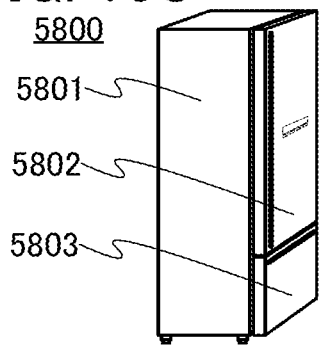

FIG. 16(C) illustrates an electric refrigerator-freezer 5800 as an example of a household appliance. The electric refrigerator-freezer 5800 includes a housing 5801, a refrigerator door 5802, a freezer door 5803, and the like.

When the computer of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 16D:
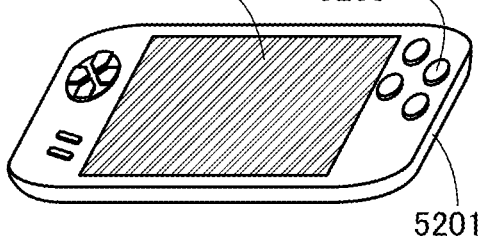
Figure 16D:
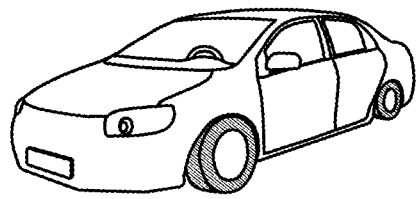
Figure 16D:
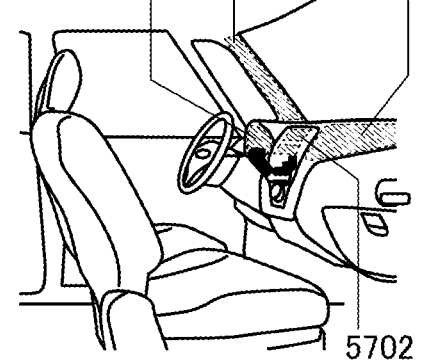

FIG. 16(D) illustrates a portable game machine 5200 as an example of a game machine. The portable game machine includes a housing 5201, a display portion 5202, a button 5203, and the like.

With the use of the GPU or the computer of one embodiment of the present invention in the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the computer of one embodiment of the present invention is used in the portable game machine 5200, the portable game machine 5200 including artificial intelligence can be obtained.

In general, the progress of a game, the actions and words of game characters, and expressions of a phenomenon and the like in the game are programed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 16(D), the game machine using the GPU or the computer of one embodiment of the present invention is not limited thereto. Examples of the game machine using the GPU or the computer of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the computer of one embodiment of the present invention can be used in an automobile, which is a moving vehicle, and around a driver's seat in the automobile.

FIG. 16(E1) illustrates an automobile 5700 as an example of a moving vehicle, and FIG. 16(E2) is a diagram illustrating the periphery of a windshield inside the automobile. FIG. 16(E2) illustrates a display panel 5701, a display panel 5702, and a display panel 5703 that are attached to a dashboard and a display panel 5704 that is attached to a pillar.

The display panel 5701 to the display panel 5703 can provide various kinds of information such as a speedometer, a tachometer, a mileage, a fuel meter, a gearshift indicator, and air-condition setting. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Since the GPU or the computer of one embodiment of the present invention can be used as a component of artificial intelligence, the computer can be used in an automatic driving system of the automobile 5700, for example. The computer can also be used for a system for navigation, risk prediction, or the like. The display panel 5701 to the display panel 5704 may display information regarding navigation information, risk prediction, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the computer of one embodiment of the present invention.

[Broadcasting System]

The GPU or the computer of one embodiment of the present invention can be used in a broadcasting system.

Figure 16F:
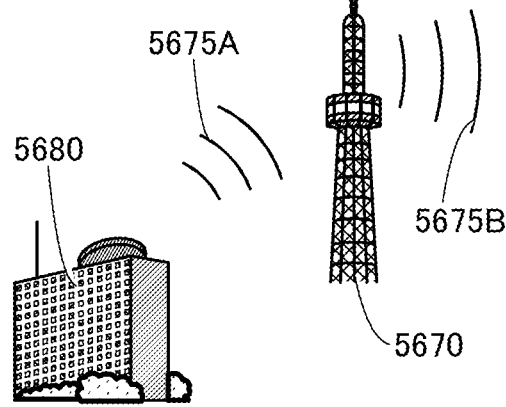
Figure 16F:
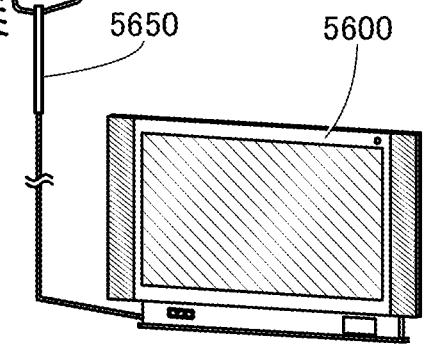

FIG. 16(F) schematically shows data transmission in a broadcasting system. Specifically, FIG. 16(F) shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 16(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 16(F) and may be satellite broadcasting using an artificial satellite, data broadcasting using an optical line, or the like.

The above-described broadcasting system may utilize artificial intelligence by using the computer of one embodiment of the present invention. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

<Parallel Computer>

Building a cluster using a plurality of computers of one embodiment of the present invention can constitute a parallel computer.

Figure 17A:
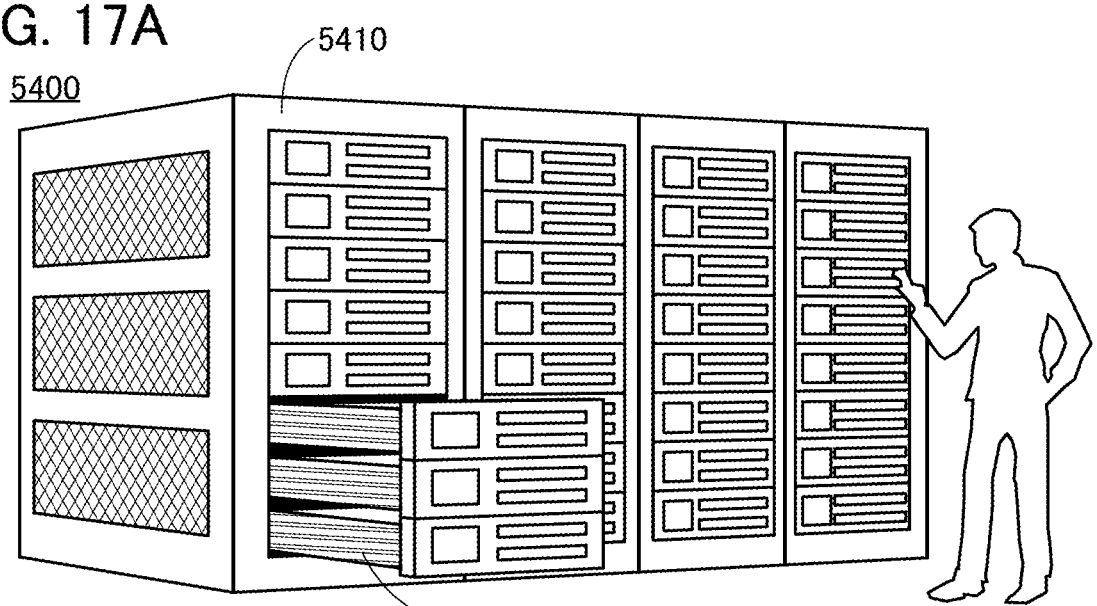
FIGS. 17A to 17C Diagrams illustrating configuration examples of a parallel computer, a computer, and a PC card of one embodiment of the present invention.

FIG. 17(A) illustrates a large parallel computer 5400. In the parallel computer 5400, a plurality of rack mount computers 5420 are stored in a rack 5410.

Figure 17B:
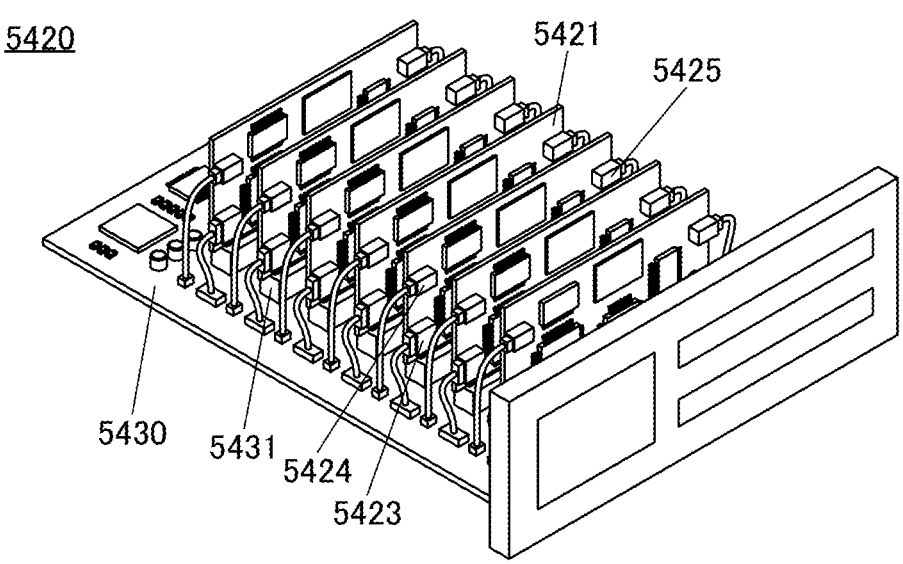

The computer 5420 can have a configuration in a perspective view of FIG. 17(B), for example. In FIG. 17(B), the computer 5420 includes a motherboard 5430, and the motherboard includes a plurality of slots 5431. APC card 5421 is inserted in the slot 5431. In addition, the PC card 5421 includes a connection terminal 5423, a connection terminal 5424, and a connection terminal 5425, each of which is connected to the motherboard 5430.

Figure 17C:
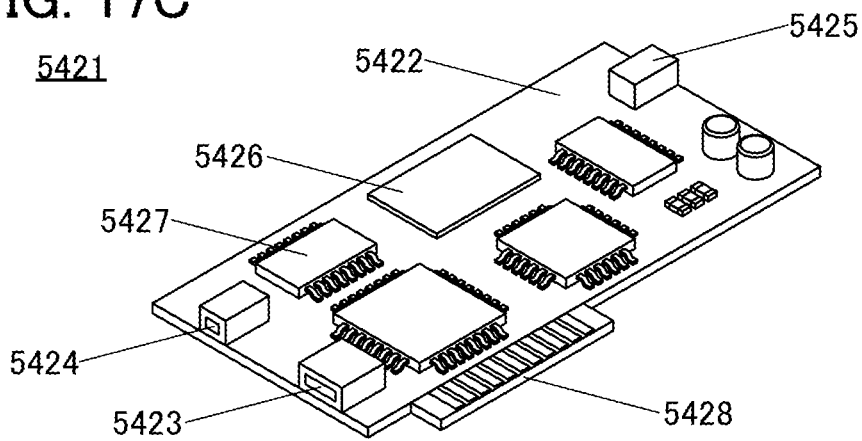

The PC card 5421 is a processing board provided with a CPU, a GPU, a memory device, and the like. For example, FIG. 17(C) illustrates a structure in which the PC card 5421 includes a board 5422, and the board 5422 includes the connection terminal 5423, the connection terminal 5424, the connection terminal 5425, a chip 5426, a chip 5427, and a connection terminal 5428. Note that although FIG. 17(C) illustrates chips other than the chip 5426 and the chip 5427, the following description of the chip 5426 and the chip 5427 is referred to for these chips.

The connection terminal 5428 has a shape with which the connection terminal 5428 can be inserted in the slot 5431 of the motherboard 5430, and the connection terminal 5428 functions as an interface for connecting the PC card 5421 and the motherboard 5430. An example of the standard for the connection terminal 5428 is PCIe.

The connection terminal 5423, the connection terminal 5424, and the connection terminal 5425 can serve, for example, as an interface for performing power supply, signal input, or the like to the PC card 5421. As another example, they can serve as an interface for outputting a signal calculated by the PC card 5421, for instance. Examples of the standard for each of the connection terminal 5423, the connection terminal 5424, and the connection terminal 5425 include USB (Universal Serial Bus), SATA (Serial ATA), and SCSI (Small Computer System Interface). In the case where video signals are output from the connection terminal 5423, the connection terminal 5424, and the connection terminal 5425, an example of the standard therefore is HDMI (registered trademark).

The chip 5426 includes a terminal (not illustrated) for inputting and outputting signals, and when the terminal is inserted in a socket (not illustrated) of the PC card 5421, the chip 5426 and the PC card 5421 can be electrically connected to each other. The chip 5426 can be the GPU described above, for example.

The chip 5427 includes a plurality of terminals, and when the terminals are reflow-soldered, for example, to wirings of the PC card 5421, the chip 5427 and the PC card 5421 can be electrically connected to each other. Examples of the chip 5427 include a memory device, an FPGA, and a CPU.

The use of the computer of one embodiment of the present invention in the computers 5420 of the parallel computer 5400 illustrated in FIG. 17(A) enables large-scale computation necessary for artificial intelligence learning and inference, for example.

<Server and System Including Server>

The computer of one embodiment of the present invention can be used in a server that functions on a network, for example. Accordingly, a system including the server can be constructed.

Figure 18A:
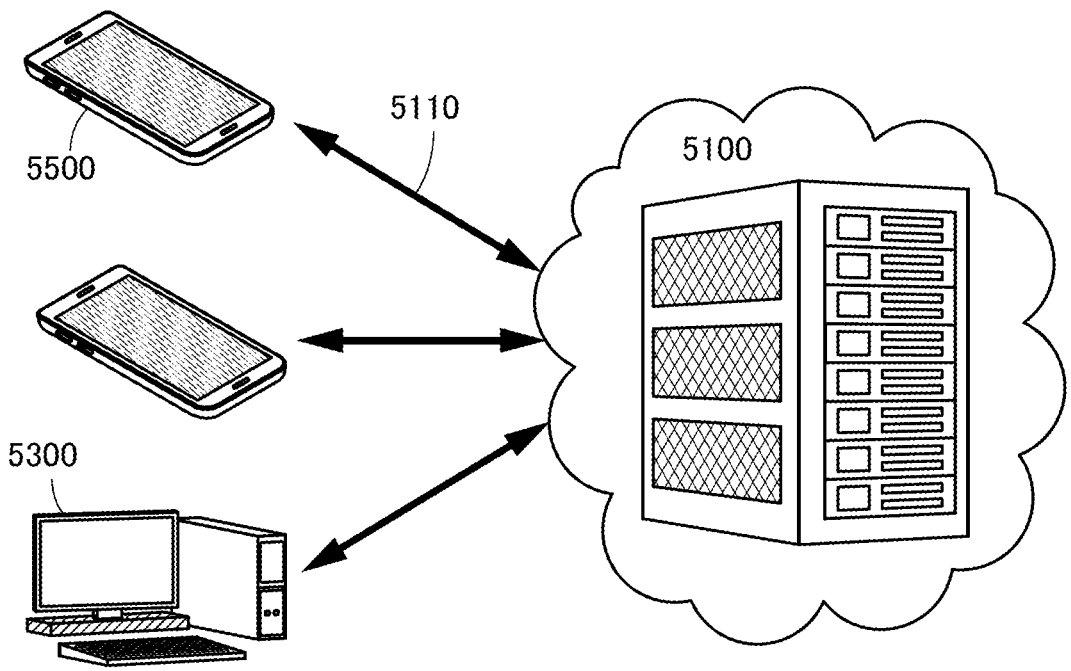
FIGS. 18A and 18B Diagrams illustrating configuration examples of a system of one embodiment of the present invention.

As an example, FIG. 18(A) schematically illustrates the manner of communication between a server 5100 using the computer of one embodiment of the present invention and the above-described information terminal 5500 and desktop information terminal 5300. Note that in FIG. 18(A), communication 5110 is shown as the manner of communication.

By constituting such an embodiment, a user can access the server 5100 from the information terminal 5500, the desktop information terminal 5300, and the like. Then, through the communication 5110 via the Internet, the user can receive a service that the administrator of the server 5100 offers. Examples of the service include e-mailing; SNS (Social Networking Service); online software; cloud storage; a navigation system; a translation system; an Internet game; online shopping; financial trading in stocks, exchange, debts, and the like; reservation for public facilities, commercial facilities, accommodation facilities, hospitals, and the like; and viewing of videos such as Internet shows, talks, and lectures.

In particular, by using the computer of one embodiment of the present invention in the server 5100, artificial intelligence can sometimes be utilized in the above service. For example, adopting artificial intelligence in a navigation system may enable the system to provide flexible guidance to a destination in consideration of a traffic congestion situation, a train running status, or the like. As another example, adopting artificial intelligence in a translation system may enable the system to translate unique expressions such as dialects and slangs appropriately. As another example, using artificial intelligence in a reservation system for hospitals and the like may enable the system to introduce an appropriate hospital, clinic, or the like by judging from a user's symptom, degree of an injury, or the like.

When the user intends to develop artificial intelligence, the user can access the server 5100 via the Internet and perform the development on the server 5100. This is preferable when the processing capacity is insufficient with the information terminal 5500, the desktop information terminal 5300, or the like in the user's possession or when a development environment cannot be constructed with the information terminal 5500, the desktop information terminal 5300, or the like, for example.

Although FIG. 18(A) illustrates an example of the system configured with the information terminals and the server 5100 as a system including a server, another example may be a system configured with an electronic device other than the information terminal and the server 5100. That is, an embodiment may be IoT (Internet of Things), in which electronic devices are connected to the Internet.

Figure 18B:
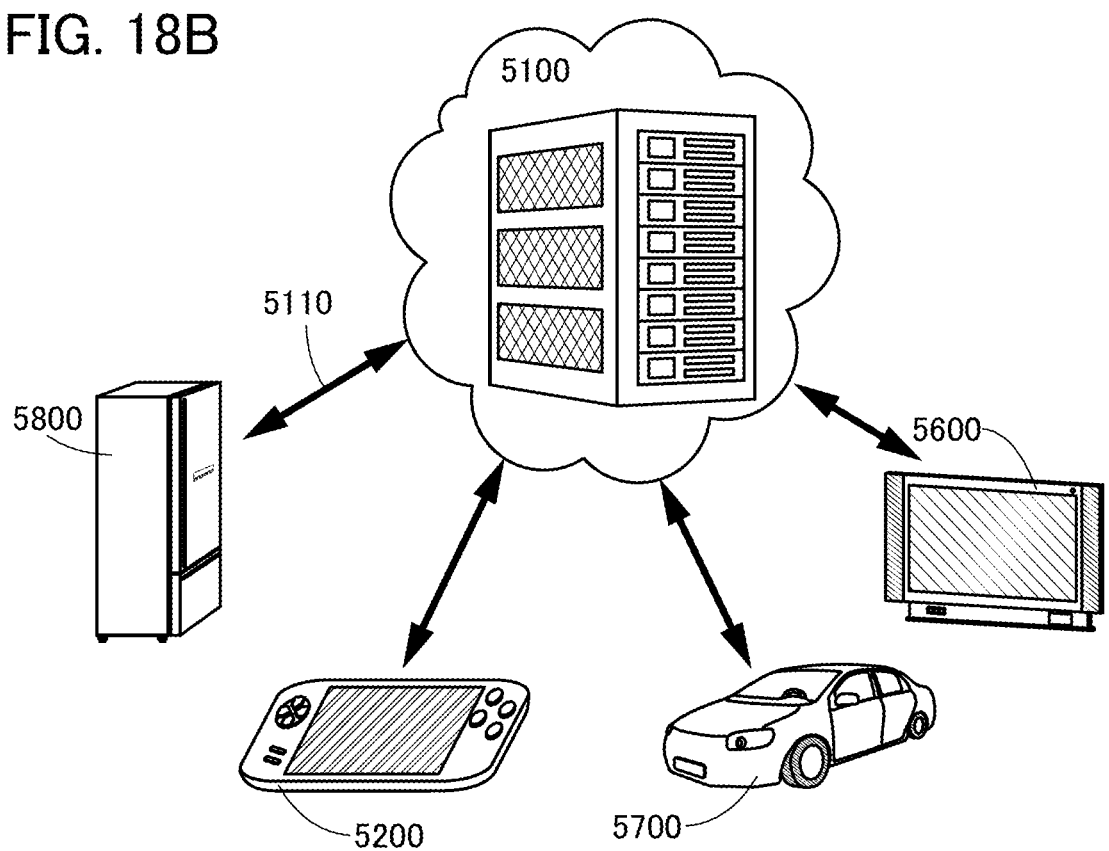

As an example, FIG. 18(B) schematically illustrates the manner of communication between the electronic devices described with FIG. 16 (the electric refrigerator 5800, the portable game machine 5200, the automobile 5700, and the TV 5600) and the server 5100. Note that in FIG. 18(B), the communication 5110 is shown as the manner of communication.

In the case where artificial intelligence is used in each of the electronic devices described with FIG. 16, arithmetic processing necessary for operating the artificial intelligence can be executed on the server 5100 as illustrated in FIG. 18(B). For example, input data necessary for arithmetic processing is transmitted from one of the electronic devices to the server 5100 via the communication 5110, whereby output data is calculated on the basis of the input data by the artificial intelligence included in the server 5100, and the output data is transmitted from the server 5100 to the one electronic device via the communication 5110. Thus, the one electronic device can perform operation based on the data output from the artificial intelligence.

The electronic devices illustrated in FIG. 18(B) are examples; a structure may be employed in which an electronic device that is not illustrated in FIG. 18(B) is connected to the server 5100 and mutual communication is performed in a manner similar to the above.

The electronic devices, the functions of the electronic devices, application examples of artificial intelligence, its effects, and the like described in this embodiment can be combined as appropriate with the description of another electronic device.

Embodiment 7

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 19 schematically illustrates some structure examples of removable memory devices. The semiconductor device described in the above embodiment is processed into a packaged memory chip and used in a variety of storage devices and removable memories, for example.

Figure 19A:
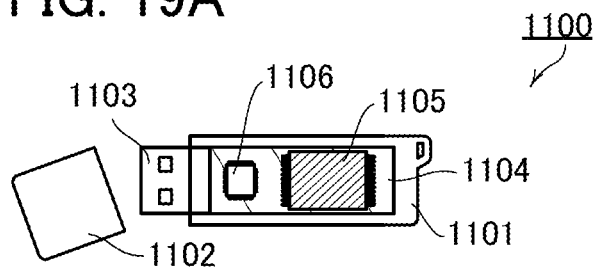
FIGS. 19A to 19E Diagrams illustrating electronic devices of one embodiment of the present invention.

FIG. 19(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

Figure 19B:
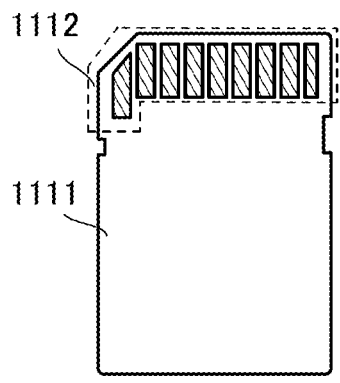
Figure 19C:
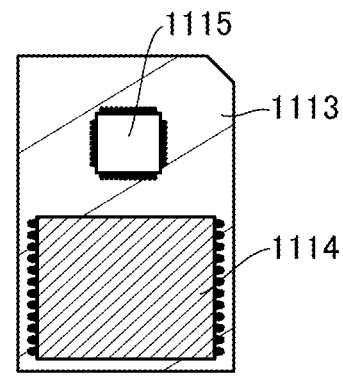

FIG. 19(B) is an external schematic diagram of an SD card, and FIG. 19(C) is a schematic diagram illustrating the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on a back side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110. The semiconductor device described in the above embodiment can be incorporated in the memory chip 1114 or the like on the substrate 1113.

Figure 19D:
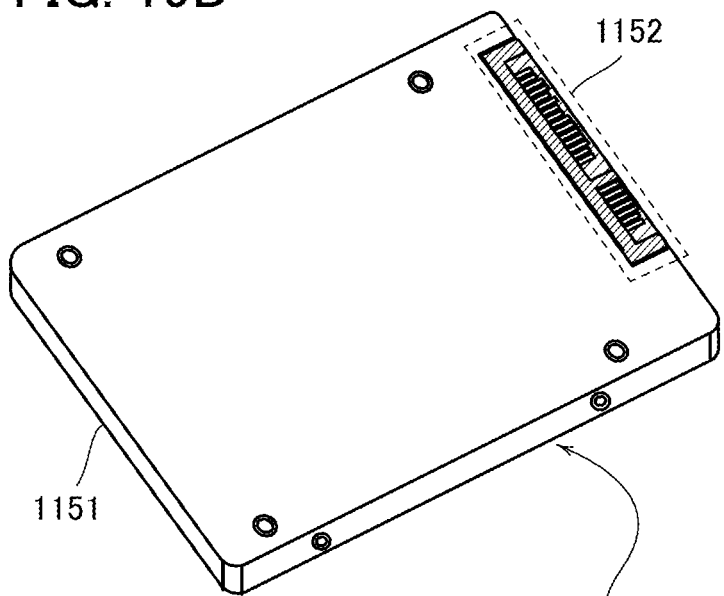
Figure 19E:
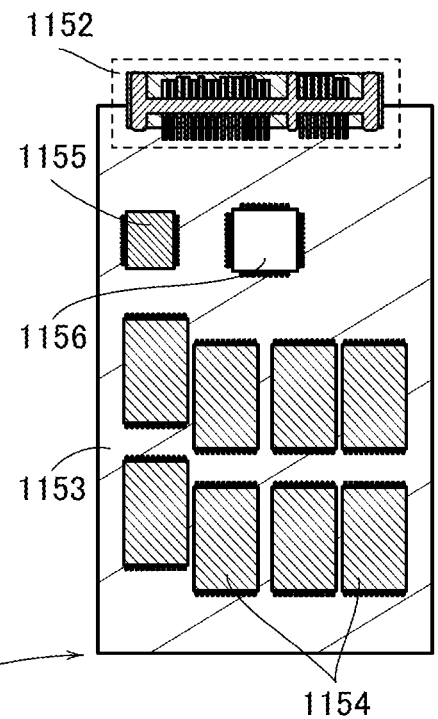

FIG. 19(D) is an external schematic diagram of an SSD, and FIG. 19(E) is a schematic diagram illustrating the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DRAM chip may be used, for example. When the memory chip 1154 is also provided on a back side of the substrate 1153, the capacity of the SSD 1150 can be increased. The semiconductor device described in the above embodiment can be incorporated in the memory chip 1154 or the like on the substrate 1153.

The structure described in this embodiment can be used in appropriate combination with the structure described in the other embodiments.

REFERENCE NUMERALS

100: capacitor, 100a: capacitor, 100A: capacitor, 100b: capacitor, 100B: capacitor, 110: conductor, 120: conductor, 130: insulator, 150: insulator, 160: conductor, 200: transistor, 200a: transistor, 200A: transistor, 200b: transistor, 200B: transistor, 205: conductor, 205A: conductor, 205B: conductor, 207: insulator, 207a: insulator, 207b: insulator, 208: conductor, 208a: conductor, 208A: conductor, 208b: conductor, 208B: conductor, 209: conductor, 211: conductor, 211a: conductor, 211b: conductor, 214: insulator, 216: insulator, 220: insulator, 222: insulator, 224: insulator, 226: insulator, 230: oxide, 230a: oxide, 230b: oxide, 230c: oxide, 239: region, 240: conductor, 242: conductor, 242a: conductor, 242b: conductor, 242c: conductor, 243: region, 243a: region, 243b: region, 243c: region, 244: insulator, 250: insulator, 260: conductor, 260a: conductor, 260A: conductor, 260b: conductor, 260B: conductor, 270: insulator, 271: insulator, 272: insulator, 273: insulator, 274: insulator, 275: insulator, 280: insulator, 281: insulator, 282: insulator, 300: transistor, 300a: transistor, 300A: transistor, 300b: transistor, 300B: transistor, 301: semiconductor layer, 311: substrate, 313: semiconductor region, 314a: low-resistance region, 314b: low-resistance region, 315: insulator, 316: conductor, 316A: conductor, 316B: conductor, 317: insulator, 320: insulator, 321: insulator, 322: insulator, 600: cell, 600A: memory cell, 600B: memory cell, 1005: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1400: DOSRAM, 1600: NOSRAM, 1610: memory cell array, 1611: memory cell, 1612: memory cell, 1613: memory cell, 1614: memory cell, 1615: memory cell, 1615a: memory cell, 1615b: memory cell, 1640: controller, 1650: row driver, 1651: row decoder, 1652: word line driver, 1660: column driver, 1661: column decoder, 1662: driver, 1663: DAC, 1670: output driver, 1671: selector, 1672: ADC, 1673: output buffer, 2000: CDMA, 4010: arithmetic portion, 4011: analog arithmetic circuit, 4012: DOSRAM, 4013: NOSRAM, 4014: FPGA, 4020: control portion, 4021: CPU, 4022: GPU, 4023: PLL, 4024: SRAM, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041A: AI system, 4041B: AI system, 4098: bus line, 4099: network, 5100: server, 5110: communication, 5200: portable game machine, 5201: housing, 5202: display portion, 5203: button, 5300: desktop information terminal, 5301: main body, 5302: display, 5303: keyboard, 5400: parallel computer, 5410: rack, 5420: computer, 5421: PC card, 5422: board, 5423: connection terminal, 5424: connection terminal, 5425: connection terminal, 5426: chip, 5427: chip, 5428: connection terminal, 5430: motherboard, 5431: slot, 5432: connection terminal, 5433: connection terminal, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5701: display panel, 5702: display panel, 5703: display panel, 5704: display panel, 5800: electric refrigerator-freezer, 5801: housing, 5802: refrigerator door, 5803: freezer door, 7000: AI system IC, 7001: lead, 7002: printed circuit board, 7003: circuit portion, 7004: circuit board, 7031: Si transistor layer, 7032: wiring layer, 7033: OS transistor layer

The invention claimed is:

1. A semiconductor device comprising:
   a first transistor;
   a second transistor;
   a capacitor;
   a first conductor;
   a second conductor; and
   a third conductor,
   wherein the first transistor comprises a first gate, a source, and a drain,
   wherein the second transistor comprises a second gate, a third gate over the second gate, and an oxide semiconductor between the second gate and the third gate, the oxide semiconductor comprising a first region and a second region,
   wherein the capacitor comprises a first electrode, a second electrode over the first electrode, and an insulator between the first electrode and the second electrode,
   wherein the first region overlaps with the first gate,
   wherein the first conductor is electrically connected to the first gate,
   wherein the first conductor is in contact with a bottom surface of the first region,
   wherein the capacitor overlaps with the first region,
   wherein the first electrode is electrically connected to the first region,
   wherein the second conductor is electrically connected to the drain,
   wherein the third conductor overlaps with the second conductor, and
   wherein the third conductor is in contact with the second conductor and a side surface of the second region.

2. The semiconductor device according to claim 1, wherein in a channel length direction of the first transistor, a distance between the second gate and the first gate is half a width of the first gate.

3. The semiconductor device according to claim 2, wherein in the channel length direction of the first transistor, a distance between the second gate and the second conductor is half the width of the first gate.

4. The semiconductor device according to claim 1, further comprising a first insulator and a second insulator,
wherein the first insulator covers the first transistor,
wherein the second insulator is in contact with a side surface of the second gate, and
wherein the second insulator has a different composition from the first insulator.

5. The semiconductor device according to claim 1, further comprising a third insulator and a fourth insulator,
wherein the third insulator covers the second transistor,
wherein the fourth insulator is in contact with a side surface of the third gate, and
wherein the fourth insulator has a different composition from the third insulator.

6. The semiconductor device according to claim 1, further comprising a source or drain electrode in contact with the first region.

7. The semiconductor device according to claim 6, wherein the first electrode is in contact with the source or drain electrode.

8. A semiconductor device comprising:
a first transistor;
a second transistor over the first transistor;
a third transistor;
a fourth transistor over the third transistor;
a first capacitor;
a second capacitor;
a first conductor;
a second conductor;
a third conductor; and
a fourth conductor,
wherein the first transistor comprises a first gate, a first source, and a first drain,
wherein the second transistor comprises a second gate, a third gate over the second gate, and an oxide semiconductor between the second gate and the third gate, the oxide semiconductor comprising a first region and a second region,
wherein the third transistor comprises a fourth gate, a second source, and a second drain,
wherein the fourth transistor comprises a fifth gate, a sixth gate over the fifth gate, and the oxide semiconductor between the fifth gate and the sixth gate, the oxide semiconductor comprising the second region and a third region,
wherein the first capacitor comprises a first electrode, a second electrode over the first electrode, and a first insulator between the first electrode and the second electrode,
wherein the second capacitor comprises a third electrode, a fourth electrode over the third electrode, and a second insulator between the third electrode and the fourth electrode,
wherein the first region overlaps with the first gate,
wherein the first conductor is electrically connected to the first gate,
wherein the first conductor is in contact with a bottom surface of the first region,
wherein the first capacitor overlaps with the first region,
wherein the first electrode is electrically connected to the first region,
wherein the third region overlaps with the fourth gate,
wherein the fourth conductor is electrically connected to the fourth gate,
wherein the fourth conductor is in contact with a bottom surface of the third region,
wherein the second capacitor overlaps with the third region,
wherein the third electrode is electrically connected to the third region,
wherein the second conductor is electrically connected to the first drain and the second drain,
wherein the third conductor overlaps with the second conductor, and
wherein the third conductor is in contact with the second conductor and a side surface of the second region.

9. The semiconductor device according to claim 8, wherein the first drain and the second drain are provided in a fourth region.

10. The semiconductor device according to claim 8, wherein in a channel length direction of the first transistor, a distance between the second gate and the first gate is half a width of the first gate.

11. The semiconductor device according to claim 10, wherein in the channel length direction of the first transistor, a distance between the second gate and the second conductor is half the width of the first gate.

12. The semiconductor device according to claim 8, further comprising a third insulator and a fourth insulator,
wherein the third insulator covers the first transistor,
wherein the fourth insulator is in contact with a side surface of the second gate, and
wherein the fourth insulator has a different composition from the third insulator.

13. The semiconductor device according to claim 8, further comprising a fifth insulator and a sixth insulator,
wherein the fifth insulator covers the second transistor,
wherein the sixth insulator is in contact with a side surface of the third gate, and
wherein the sixth insulator has a different composition from the fifth insulator.

14. The semiconductor device according to claim 8, further comprising a first source or drain electrode in contact with the first region.

15. The semiconductor device according to claim 14, further comprising a second source or drain electrode in contact with the third region.

16. The semiconductor device according to claim 15, wherein the third electrode is in contact with the second source or drain electrode.

* * * * *